(12) United States Patent  (10) Patent No.: US 7,692,610 B2
Kimura  (45) Date of Patent: Apr. 6, 2010

(54) DISPLAY DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 739 days.

(21) Appl. No.: 11/563,894

(22) Filed: Nov. 28, 2006

(65) Prior Publication Data
US 2007/0120785 A1 May 31, 2007

(30) Foreign Application Priority Data
Nov. 30, 2005 (JP) ............... 2005-345341

(51) Int. Cl.
G09G 3/30 (2006.01)
G09G 3/10 (2006.01)
(52) U.S. Cl. ..................... 345/76; 315/169.3
(58) Field of Classification Search ........... 345/76–84
See application file for complete search history.

(56) References Cited

U.S. PATENT DOCUMENTS

| | | | |
|---|---|---|---|
| 6,229,506 B1 | 5/2001 | Dawson et al. | |
| 6,677,713 B1 * | 1/2004 | Sung | 315/169.1 |
| 7,274,345 B2 * | 9/2007 | Imamura et al. | 345/76 |
| 2002/0053884 A1 | 5/2002 | Kimura | |
| 2002/0113760 A1 | 8/2002 | Kimura | |
| 2003/0058687 A1 | 3/2003 | Kimura | |
| 2003/0090481 A1 | 5/2003 | Kimura | |
| 2003/0117352 A1 | 6/2003 | Kimura | |
| 2003/0132931 A1 | 7/2003 | Kimura et al. | |
| 2003/0137503 A1 | 7/2003 | Kimura | |
| 2004/0080474 A1 | 4/2004 | Kimura | |
| 2004/0256620 A1 | 12/2004 | Yamazaki et al. | |
| 2005/0285625 A1 | 12/2005 | Kimura | |

OTHER PUBLICATIONS

N. Komiya et al.; "Comparison of Vth compensation ability among voltage programming circuits for AMOLED panels"; *IDW '03*; pp. 275-278; 2003.
Kyung-Jin Yoo et al.; "38.2: 302-ppi High-Resolution AMOLED using Laser-Induced Thermal Imaging"; *SID '05 Digest*; pp. 1344-1347; 2005.
J.H. Jung et al.; "49.1: A 14.1 inch Full Color AMOLED Display with Top Emission Structure and a-Si TFT Backplane"; *SID '05 Digest*; pp. 1538-1541; 2005.

* cited by examiner

*Primary Examiner*—Duc Q Dinh
(74) *Attorney, Agent, or Firm*—Fish & Richardson P.C.

(57) ABSTRACT

To provide a high-performance and highly reliable display device with a high aperture ratio, including light-emitting elements, and a manufacturing method thereof, and a technique for manufacturing such a display device at a low cost with high productivity. A compensating circuit, a light-emitting element, a switch, and a transistor are included, in which one terminal of the switch is electrically connected to the compensating circuit, a gate of the transistor is electrically connected to the compensating circuit, one of a source and a drain of the transistor is electrically connected to a first electrode of the light-emitting element, the other of the source and the drain of the transistor is maintained at a certain potential, and a second electrode of the light-emitting element and the other terminal of the switch are electrically connected to the same wire.

15 Claims, 32 Drawing Sheets

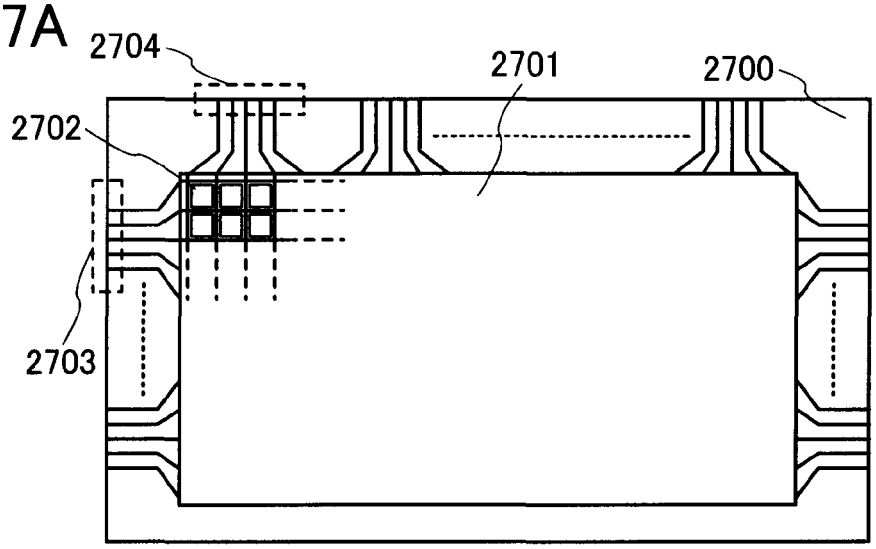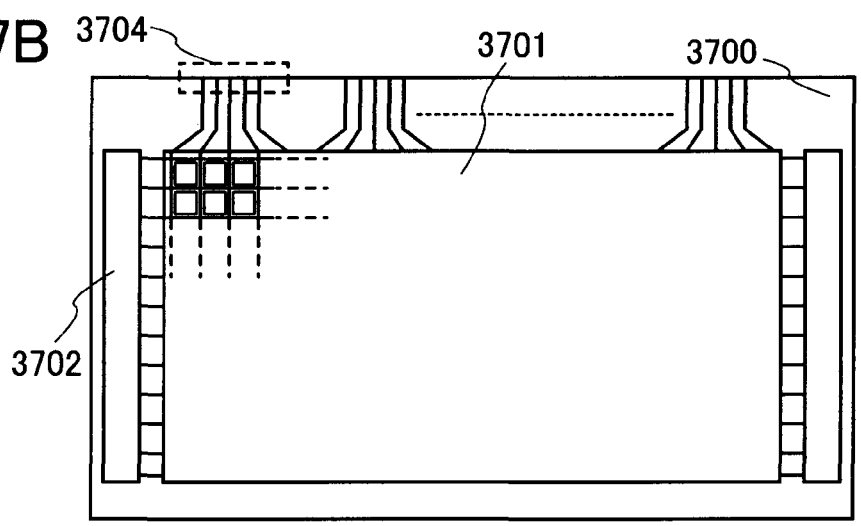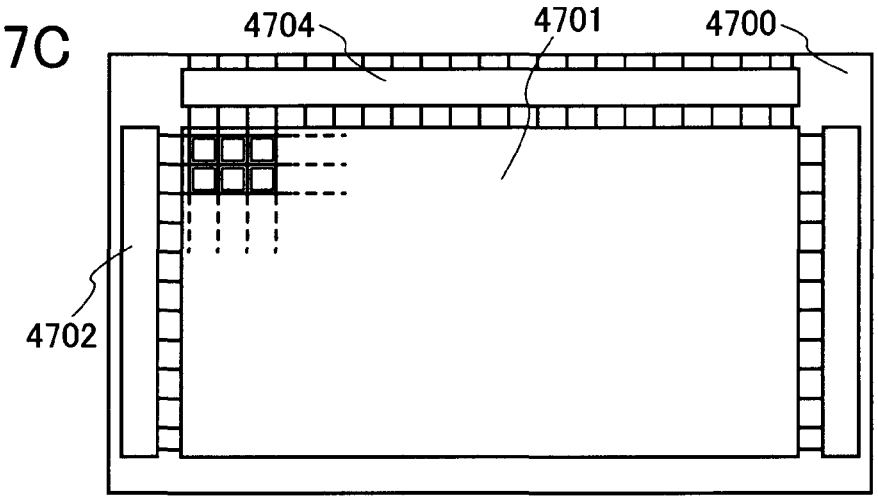

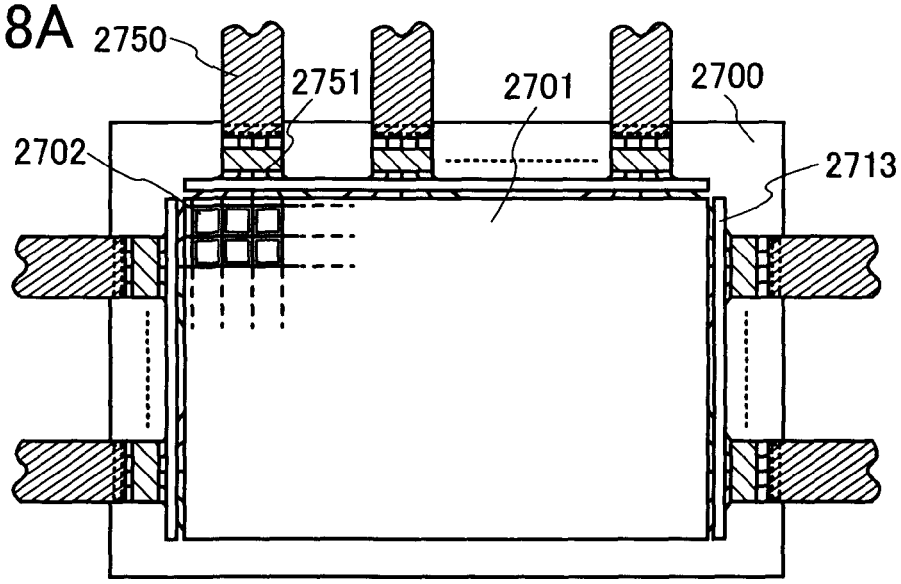
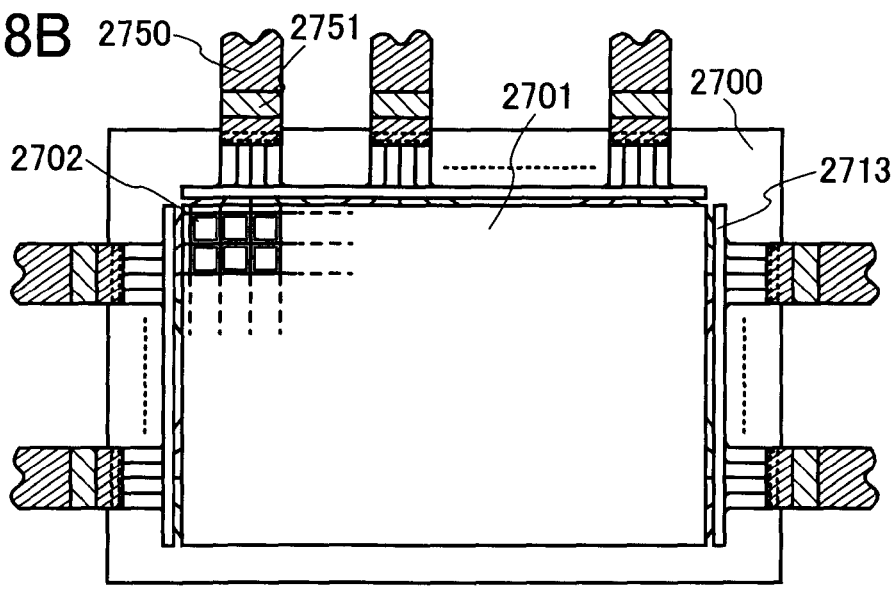

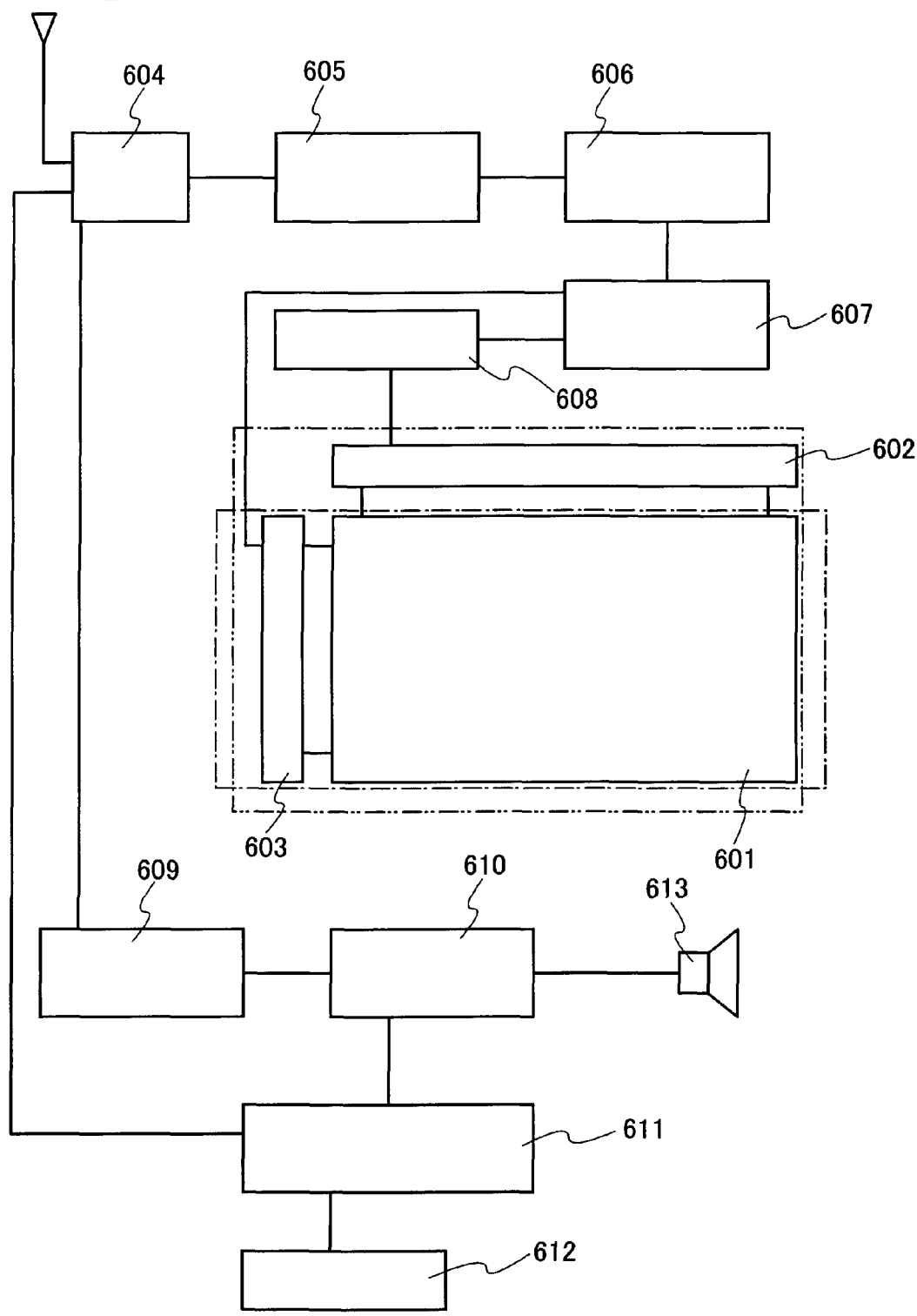

Labels: 543a, 542a, 541a, 543b, 541b, 541c, 542b, 543c, 545c, 546c, 544a, 545a, 546a, 544b, 545b Labels: 552, 551a, 551b, 551c, 553a, 554a, 554b, 554c, 553b

DISPLAY DEVICE

BACKGROUND OF THE PRESENT INVENTION

1. Field of the Present Invention

The present invention relates to a display device using a light-emitting element.

2. Description of the Related Art

In recent years, development of an electroluminescence (Electro Luminescence) display device in which thin film transistors (hereafter also referred to as "TFTs") are integrated over a substrate has progressed. In such a display device, thin film transistors are manufactured over a substrate by using thin-film formation technology and a light-emitting element (electroluminescence (hereinafter also referred to as "EL") element) is formed as a display element over various circuits including the thin film transistors.

In pixels of a display device using light-emitting elements, respective amounts of current flowing into the light-emitting elements vary depending on variations of electrical characteristics such as each threshold voltage of TFTs for forming the pixels, so that there is a problem of variation in luminance of the light-emitting elements. A structure in which such variation in threshold voltage of TFTs is compensated using a capacitor has been disclosed (e.g., see Patent Document 1: U.S. Pat. No. 6,229,506).

SUMMARY OF THE PRESENT INVENTION

In the above-described pixel configuration, however, the aperture ratio of each pixel may be reduced since it is necessary to form a plurality of wires within each pixel. Further, the wires are densely-disposed, thereby the wire structure becomes complex and dense. Therefore, when the process becomes difficult and complex, the number of defects might be increased, and a yield is decreased.

In view of the foregoing, it is an object of the present invention to provide a high-performance and highly reliable display device with a high aperture ratio, including light-emitting elements, and a manufacturing method thereof. In addition, it is another object of the present invention to provide a technique for manufacturing a display device at a low cost with high productivity.

The present invention can be used for a display device having a display function. The display device using the present invention includes, e.g., a display device in which a light-emitting element where a layer containing either an organic substance which exhibits light emission called electroluminescence (hereinafter also referred to as "EL") or a combination of organic and inorganic substances is interposed between electrodes is connected to a TFT.

Note that a "semiconductor device" in this specification means a device capable of functioning by utilizing semiconductor characteristics. Therefore, a display device including a transistor or the like can also be assumed as a semiconductor device.

In one feature of the display device of the present invention, a compensating circuit, a light-emitting element, a switch, and a transistor are included, in which one terminal of the switch is electrically connected to the compensating circuit, a gate of the transistor is electrically connected to the compensating circuit, one of a source and a drain of the transistor is electrically connected to a first electrode of the light-emitting element, the other of the source and the drain of the transistor is maintained at a fixed potential, and a second electrode of the light-emitting element and the other terminal of the switch are electrically connected to the same wire.

In one feature of the display device of the present invention, a compensating circuit, a light-emitting element, a first switch, a second switch, a transistor, and a controlling circuit are included, in which one terminal of the controlling circuit is maintained at a fixed potential, one terminal of the first switch is electrically connected to the compensating circuit, one terminal of the second switch is electrically connected to the compensating circuit, the other terminal of the second switch is electrically connected to a first wire, a gate of the transistor is electrically connected to the compensating circuit, one of a source and a drain of the transistor is electrically connected to a first electrode of the light-emitting element, the other of the source and the drain of the transistor is electrically connected to the other terminal of the controlling circuit, and a second electrode of the light-emitting element and the other terminal of the first switch are electrically connected to the same second wire.

In one feature of the display device of the present invention, a light-emitting element, a first switch, a second switch, a transistor, a first capacitor, and a second capacitor are included, in which one terminal of the first switch is electrically connected to a first electrode of the second capacitor, a second electrode of the second capacitor is electrically connected to one terminal of the second switch and one electrode of the first capacitor, a second electrode of the first capacitor is maintained at a fixed potential, a gate of the transistor is electrically connected to the first electrode of the second capacitor, one of a source and a drain of the transistor is electrically connected to a first electrode of the light-emitting element, the other of the source and the drain of the transistor is electrically connected to the other terminal of the second switch and is maintained at a fixed potential, and a second electrode of the light-emitting element and the other terminal of the first switch are electrically connected to the same wire.

In one feature of the display device of the present invention, a light-emitting element, a first switch, a second switch, a third switch, a fourth switch, a transistor, a first capacitor, and a second capacitor are included, in which one terminal of the fourth switch is maintained at a fixed potential, one terminal of the first switch is electrically connected to a first electrode of the second capacitor, a second electrode of the second capacitor is electrically connected to one terminal of the second switch and a first electrode of the first capacitor, a second electrode of the first capacitor is maintained at a fixed potential, one terminal of the third switch is electrically connected to the second electrode of the second capacitor, the other terminal of the third switch is electrically connected to a first wire, a gate of the transistor is electrically connected to the first electrode of the second capacitor, one of a source and a drain of the transistor is electrically connected to a first electrode of the light-emitting element, the other of the source and the drain of the transistor is electrically connected to the other terminal of the second switch and the other terminal of the fourth switch, and a second electrode of the light-emitting element and the other terminal of the first switch are electrically connected to the same second wire.

By using the present invention, since the number of wires can be reduced in each pixel, the aperture ratio can be improved and the manufacturing process can be simplified. Consequently, such a highly reliable display device can be manufactured with a high yield. In addition, the present invention can manufacture a display device at a low cost with good productivity.

BRIEF DESCRIPTION OF THE DRAWINGS

FIGS. 17A to 17C are top views each of a display device of the present invention.

FIGS. 18A and 18B are top views each of a display device of the present invention.

FIG. 20 is a block diagram showing a main structure of an electronic device to which the present invention is applied.

DETAILED DESCRIPTION OF THE PRESENT INVENTION

Figure 1A:
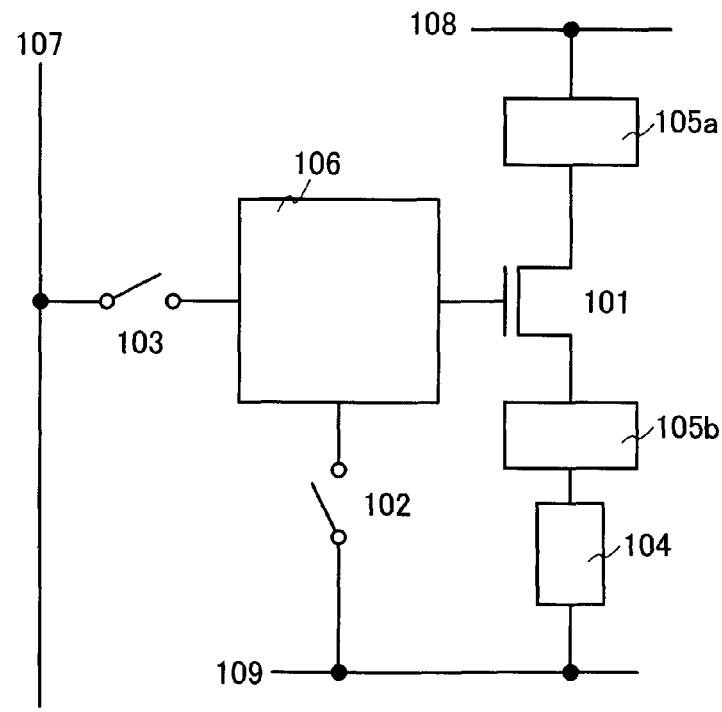
FIGS. 1A and 1B are schematic diagrams showing the present invention.

Although the present invention will be fully described by way of embodiment modes with reference to the accompanying drawings, it is to be understood that various changes and modifications will be apparent to those skilled in the art. Therefore, unless such changes and modifications depart from the scope of the present invention, they should be construed as being included therein. Note that the same portions or the portions having the same functions are denoted by the identical reference numerals in the drawings, and description thereof is omitted.

Embodiment Mode 1

An embodiment mode of the present invention will be described using FIGS. 1A and 1B. A pixel shown in FIG. 1A includes a transistor 101, switches 102 and 103, a light-emitting element 104, controlling circuits 105a and 105b, and a compensating circuit 106. The present invention is not limited to the configuration of FIGS. 1A and 1B; all of the above-described components are not necessarily included.

Figure 1B:
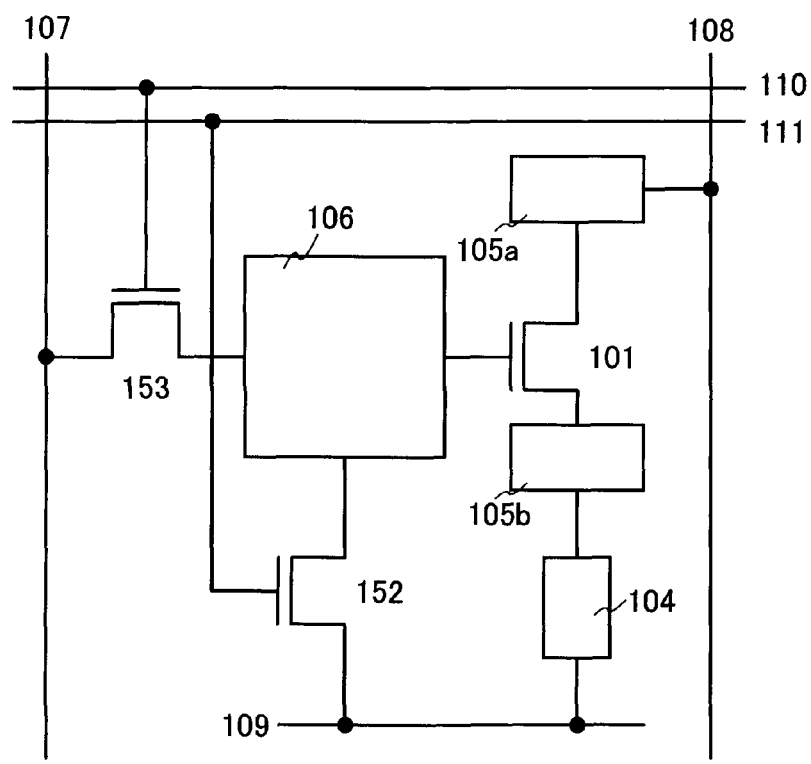

FIG. 1B shows an example in which transistors 152 and 153 are used as the switches 102 and 103 respectively in FIG. 1A. The transistor 101 is a transistor for controlling light-emission of the light-emitting element, the transistor 153 is a transistor for controlling a video signal input to the pixel, a wire 107 is a wire for sending the video signal, a wire 108 is a wire maintained at a certain potential, and a wire 109 is a wire maintained at a certain potential. Respective potentials of the wires 108 and 109 are different, and have a potential difference.

Each conductivity type of the transistors 101, 152, and 153 may be either n-channel or a p-channel.

A gate of the transistor 153 is connected to a wire 110, one of a source and a drain thereof is connected to the wire 107, and the other of the source and the drain thereof is connected to the compensating circuit 106. A gate of the transistor 152 is connected to a fifth wire 111, one of a source and a drain thereof is connected to the compensating circuit 106, and the other of the source and the drain thereof is connected to the wire 109.

A gate of the transistor 101 is connected to the compensating circuit 106, one of a source and a drain thereof is connected to the controlling circuit 105a, and the other of the source and the drain thereof is connected to the controlling circuit 105b. The controlling circuit 105b is connected to a first electrode of the light-emitting element 104. The controlling circuit 105a is connected to the wire 108, and a second electrode of the light-emitting element 104 is connected to the wire 109. According to the present invention, the transistor 152 and the light-emitting element 104 are connected to the common wire 109 in FIG. 1B.

Figure 26A:
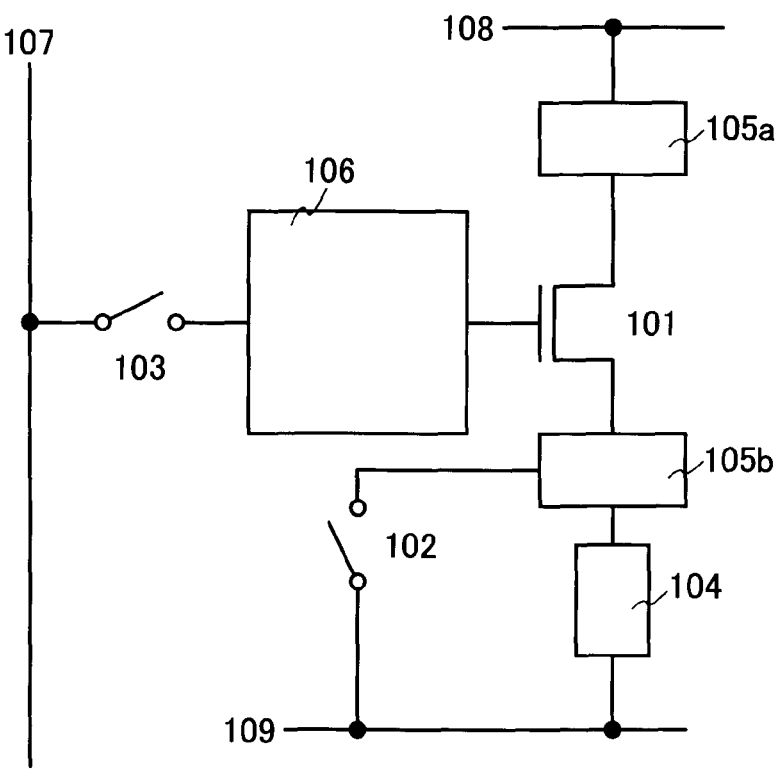
FIGS. 26A and 26B are schematic diagrams showing the present invention.
Figure 26B:
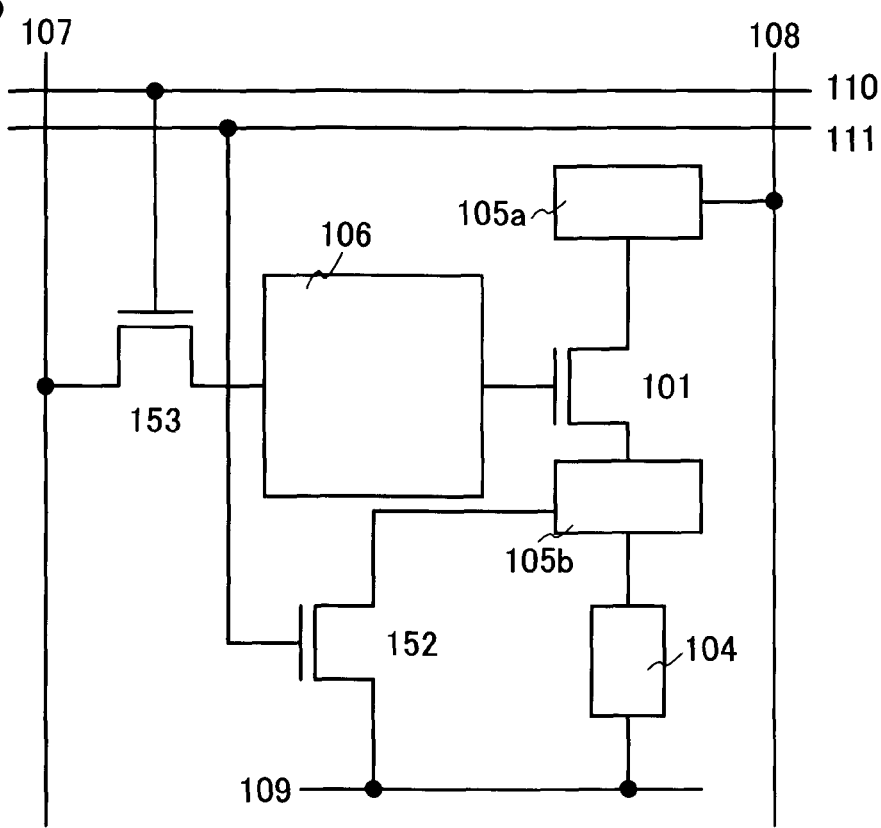

Further, as shown in FIG. 26A, one terminal of the switch 102 may be connected not to the compensating circuit 106 but to the controlling circuit 105b, and the other terminal thereof may be connected to the wire 109. As shown in FIG. 26B, one of a source and a drain of the transistor 152 may be connected not to the compensating circuit 106 but to the controlling circuit 105b, and the other of the source and the drain thereof may be connected to the wire 109.

Figure 27A:
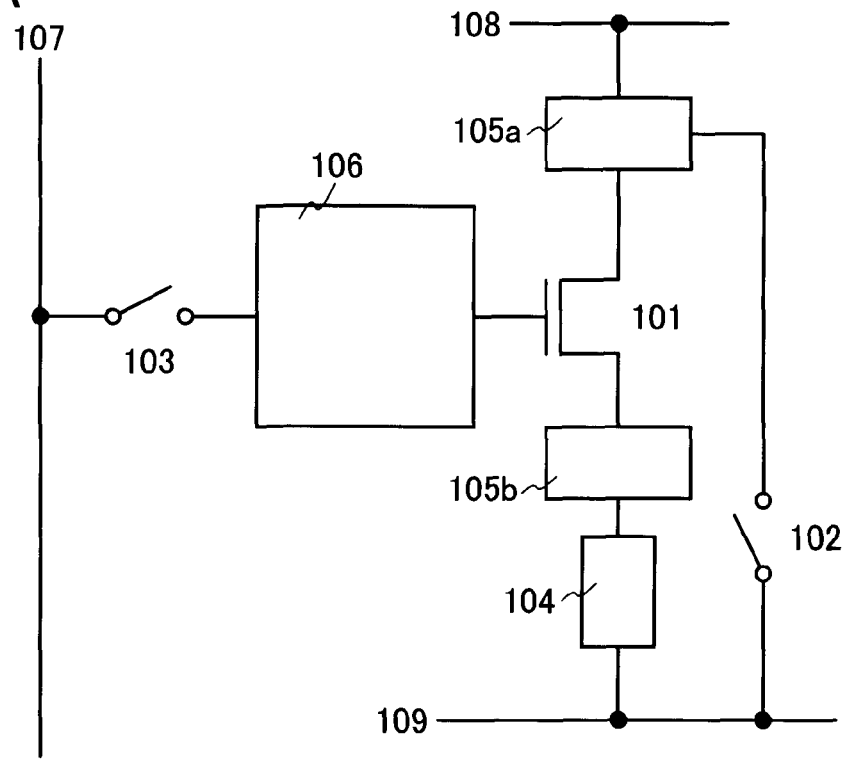
FIGS. 27A and 27B are schematic diagrams showing the present invention.
Figure 27B:
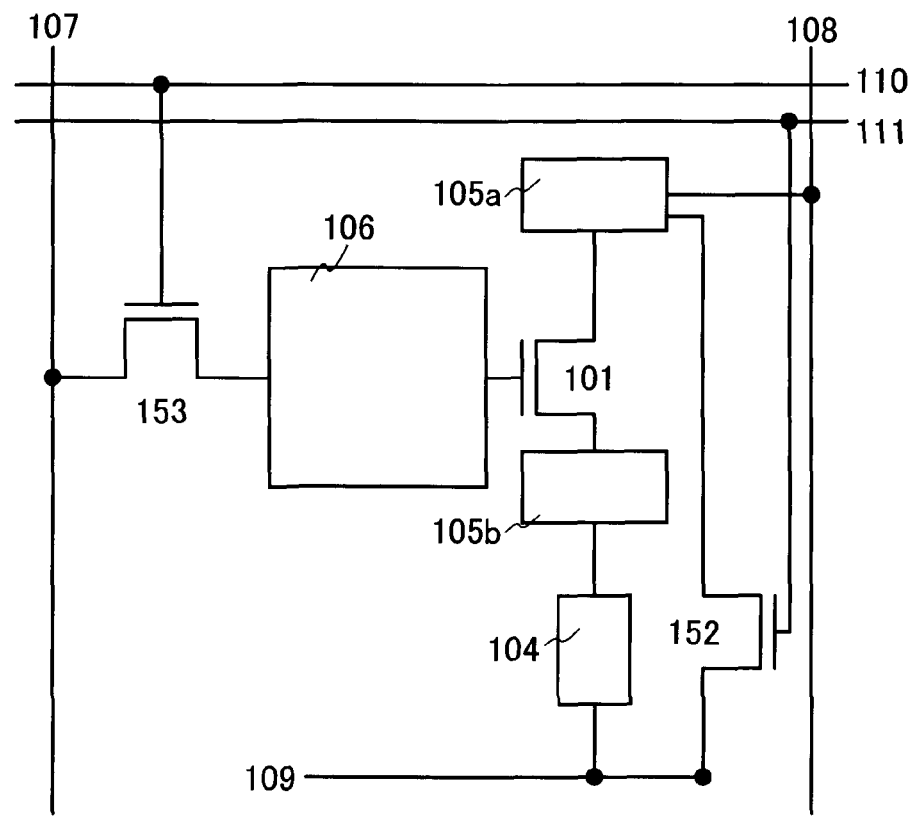

Further, as shown in FIG. 27A, one terminal of the switch 102 may be connected not to the compensating circuit 106 but to the controlling circuit 105a, and the other terminal thereof may be connected to the wire 109. As shown in FIG. 27B, one of a source and a drain of the transistor 152 may be connected not to the compensating circuit 106 but to the controlling circuit 105a, and the other of the source and the drain thereof may be connected to the wire 109.

Figure 28A:
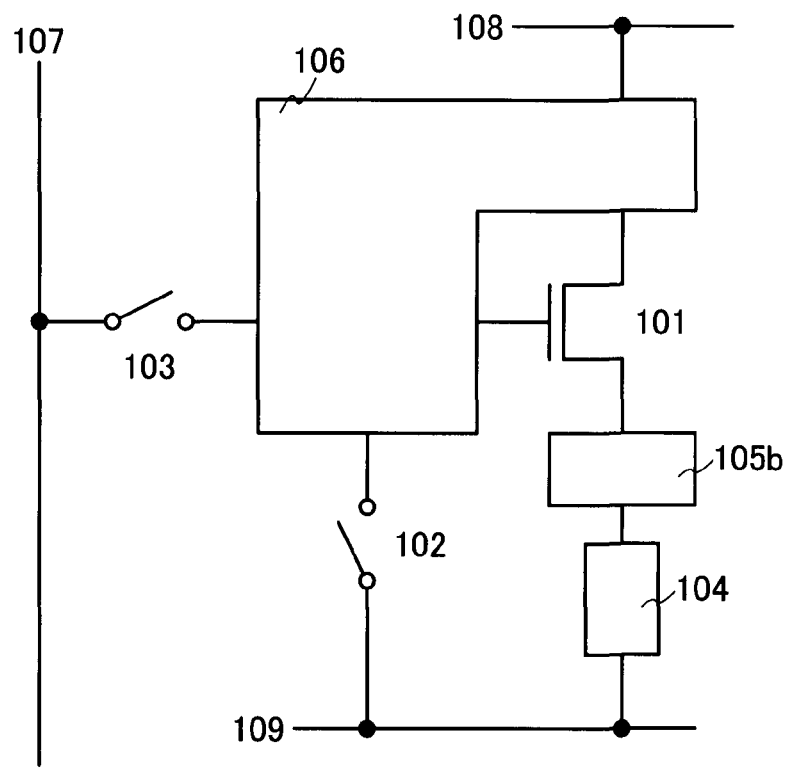
FIGS. 28A and 28B are schematic diagrams showing the present invention.
Figure 28B:
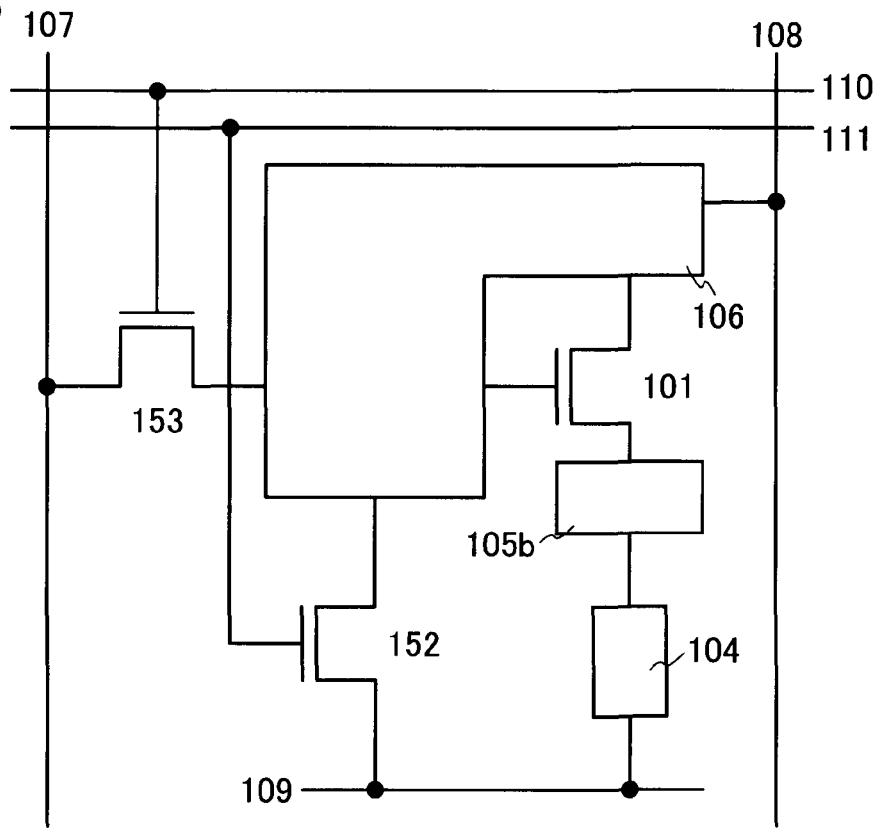

Further, as shown in FIGS. 28A and 28B, no controlling circuit 105a may be included, the compensating circuit 106 may be connected to the wire 108, and one of a source and a drain of the transistor 101 may be connected to the compensating circuit 106. As described above, the position of the switch 102 (the transistor 152) in the pixel of the present invention is not limited to that shown in FIGS. 1A and 1B; the switch 102 (the transistor 152) may also be arbitrarily as shown in FIGS. 26A to 28B. As described above, the pixel of the present invention may also have a configuration including not both of the controlling circuits 105a and 105b but only one of the controlling circuits 105a and 105b.

Figure 2A:
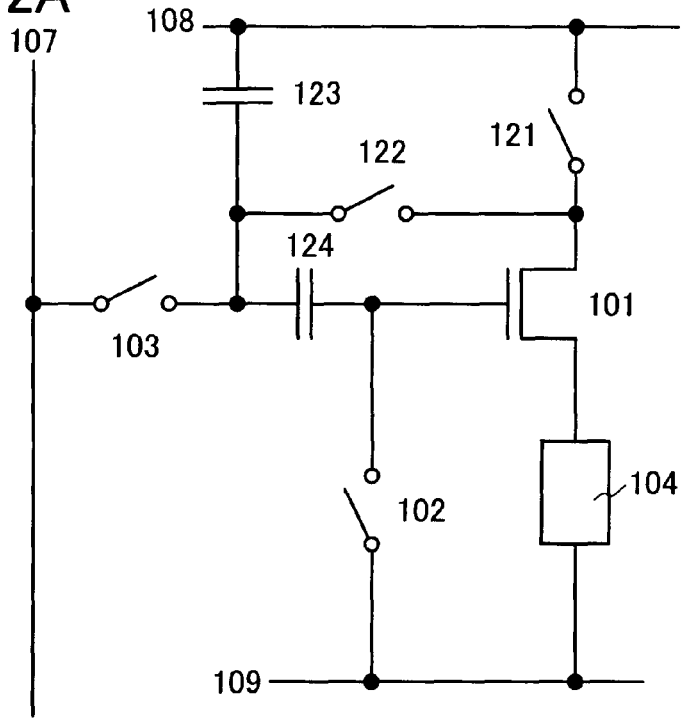
FIGS. 2A and 2B are circuit diagrams for showing a pixel configuration applicable to a display device of the present invention.
Figure 2B:
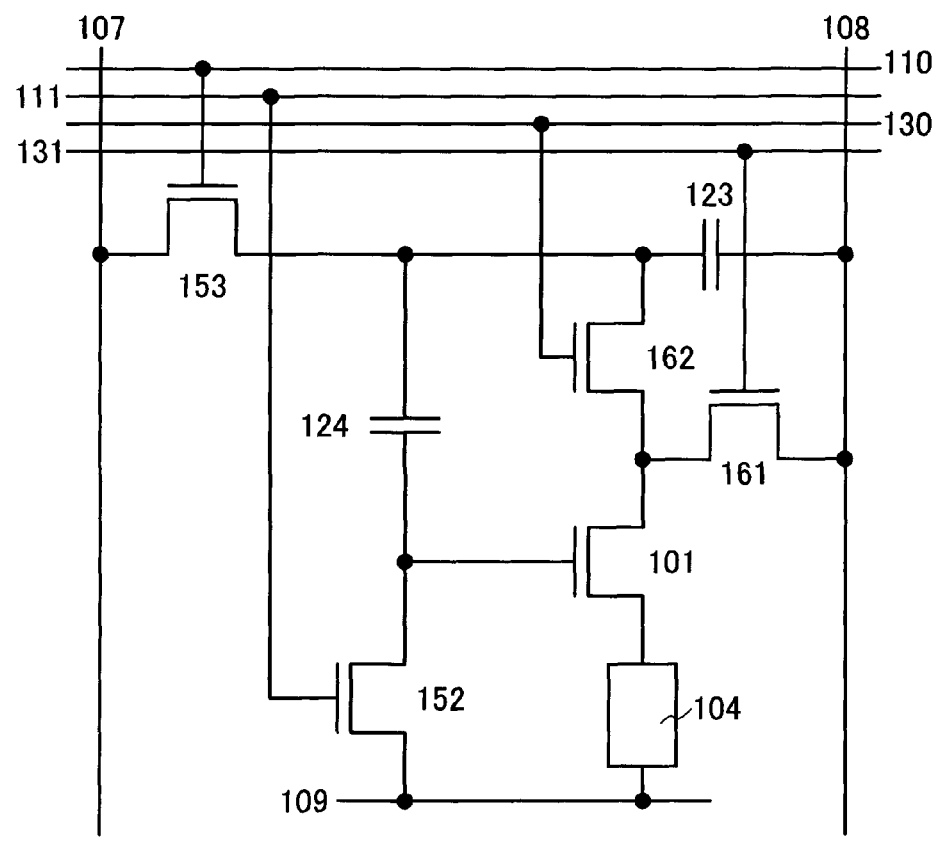

FIGS. 2A and 2B each show an example of a pixel to which the present invention is applied, in which the compensating circuit 106 and the controlling circuits 105a and 105b in FIGS. 1A and 1B are more specifically described. The pixel shown in FIG. 2A includes the transistor 101, the switches 102 and 103, a light-emitting element 104, switches 121 and 122, and capacitors 123 and 124. In the pixel shown in FIG. 2A, the switch 122 and the capacitors 123 and 124 correspond to the compensating circuit 106 in FIG. 1A, and the switch 121 corresponds to the controlling circuit 105a in FIG. 1A. In the pixel shown in FIG. 2B, a transistor 162 and the capacitors 123 and 124 correspond to the compensating circuit 106 in FIG. 1B, and a transistor 161 corresponds to the controlling circuit 105a in FIG. 1B.

FIG. 2B shows an example in which transistors 152 and 153 and the transistors 161 and 162 are used as the switches 102, 103, 121, and 122 in FIG. 2A.

A gate of the transistor 153 is connected to the wire 110, one of a source and a drain thereof is connected to the wire 107, and the other of the source and the drain thereof is connected to a first electrode of the capacitor 124 and one of a source and a drain of the transistor 162. A gate of the transistor 162 is connected to a wire 130, one of a source and a drain thereof is connected to a first electrode of the capacitor 123, and the other of the source and the drain thereof is connected to one of a source and a drain of the transistor 161 and one of a source and a drain of the transistor 101. A gate of the transistor 161 is connected to a wire 131, and the other of the source and the drain thereof is connected to the wire 108.

A second electrode of the capacitor 123 is connected to the wire 108. A second electrode of the capacitor 124 is connected to one of a source and a drain of the transistor 152 and a gate of the transistor 101. A gate of the transistor 152 is connected to the wire 111, and the other of the source and the drain thereof is connected to the wire 109. The other of the source and the drain of the transistor 101 is connected to a first electrode of the light-emitting element 104. A second electrode of the light-emitting element 104 is connected to the wire 109. According to the present invention, the transistor 152 and the light-emitting element 104 are connected to the common wire 109 in FIG. 2B.

First, the switches 121, 122, and 102 are turned ON and the switch 103 is turned OFF. Thereby a current flows from the wire 108 to the wire 109 through the switches 121 and 122, the second capacitor 124, and the switch 102, so that electric charge is charged in the second capacitor 124. When the voltage held in the second capacitor 124 exceeds the threshold voltage of the transistor 101, the transistor 101 is turned ON. When the transistor 101 is turned ON, a current flows from the wire 108 to the wire 109 through the switch 121, the transistor 101, and the light-emitting element 104.

Next, the switches 122 and 102 are turned ON, and the switches 121 and 103 are turned OFF. The electric charge held in the second capacitor 124 is discharged, so that a current flows through the switch 122, the transistor 101, the light-emitting element 104, the switch 102 and the second capacitor 124. When a voltage value between both the electrodes of the second capacitor 124, which is namely a voltage value between the gate and the source of the transistor 101, becomes equal to the threshold voltage of the transistor 101, the transistor 101 is turned OFF, so that the discharge of the electric charge held in the second capacitor 124 is completed.

Next, the switches 121, 122, 102, and 103 are turned OFF. Thereby the threshold voltage of the transistor 101 is held in the second capacitor 124.

Subsequently, the switch 103 is turned ON, and the switches 102, 121, and 122 are turned OFF. Thereby a video signal is outputted to the wire 107, so that the wire 107 has a potential VD of the video signal. Since the threshold voltage of the transistor 101 is held in the second capacitor 124, the gate potential of the transistor 101 becomes a potential (VD+Vth) obtained by adding the threshold voltage (Vth) of the transistor 101 to the video signal potential VD inputted from the wire 107. Thereby the transistor 101 is turned ON.

When the writing of the video signal is completed, the switch 103 is turned OFF. After that, the video signal output to the wire 107 is completed, so that a certain potential is maintained.

Then, the switch 121 is turned ON. Since the transistor 101 has been already turned ON, a current flows from the wire 108 to the light-emitting element 104 through the switch 121 and the transistor 101. Thereby the light-emitting element 104 emits light. At this time, the current value flowing into the light-emitting element 104 depends on the voltage value between the gate and the source of the transistor 101. When the potential of the wire 108 is Va, the voltage value between the gate and the source of the transistor 101 at this time is (Va−(VD+Vth)). Here, even if the threshold voltage (Vth) of the transistor 101 varies between the pixels, a voltage depending on the variation is held in the second capacitor 124 in each pixel. Accordingly, the luminance of the light-emitting element 104 is not affected by the variation in threshold voltage of the transistor 101.

The luminance of the light-emitting element which is a load has a proportional relation to the current which flows into the light-emitting element. Therefore, the present invention in which the amount of current to be supplied to the light-emitting element is controlled can control the luminance of the light-emitting element easier than the case where the amount of voltage to be supplied to the light-emitting element is controlled.

In addition, the present invention in which the amount of current to be supplied to the light-emitting element is controlled can flow a predetermined current to the light-emitting element even if the voltage-current characteristics of the light-emitting element is changed by deterioration, temperature change, or the like of the light-emitting element. Accordingly, variation in luminance of the light-emitting element can be suppressed.

Figure 25A:
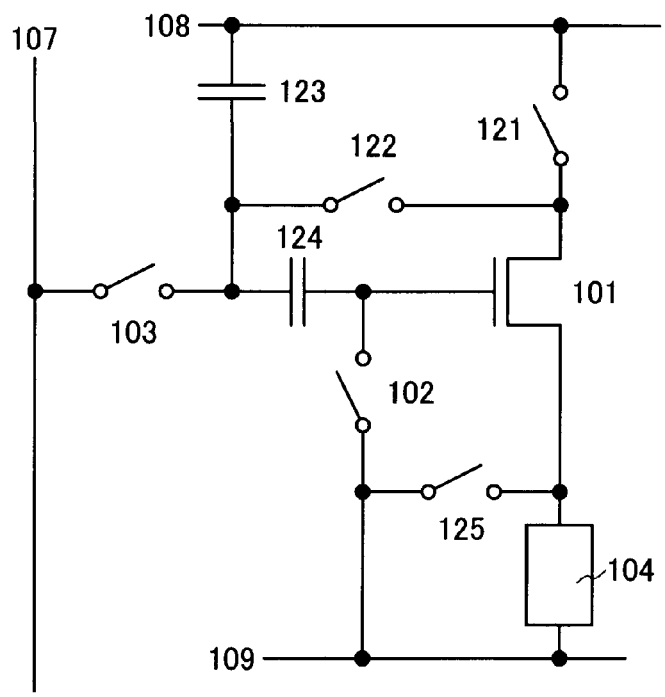
FIGS. 25A and 25B are circuit diagrams for showing a pixel configuration applicable to a display device of the present invention.
Figure 25B:
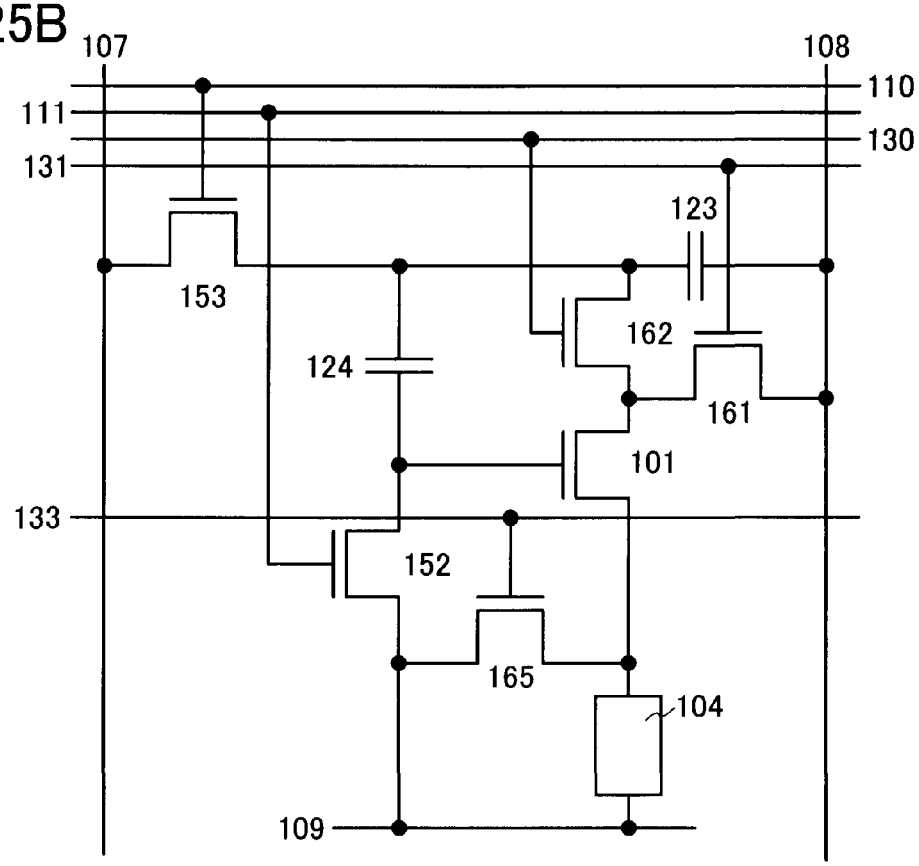

Further, a configuration in which a switch is provided in addition to each pixel configuration shown in FIGS. 2A and 2B may also be employed. A configuration in which a switch 125 is provided is shown in each of FIGS. 25A and 25B. In FIG. 25A, one terminal of the switch 125 is connected to one terminal of the switch 102, and the other terminal thereof is connected to a first electrode of the light-emitting element 104. FIG. 25B shows an example in which a transistor 165 is used as the switch 125. In FIG. 25B, a gate of the transistor 165 is connected to a wire 133, one of a source and a drain thereof is connected to one of a source and a drain of the transistor 152, which is connected to the wire 109, and the other of the source and the drain of the transistor 165 is connected to a first terminal of the light-emitting element 104.

Figure 3A:
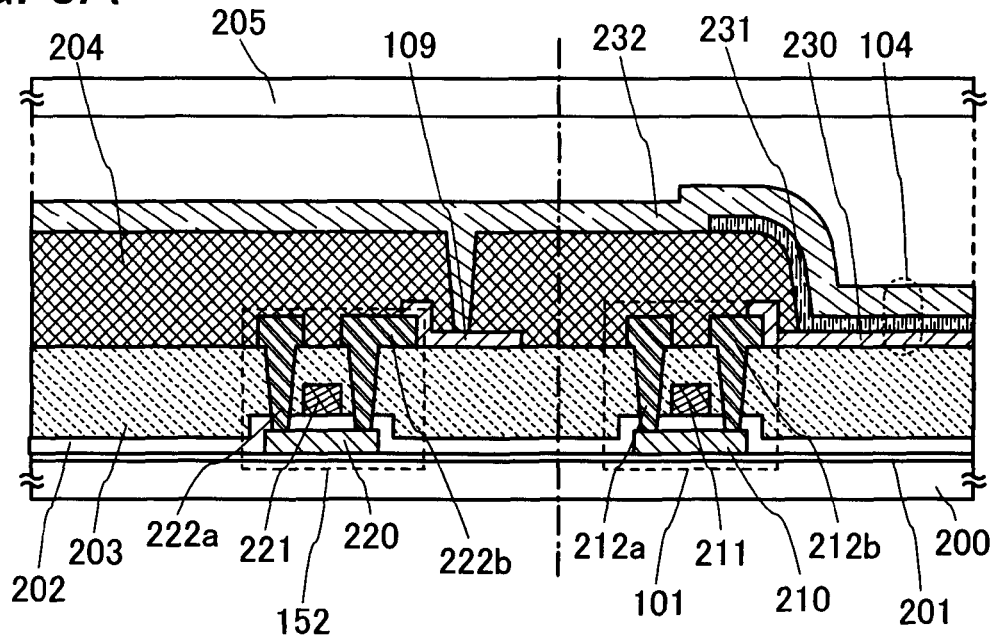
FIGS. 3A and 3B are cross-sectional views for showing a display device of the present invention.
Figure 3B:
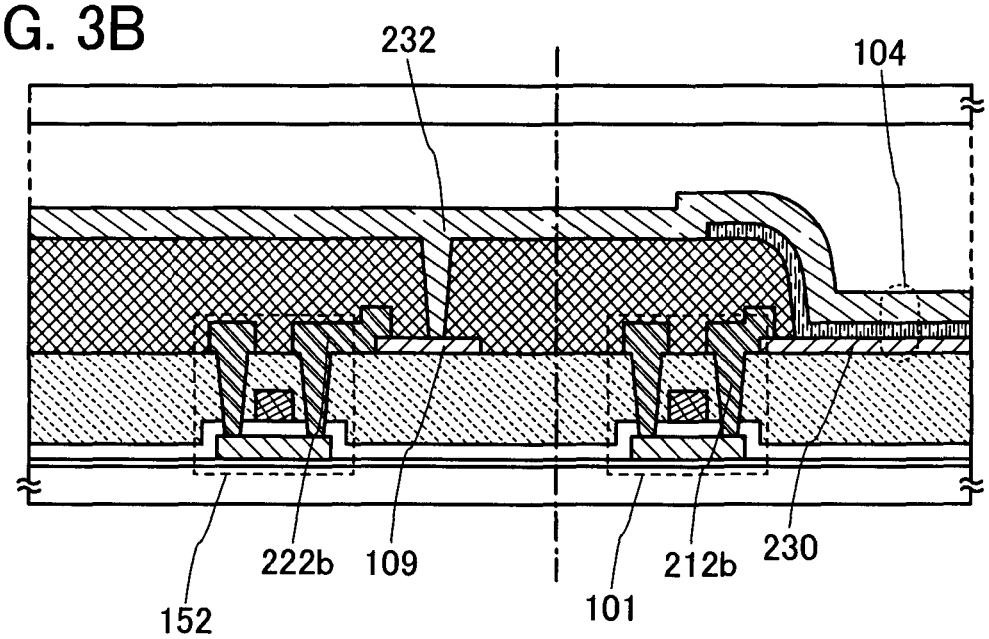

In the present invention, the second electrode of the light-emitting element 104 and the switch 102 (the transistor 152) are connected to the common wire 109. Cross-sectional views of the pixels are FIGS. 3A and 3B. FIGS. 3A and 3B correspond to the pixels shown in FIGS. 2A and 2B, in which the transistors 101 and 152 are formed over a substrate 200 with an insulating layer 201 which functions as a base layer interposed therebetween. Although an example in which top-gate thin film transistors are used as the transistors 101 and 152 is described in this embodiment mode, the present invention is not limited to this configuration; a bottom-gate thin film transistor may also be used.

In FIG. 3A, the transistor 101 includes a semiconductor layer 210, a gate insulating layer 202, a gate 211, a wire 212a, and a wire 212b, and the transistor 152 includes a semiconductor layer 220, the gate insulating layer 202, a gate 221, a wire 222a, and a wire 222b. Over the transistors 101 and 152, an insulating layer 203 which functions as an interlayer insulating layer and an insulating layer 204 which functions as a partition wall of a light-emitting element are formed.

A first electrode 230 is formed in contact with the wire 222b, so that the transistor 101 and the light-emitting element 104 are electrically connected to each other. The light-emitting element 104 is structured by stacking the first electrode 230, an electroluminescence layer 231, and a second electrode 232. The wire 109 is formed over the insulating layer 203 by the same step as the first electrode 230 so as to be in contact with the wire 222b of the transistor 152, so that the transistor 152 and the wire 109 are electrically connected to each other. Further, the second electrode 232 of the light-emitting element 104 is in contact with the wire 109 at an opening (also called "contact hole) formed in the insulating layer 204 so as to reach the wire 109, so that the light-emitting element 104 and the wire 109 are electrically connected to each other.

FIG. 3B shows an example in which the stack structure of the wire 212b of the transistor 101 and the first electrode 230 of the light-emitting element 104 and the stack structure of the wire 222b of the transistor 152 and the wire 109 are different from those in FIG. 3A. In the process of FIG. 3A, the wires 212b and 222b are formed, and then the first electrode 230 and the wire 109 are formed. On the other hand, in the process of FIG. 3B, the first electrode 230 and the wire 109 are formed over the insulating layer 203 in advance, and then the wires 212b and 222b are formed. Thus, the stack order of FIG. 3A is opposite to that of 3B. The following advantages exist respectively in FIGS. 3A and 3B: contamination of an etching residue or the like on a surface of the first electrode 230 can be prevented in FIG. 3A; coverage is good since the first electrode 230 is formed in a flat region and the wire 212b is stacked, grinding treatment such as CMP can be sufficiently performed so that formation with high flatness can be performed in FIG. 3B.

Figure 4A:
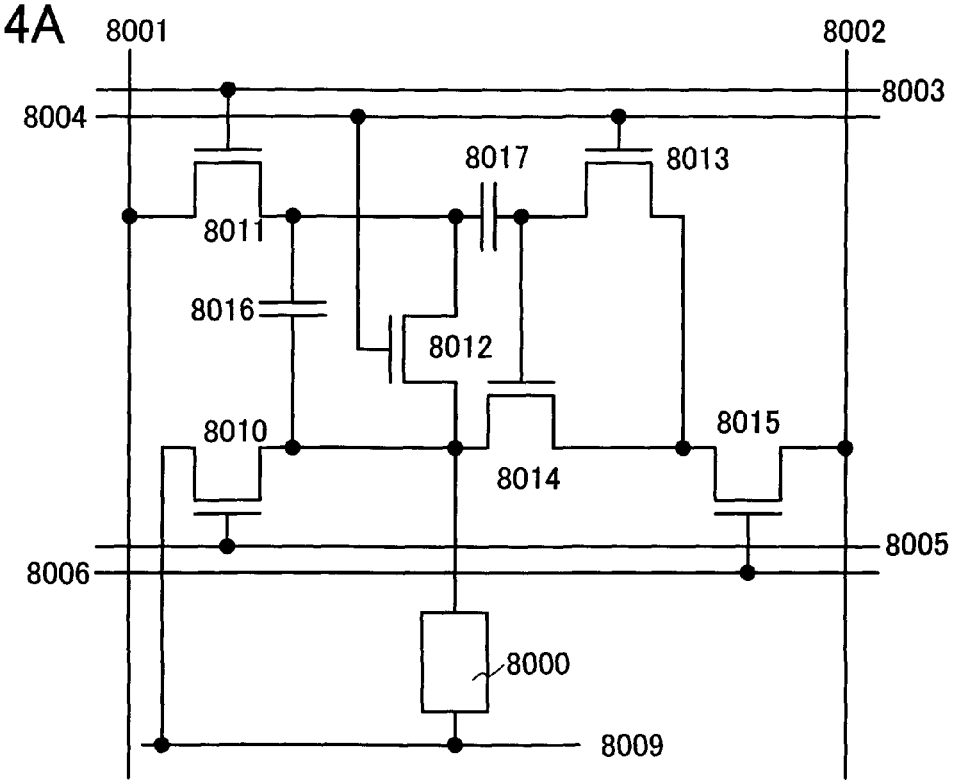
FIGS. 4A and 4B are circuit diagrams for showing a pixel configuration applicable to a display device of the present invention.
Figure 14A:
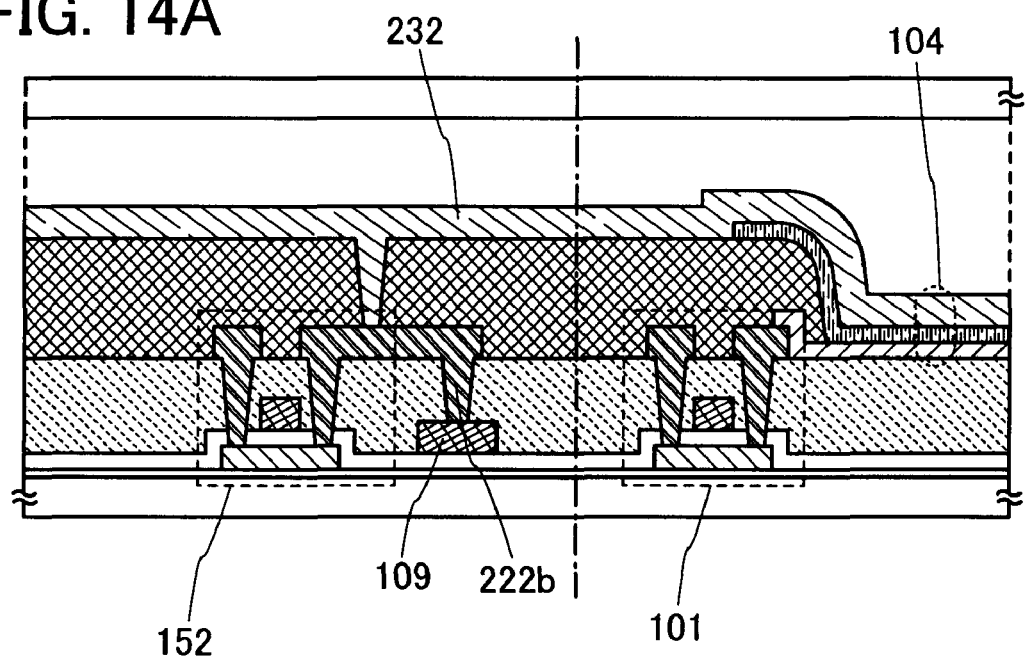
FIGS. 14A and 14B are cross-sectional views for showing a display device of the present invention.
Figure 14B:
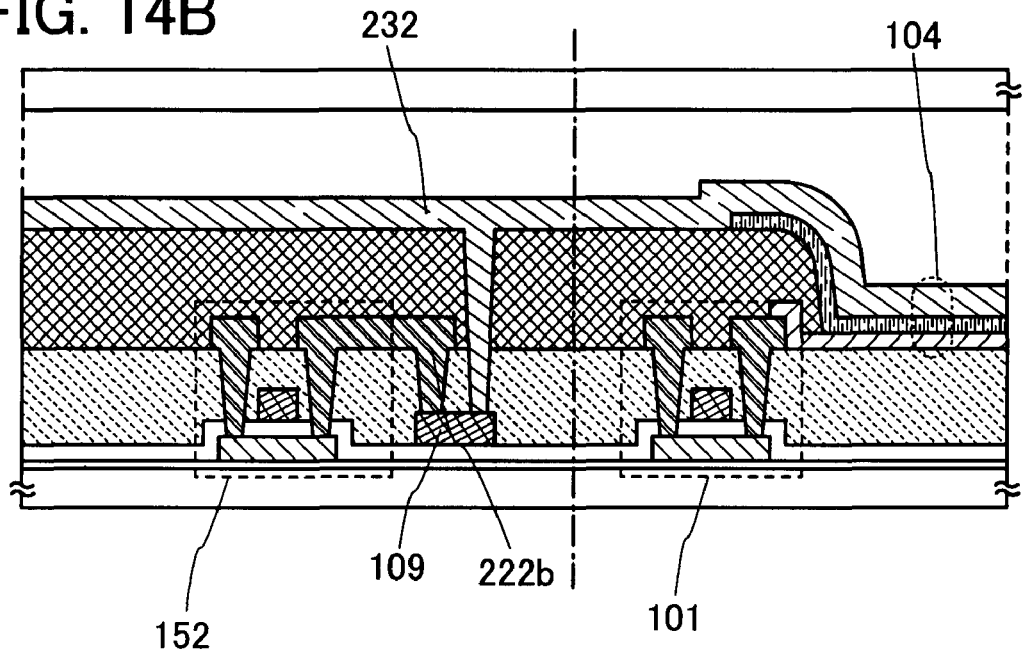

FIGS. 14A and 14B each show an example in which the wire 109 is formed by the same step as gates of the transistors 152 and 101 in the display devices of FIGS. 3A and 3B. In FIGS. 4A and 14B, the wire 109 is formed over the gate insulating layer 202. In FIG. 14A, the wire 222b of the transistor 152 is electrically connected by forming so as to be in contact with the wire 109 at an opening formed in the insulating layer 203, and the second electrode 232 of the light-emitting element 104 is electrically connected to the wire 109 via the wire 222b. In FIG. 14B, the second electrode 232 of the light-emitting element 104 is directly to the wire 109 at an opening formed in the insulating layers 203 and 204, so that the wire 222b and the second electrode 232 are electrically connected to each other via the wire 109.

Figure 23:
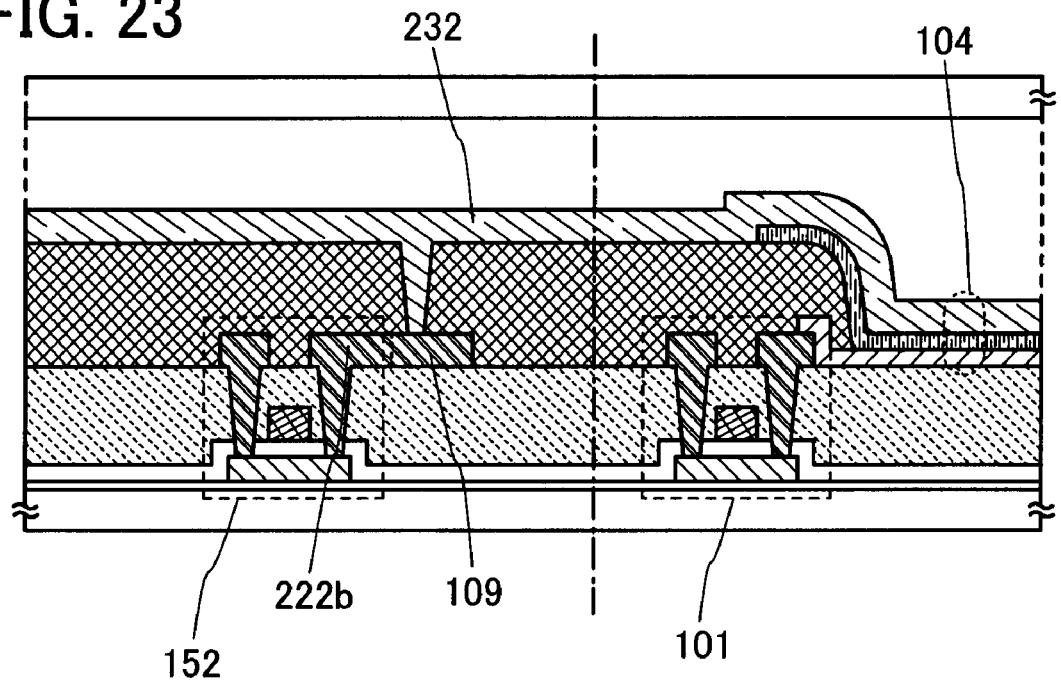
FIG. 23 is a cross-sectional view showing a display device of the present invention.

Further, FIG. 23 shows an example in which the wire 109 is manufactured by the same step as the wire 222b. In FIG. 23, the wire 109 and the wire 222b are manufactured by the same step and the wire 109 and the wire 222b are the same common wire. The second electrode 232 of the light-emitting element 104 is formed so as to be in contact with this wire which functions as both the wire 109 and the wire 222b, so that the wires 109 and 222b and the second electrode 232 are electrically connected to each other.

Figure 29A:
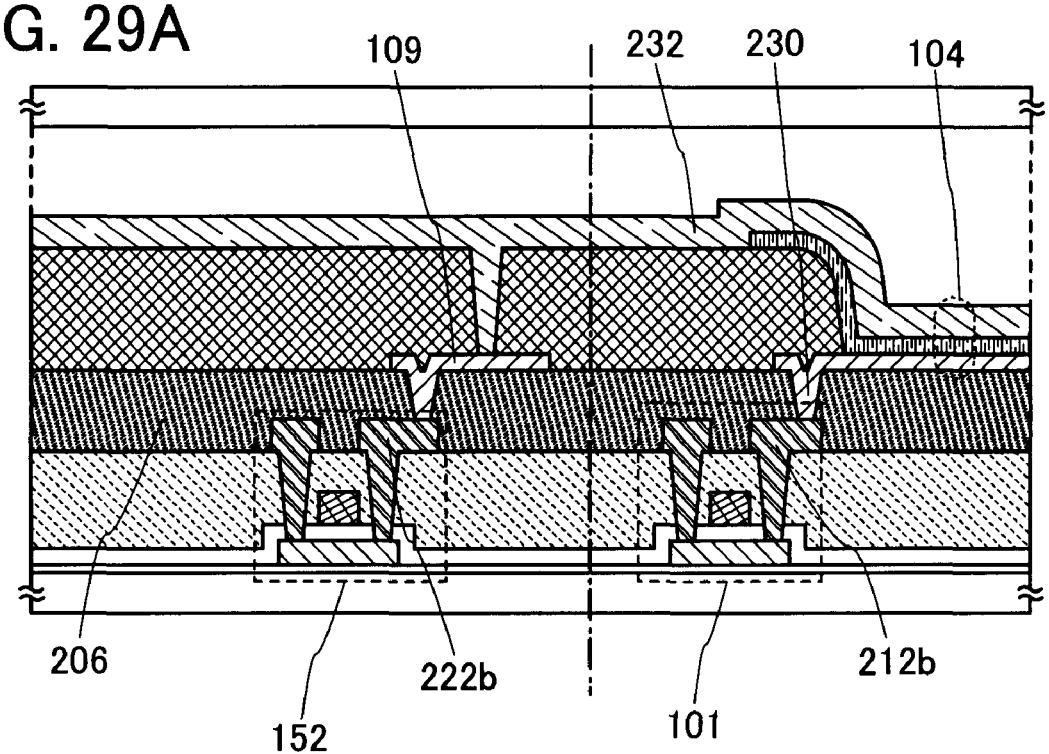
FIGS. 29A and 29B are cross-sectional views for showing a display device of the present invention.
Figure 29B:
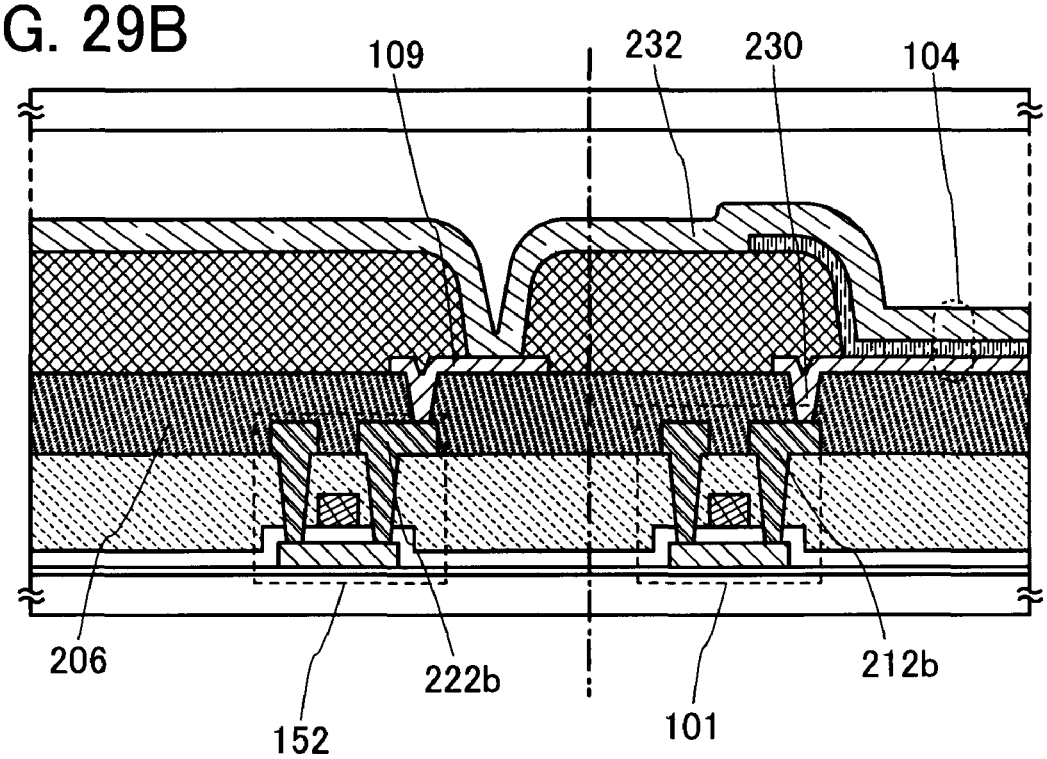

FIGS. 29A and 29B each show an example in which an insulating layer 206 is formed as an interlayer insulating layer over the insulating layer 203. In FIG. 29A, the insulating layer 206 is formed over the transistors 152 and 101 and the insulating layer 203, and the wire 109 and the first electrode 230 are formed at openings formed in the insulating layer 206. The wire 212b of the transistor 101, which is formed so as to be in contact with the first electrode 230 at the opening formed in the insulating layer 206, is electrically connected to the first electrode 230. The wire 222b of the transistor 152, which is formed so as to be in contact with the wire 109 at the opening formed in the insulating layer 206, is electrically connected to the wire 109. The second electrode 232 of the light-emitting element 104, which is formed so as to be in contact with the wire 109 at an opening formed in the insulating layer 204, is electrically connected to the wire 109.

FIG. 29B shows an example in which the connection region between the second electrode 232 and the wire 109 is larger than that in FIG. 29A. As described above, any connection mode may be applied to connection between the second electrode 232 and the wire 109; in addition, although the number of connection points is one in FIGS. 29A and 29B, they may be connected at plural points and the shape for connection can be set arbitrarily. As described above, as long as the transistor 152 and the light-emitting element 104 are electrically connected to the same wire 109, the wire 109 may be manufactured at any step in manufacturing the display device, and layout can be set arbitrarily.

In the case where a plurality of insulating layers are connected by a plurality of wires through openings (contact holes) as shown in FIG. 29A, respective openings formed in the insulating layers may be either overlapped or not overlapped. For example, in the example of FIG. 29A, the opening for forming the wire 222b of the insulating layer 203, the opening for forming the wire 109 of the insulating layer 206, and the opening for forming the second electrode 232 of the insulating layer 204 are not overlapped one another. Further, a continuous opening may be formed in the insulating layers 203, 206, and 204 as well.

Figure 12A:
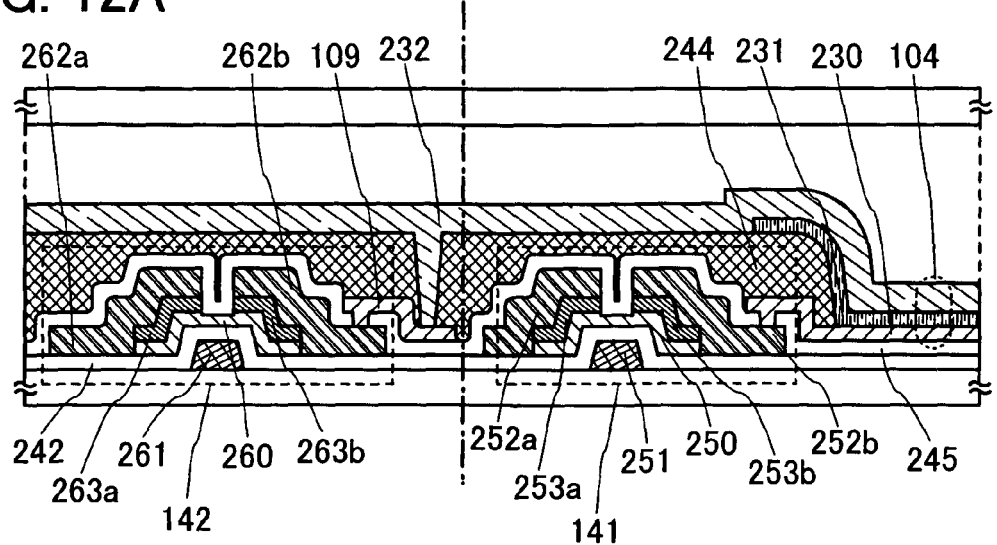
FIGS. 12A and 12B are cross-sectional views for showing a display device of the present invention.
Figure 12B:
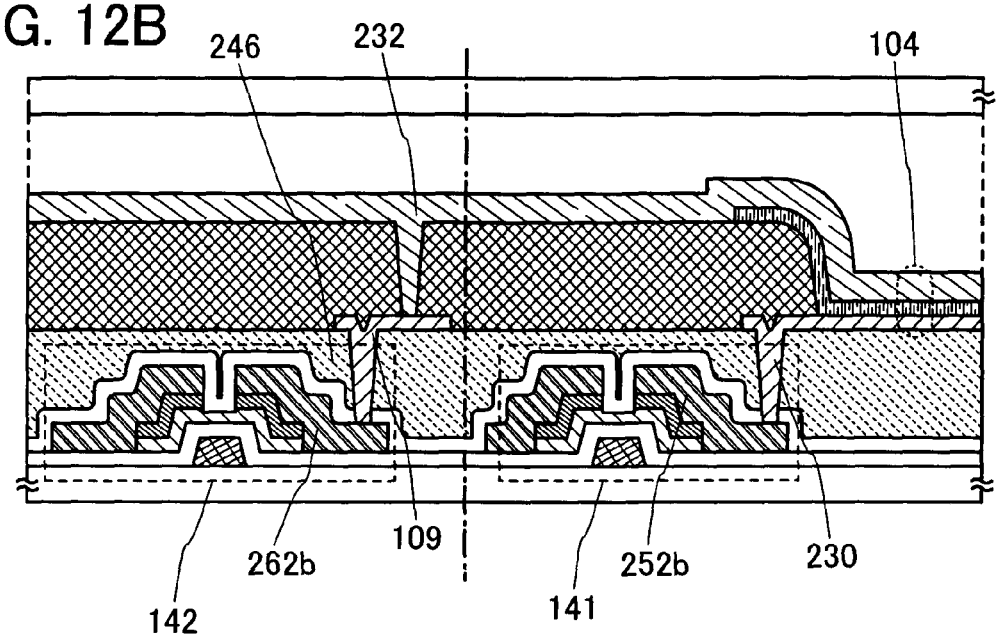

FIGS. 12A and 12B each show an example in which an inverted staggered, channel-etch type thin film transistor is used as a transistor.

In FIG. 12A, a transistor 141 includes a semiconductor layer 250, a gate insulating layer 242, a semiconductor layer 253a having one conductivity type, a semiconductor layer 253b having one conductivity type, a gate 251, a wire 252a, and a wire 252b, and a transistor 142 includes a semiconductor layer 260, a semiconductor layer 263a having one conductivity type, a semiconductor layer 263b having one conductivity type, the gate insulating layer 242, a gate 261, a wire 262a, and a wire 262b. Over the transistors 141 and 142, an insulating layer 245 which functions as an interlayer insulating layer and an insulating layer 244 which functions as a partition wall of a light-emitting element are formed. In this embodiment mode, the insulating layer 245 is an inorganic film formed using an inorganic material.

The first electrode 230 is formed so as to be in contact with the wire 252b at an opening formed in the insulating layer 245, so that the transistor 141 and the light-emitting element 104 are electrically connected to each other. The light-emitting element 104 is structured by stacking the first electrode 230, the electroluminescence layer 231, and the second electrode 232. The wire 109 is formed by the same step as the first electrode 230 so as to be in contact with the wire 262b of the transistor 142 at an opening formed in the insulating layer 245, so that the transistor 142 and the wire 109 are electrically connected to each other. Further, the second electrode 232 of the light-emitting element 104 is in contact with the wire 109 at an opening (also called "contact hole") formed in the insulating layer 244 so as to reach the wire 109, so that the light-emitting element 104 and the wire 109 are electrically connected to each other.

FIG. 12A shows an example in which an amorphous semiconductor layer formed of amorphous silicon is used as each of the semiconductor layers 250 and 260, and a semiconductor film imparting n-type conductivity is used as each of the semiconductor layers 253a, 253b, 263a, and 263b having one conductivity type. The semiconductor layers 253a, 253b, 263a, and 263b having one conductivity type are not necessarily provided; they may be arbitrarily provided.

FIG. 12B shows an example in which an insulating layer 246 which is particularly advantageous as a flattening film is formed over the insulating layer 245. In FIG. 12B, the insulating layer 246 is preferably formed of an organic material in order to flatten convex and concave formed by the transistors 142 and 141.

In FIG. 12B, the first electrode 230 is formed so as to be in contact with the wire 252b at an opening formed in the insulating layers 245 and 246, so that the transistor 141 and the light-emitting element 104 are electrically connected to each other. The wire 109 is formed by the same step as the first electrode 230 so as to be in contact with the wire 262b of the transistor 142 at an opening formed in the insulating layers 245 and 246, so that the transistor 142 and the wire 109 are electrically connected to each other. Further, the second electrode 232 of the light-emitting element 104 is in contact with the wire 109 at an opening (also called "contact hole") formed in the insulating layer 244 so as to reach the wire 109, so that the light-emitting element 104 and the wire 109 are electrically connected to each other.

As described above, the transistor of the present invention is not particularly limited; either a top-gate transistor or a bottom-gate transistor may be arbitrarily used. In addition, either a planer transistor or a staggered transistor may be used.

The second electrode layer of the light-emitting element and the transistor in each pixel are electrically connected to each other via the common wire. Connection examples between the second electrode and the wire will be described using FIGS. 30A to 32B.

Figure 30A:
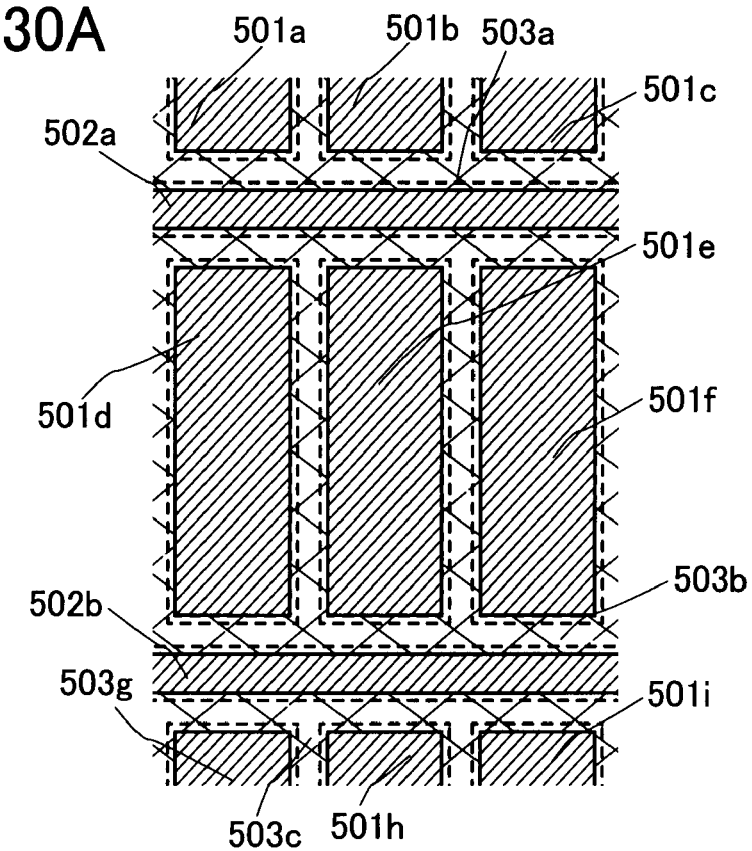
FIGS. 30A and 30B are top views for showing a display device of the present invention.

In FIG. 30A, first electrodes 501a to 501i of light-emitting elements for forming pixels are disposed contiguously in vertical and horizontal directions, and insulating layers 503a to 503c each of which functions as a partition wall are formed around the pixels. In FIG. 30A, an opening of the insulating layer is formed between the first electrodes 501a to 501c and the first electrodes 501d to 501f so that a wire 502a is exposed. Similarly, an opening of the insulating layer is formed between the first electrodes 501d to 501f and the first electrodes 501g to 501i so that a wire 502b is exposed. The wires 502a and 502b which are formed at the openings of the insulating layer which are opened so as to divide the pixels in the horizontal direction of this figure, and a second electrode which is formed over the first electrodes 501a to 501i with an electroluminescence layer interposed therebetween are formed so as to be in contact with each other to be electrically connected to each other. In FIG. 30A, three pixels including the first electrodes 501d, 501e, and 501f respectively have shape like a square, and a structure in which red (R), green (G), and blue (B) displays are performed by the first electrodes 501d, 501e, and 501f, respectively may be employed. Note that pixel forms in FIGS. 30B, and 31A to 32B are examples of the pixel form to which the present invention can be applied; the present invention is not limited to this embodiment mode.

Figure 30B:
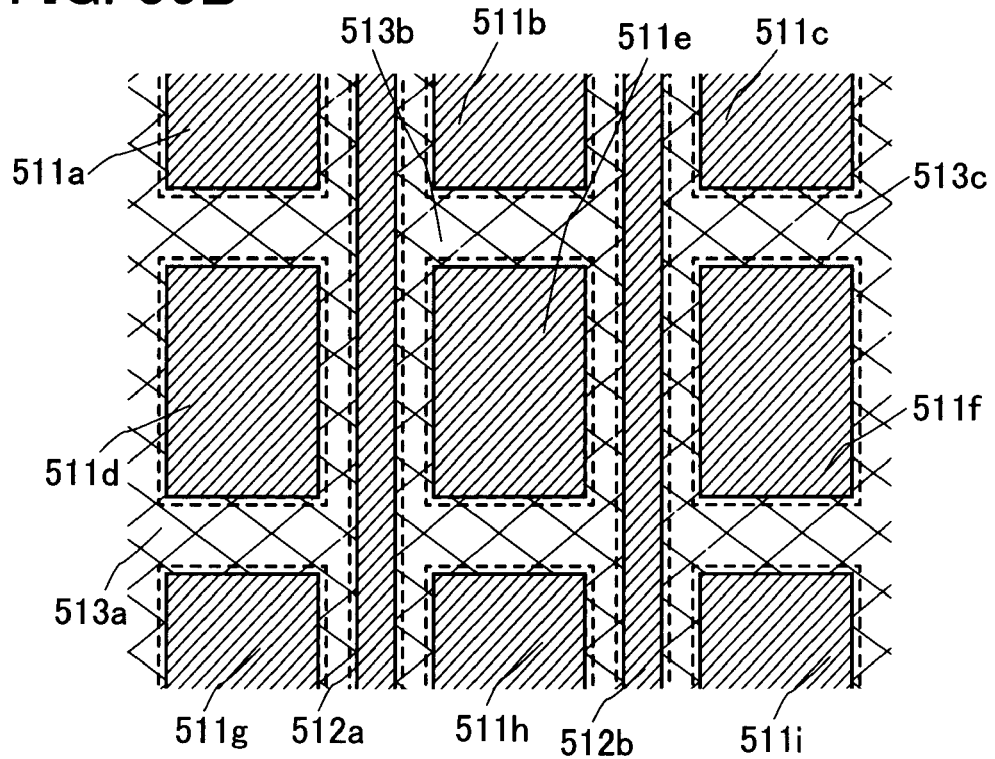

In FIG. 30B, first electrodes 511a to 511i of light-emitting elements for forming pixels are disposed contiguously in vertical and horizontal directions, and insulating layers 513a to 513c each of which functions as a partition wall are formed around the first electrodes of the pixels. In FIG. 30B, an opening of the insulating layer is formed between the first electrodes 511a, 511d, and 511g and the first electrodes 511b, 511e, and 511h so that a wire 512a is exposed. Similarly, an opening of the insulating layer is formed between the first electrodes 511b, 511e, and 511h and the first electrodes 511c, 511f, and 511i so that a wire 512b is exposed. The wires 512a and 512b which are formed at the openings of the insulating layer which are opened so as to divide the pixels in the vertical direction of this figure, and a second electrode which is formed over the first electrodes 511a to 511i with an electroluminescence layer interposed therebetween are formed so as to be in contact with each other to be electrically connected to each other.

Figure 31A:
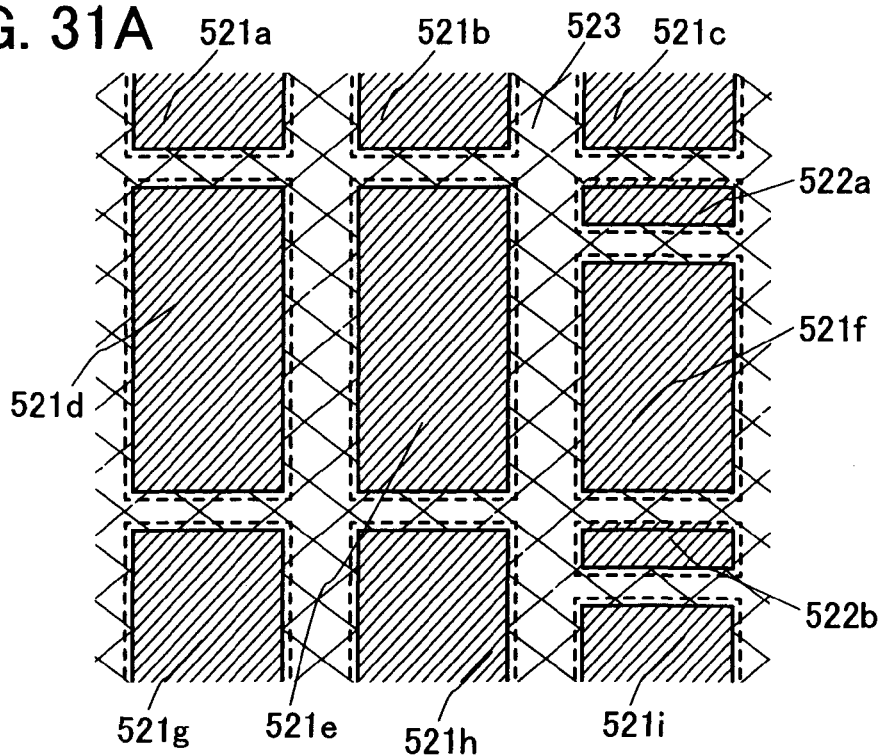
FIGS. 31A and 31B are top views for showing a display device of the present invention.

In FIG. 31A, first electrodes 521a to 521i of light-emitting elements for forming pixels are disposed contiguously in vertical and horizontal directions, and an insulating layer 523 which functions as a partition wall is formed around the first electrodes of the pixels. An opening of the insulating layer 523 is formed between the first electrodes 521c and 521f so that a wire 522a is exposed. Similarly, an opening of the insulating layer 523 is formed between the first electrodes 521f and 521i so that a wire 522b is exposed. The wires 522a and 522b, and a second electrode which is formed over the first electrodes 521a to 521i with an electroluminescence layer interposed therebetween are formed so as to be in contact with each other to be electrically connected to each other.

In FIG. 31A, unlike FIG. 30A or 30B where the opening to the wire is formed continuously for the pixels arranged in parallel, a connection region to the wire is provided by, in one pixel per plural pixels, reducing the area of the one pixel. In FIG. 31A, in the first electrodes 521d and 521e which are pixels not provided with the connection regions to the wire, the aperture ratio can be improved since an opening portion of the insulating layer 523 can be widely provided and the pixel region can be widened. Furthermore, in the case where the display colors of the pixels are red (R), green (G), and blue (B) (or may also be red (R), green (G), blue (B), and white (W)), the pixel size can be set as appropriate depending on the luminance or lifetime of each display color of the pixels, thereby well-balanced precise display can be performed.

Figure 31B:
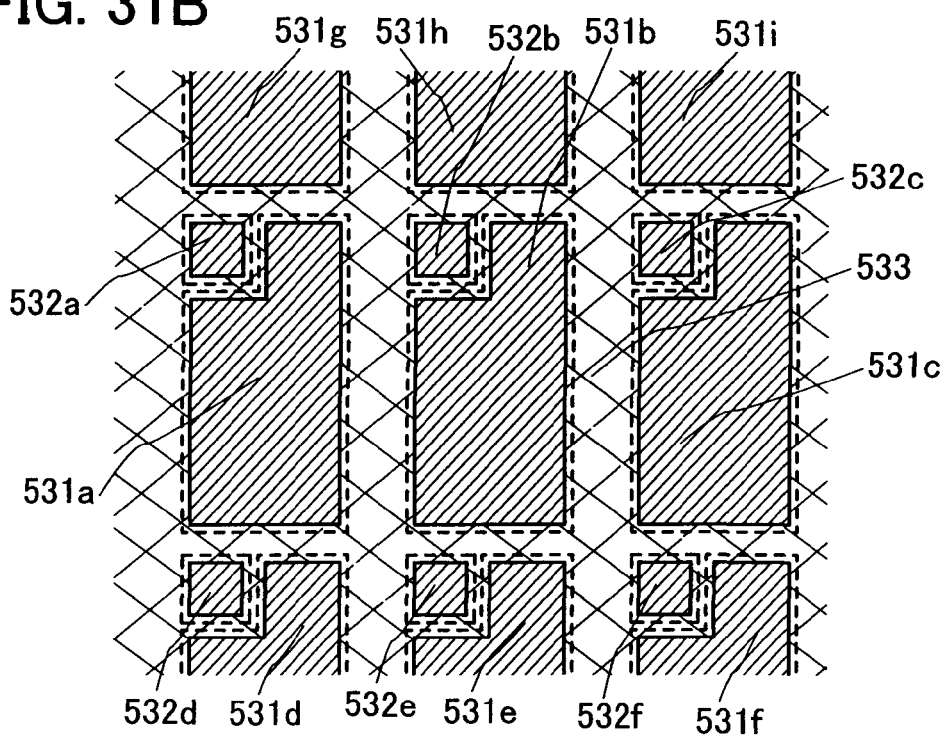

In FIG. 31B, first electrodes 531a to 531i of light-emitting elements for forming pixels are disposed contiguously in vertical and horizontal directions, and an insulating layer 533 which functions as a partition wall is formed around the first electrodes of the pixels. Openings of the insulating layer 523 are formed in forming portions of the first electrodes 531a and 531f respectively so that wires 532a to 532f are exposed. The wires 532a to 532f, and a second electrode which is formed over the first electrodes 531a to 531i with an electroluminescence layer interposed therebetween are formed so as to be in contact with each other to be electrically connected to each other. In this manner, a structure in which the connection region to the wire is provided per first electrode for forming the pixel may also be employed.

Figure 32A:
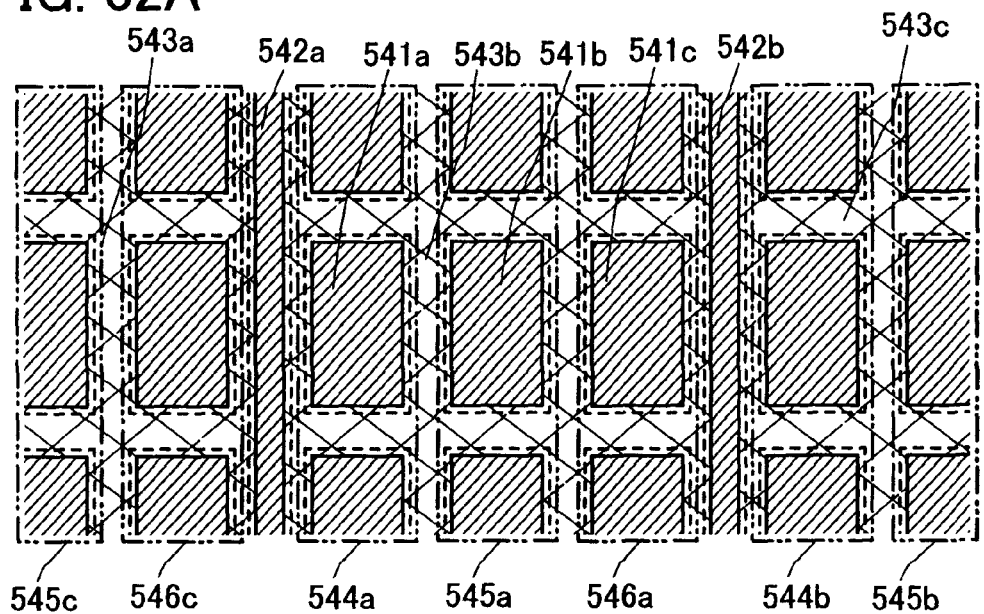
FIGS. 32A and 32B are top views for showing a display device of the present invention.

In FIG. 32A, first electrodes 541a to 541c of light-emitting elements for forming pixels are disposed contiguously in vertical and horizontal directions, and insulating layers 543a to 542c each of which functions as a partition wall are formed around the first electrodes of the pixels. The first electrodes of the pixels are arranged longitudinally in plural number, and are adjacent to pixel regions 545c, 546c, 544a, 545a, 546a, 544b, and 545b, respectively. An opening of the insulating layer is formed between the pixel regions 545c and 546c so that a wire 542a is exposed. Similarly, an opening of the insulating layer is formed between the pixel regions 546a and 544b so that a wire 542b is exposed. The wires 542a and 542b, and a second electrode which is formed over the first electrodes in the pixel regions with an electroluminescence layer interposed therebetween are formed so as to be in contact with each other to be electrically connected to each other.

In the structure of FIG. 32A, unlike FIG. 30A where the wire is formed so as to divide the pixels per column, the connection region between the second electrode and the wire is provided per plural pixel regions having plural pixels. FIG. 32A shows a structure of a display device for performing RGB color display; display is performed in the pixel regions 544a, 545a, and 546a with display colors of R, G, and B, respectively. Therefore, the opening of the insulating layer is provided per three colors of RGB in this example. Of course, the opening of the insulating layer may be provided per four colors of RGBW in the case where display is performed with RGBW.

Figure 32B:
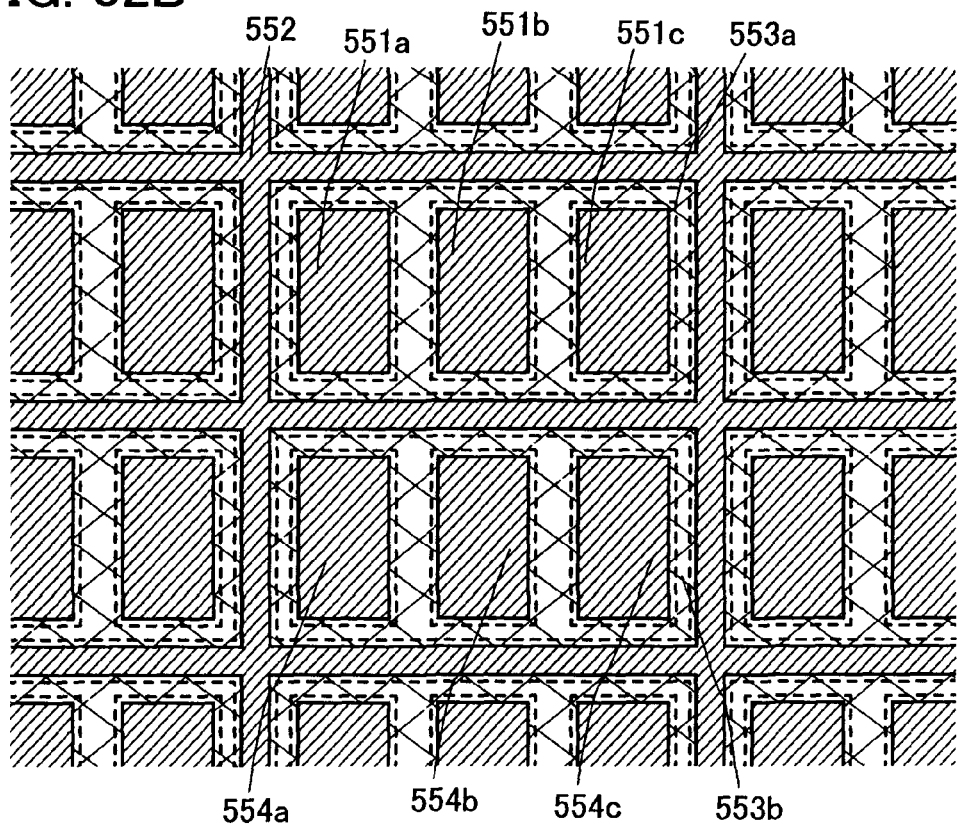

FIG. 32B shows an example in which an opening is provided in the insulating layer which is a partition wall also in the horizontal direction to form a connection region between the second electrode and the wire. An insulating layer 553a is formed so as to surround first electrodes 551a to 551c of light-emitting elements of pixels, and so as to surround the insulating layer 553a, an opening of the insulating layer is formed to expose a wire 552. Similarly, an insulating layer 553b is formed so as to surround first electrodes 554a to 554c of light-emitting elements of pixels, and so as to surround the insulating layer 553b, an opening of the insulating layer is formed to expose the wire 552. The wire 552 which is formed so as to divide pixels per three pixels (which is in the case of RGB, or per four pixels in the case of RGBW) in a reticular pattern, and a second electrode which is formed over the first electrodes in the pixel regions with an electroluminescence layer interposed therebetween are formed so as to be in contact with each other to be electrically connected to each other. As described above, the connection between the second electrode and the wire can be performed with an arbitral structure, and the pixel structure is not limited to this embodiment mode. Alignment of the pixels may be any one of the following arrangements: a stripe arrangement in which pixels corresponding to red, green, and blue are arranged in stripes; a delta arrangement in which the pixels are shifted by a half pitch per one line; and a mosaic arrangement in which sub-pixels corresponding to red, green, and blue are arranged obliquely. The stripe arrangement which is suitable for displaying a line, a figure, text, and the like is preferably applied to a monitor. The mosaic arrangement which can provide a more natural image than the stripe arrangement is preferably applied to a television device and the like. In addition, the delta arrangement which can also provide a natural image display is preferably applied to a television device and the like.

If the number of wires which shut out light emitted from the light-emitting element within the pixel is large, aperture ratio of the pixel is reduced in a bottom emission or dual emission display device. In the present invention, since the light-emitting element 104 and the switch 102 (transistor 152) are connected in common to the same wire instead of being connected to different wires each maintaining at a certain potential, a wire is not necessarily provided in plural number within a pixel. Therefore, the number of wires within the pixel is reduced and the aperture ratio of the pixel can be improved.

Further, since dense disposition of wires can be prevented and the wire structure does not become complex and dense in this structure, the process does not become complex. Therefore, shape defects by a complex process, pattern shape, or the like can be prevented, and a yield is improved. Accordingly, a highly reliable display device can be manufactured at a low cost with high productivity.

Embodiment Mode 2

A pixel configuration which is different from the above embodiment mode will be described using FIG. 4A.

A pixel includes transistors 8010 to 8015, capacitors 8016 and 8017, and a light-emitting element 8000. According to this pixel, one of a source and a drain of the transistor 8010 and one of a first electrode and a second electrode of the light-emitting element 8000 are connected to the same wire 8009.

In the pixel shown in FIG. 4A, the transistor 8012 and the capacitors 8016 and 8017 correspond to the compensating circuit 106 in FIG. 1B, and the transistors 8013 and 8015 correspond to the controlling circuit 105a in FIG. 1B.

ON/OFF of the transistors 8010 to 8013 and 8015 are controlled by signals inputted though wires 8003 to 8006. Light emission/non-light emission of the light-emitting element 8000 is controlled by a video signal inputted though a wire 8001. Further, a power source is supplied from a wire 8002 maintained at a certain potential to the above pixel. Note that the transistors included in the above pixel may be either n-channel transistors or p-channel transistors.

Embodiment Mode 3

A pixel configuration which is different from the above embodiment mode will be described using FIG. 4B.

A pixel includes transistors 8110 to 8115, a capacitor 8116, and a light-emitting element 8100. The pixel may further include a capacitor 8117. According to this pixel, one of a source and a drain of the transistor 8110 and one of a first electrode and a second electrode of the light-emitting element 8100 are connected to the same wire 8109.

Figure 4B:
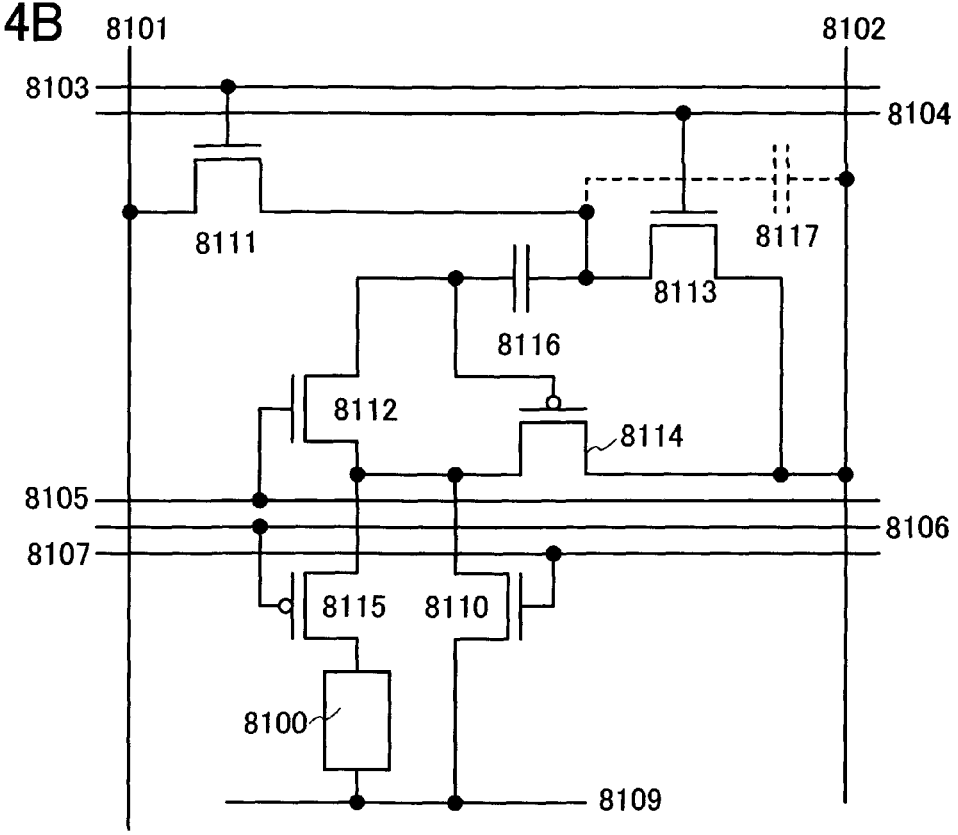

In the pixel shown in FIG. 4B, the transistors 8112 and 8113 and the capacitors 8116 and 8117 correspond to the compensating circuit 106 in FIG. 1B, and the transistor 8115 corresponds to the controlling circuit 105*b* in FIG. 1B.

ON/OFF of the transistors 8110 to 8113 and 8115 are controlled by signals inputted though wires 8103 to 8106. Light emission/non-light emission of the light-emitting element 8100 is controlled by a video signal inputted though a wire 8101. Further, a power source is supplied from a wire 8102 maintained at a certain potential to the above pixel. Note that the transistors included in the above pixel may be either n-channel transistors or p-channel transistors.

Embodiment Mode 4

A pixel configuration which is different from the above embodiment mode will be described using FIG. 5A.

A pixel includes transistors 8060 to 8064, a capacitor 8065, and a light-emitting element 8050. The pixel may further include a capacitor 8066. According to this pixel, one of a source and a drain of the transistor 8060 and one of a first electrode and a second electrode of the light-emitting element 8050 are connected to the same wire 8059.

Figure 5A:
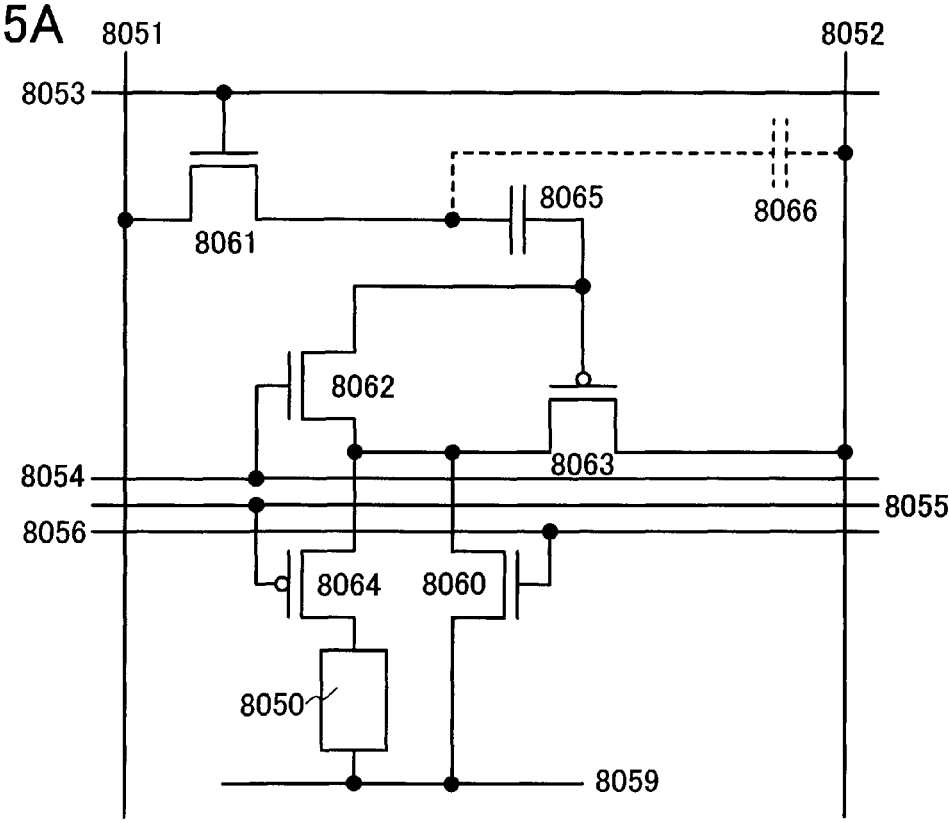
FIGS. 5A and 5B are circuit diagrams for showing a pixel configuration applicable to a display device of the present invention.

In the pixel shown in FIG. 5A, the transistor 8062 and the capacitors 8050 and 8066 correspond to the compensating circuit 106 in FIG. 1B, and the transistor 8064 corresponds to the controlling circuit 105*b* in FIG. 1B.

ON/OFF of the transistors 8060 to 8062 and 8064 are controlled by signals inputted though wires 8053 to 8056. Light emission/non-light emission of the light-emitting element 8050 is controlled by a video signal inputted though a wire 8051. Further, a power source is supplied from a wire 8052 maintained at a certain potential to the above pixel. Note that the transistors included in the above pixel may be either n-channel transistors or p-channel transistors.

Embodiment Mode 5

A pixel configuration which is different from the above embodiment mode will be described using FIG. 5B.

A pixel includes transistors 8160 to 8164, a capacitor 8165, and a light-emitting element 8150. The pixel may further include a capacitor 8166. According to this pixel, one of a source and a drain of the transistor 8160 and one of a first electrode and a second electrode of the light-emitting element 8150 are connected to the same wire 8159.

Figure 5B:
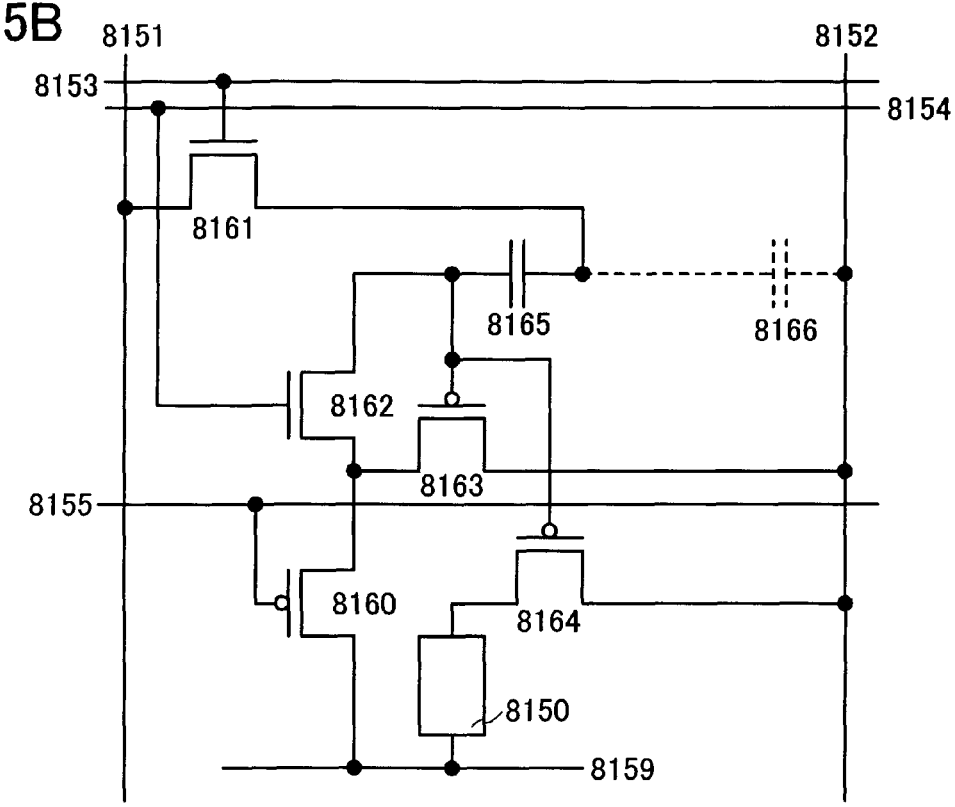

In the pixel shown in FIG. 5B, the transistors 8162 and 8163 and the capacitors 8165 and 8166 correspond to the compensating circuit 106 in FIG. 1B.

ON/OFF of the transistors 8160 to 8162 are controlled by signals inputted though wires 8153 to 8155. Light emission/non-light emission of the light-emitting element 8150 is controlled by a video signal inputted though a wire 8151. Further, a power source is supplied from a wire 8152 maintained at a certain potential to the above pixel. Note that the transistors included in the above pixel may be either n-channel transistors or p-channel transistors.

Embodiment Mode 6

A pixel configuration which is different from the above embodiment mode will be described using FIG. 6A.

A pixel includes transistors 8210 to 8215, a capacitor 8216, and a light-emitting element 8200. The pixel may further include a capacitor 8217. According to this pixel, one of a source and a drain of the transistor 8210 and one of a first electrode and a second electrode of the light-emitting element 8200 are connected to the same wire 8209.

Figure 6A:
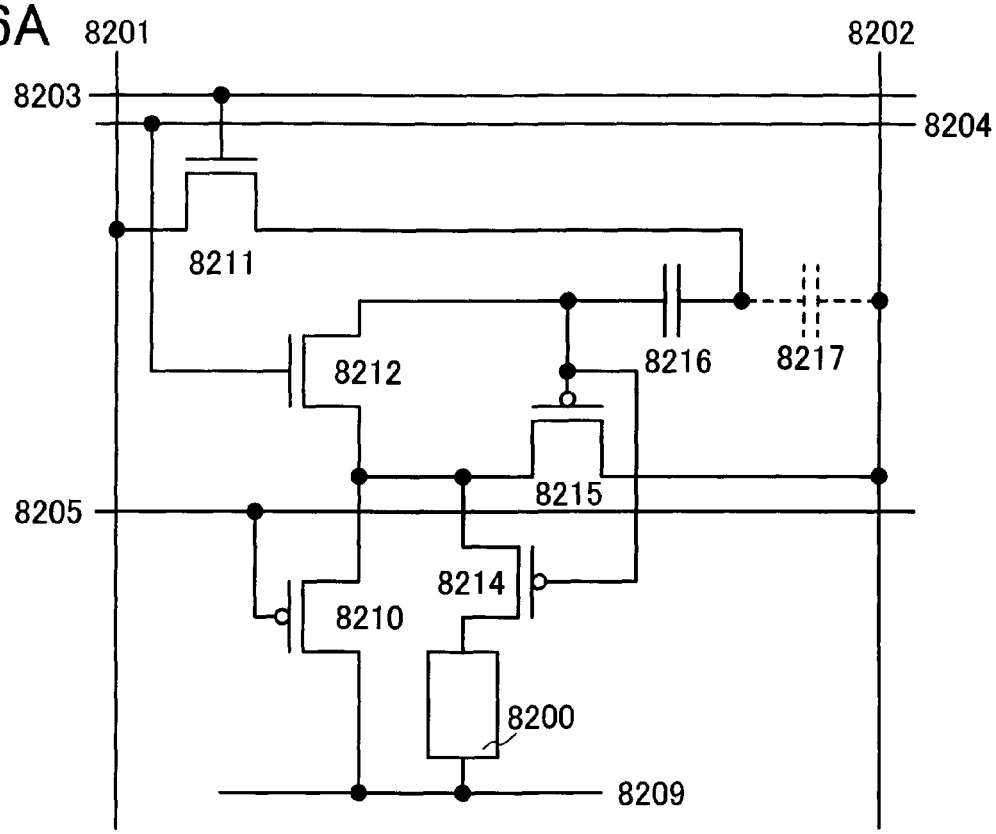
FIGS. 6A and 6B are circuit diagrams for showing a pixel configuration applicable to a display device of the present invention.

In the pixel shown in FIG. 6A, the transistor 8212 and the capacitors 8216 and 8217 correspond to the compensating circuit 106 in FIG. 1B, and the transistor 8214 corresponds to the controlling circuit 105*b* in FIG. 1B.

ON/OFF of the transistors 8210 to 8213 are controlled by signals inputted though wires 8203 to 8205. Light emission/non-light emission of the light-emitting element 8200 is controlled by a video signal inputted though a wire 8201. Further, a power source is supplied from a wire 8202 maintained at a certain potential to the above pixel. Note that the transistors included in the above pixel may be either n-channel transistors or p-channel transistors.

Embodiment Mode 7

A pixel configuration which is different from the above embodiment mode will be described using FIG. 6B.

A pixel includes transistors 8260 to 8262, a capacitor 8263, and a light-emitting element 8250. According to this pixel, one of a source and a drain of the transistor 8260 and one of a first electrode and a second electrode of the light-emitting element 8250 are connected to the same wire 8259.

Figure 6B:
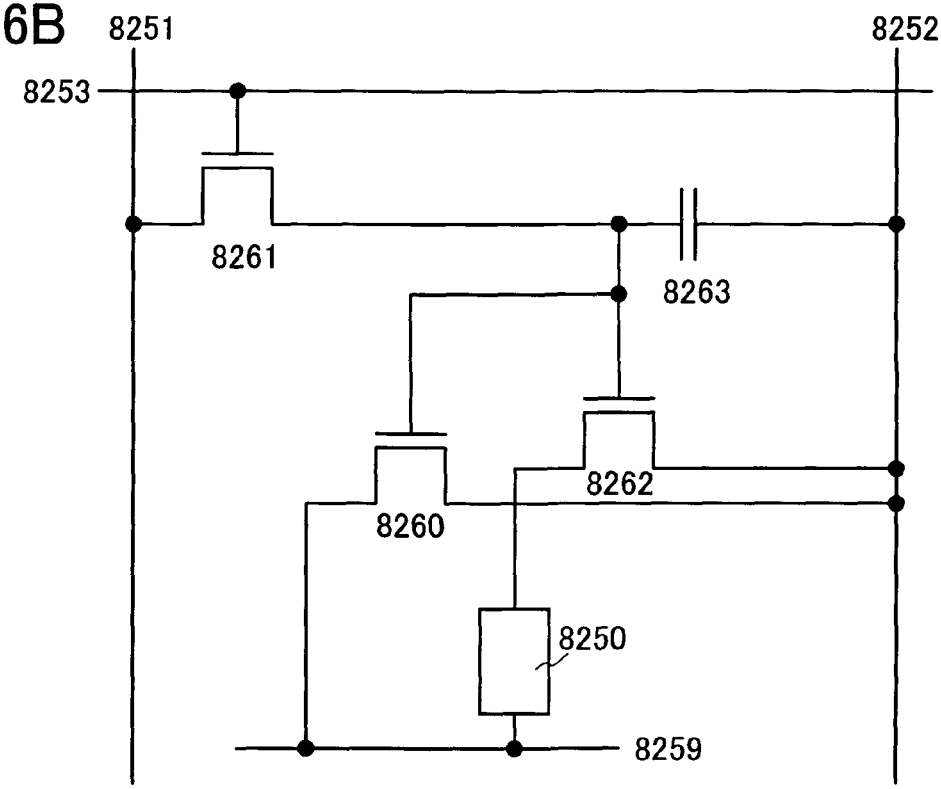

In the pixel shown in FIG. 6B, the capacitor 8263 corresponds to the compensating circuit 106 in FIG. 1B.

ON/OFF of the transistor 8261 is controlled by a signal inputted though a wire 8253. Light emission/non-light emission of the light-emitting element 8250 is controlled by a video signal inputted though a wire 8251. Further, a power source is supplied from a wire 8252 maintained at a certain potential to the above pixel. Note that the transistors included in the above pixel may be either n-channel transistors or p-channel transistors.

Embodiment Mode 8

A pixel configuration which is different from the above embodiment mode will be described using FIG. 7A.

A pixel includes transistors 8810 to 8814, capacitors 8815 and 8816, and a light-emitting element 8800. According to this pixel, one of a source and a drain of the transistor 8810 and one of a first electrode and a second electrode of the light-emitting element 8800 are connected to the same wire 8809.

Figure 7A:
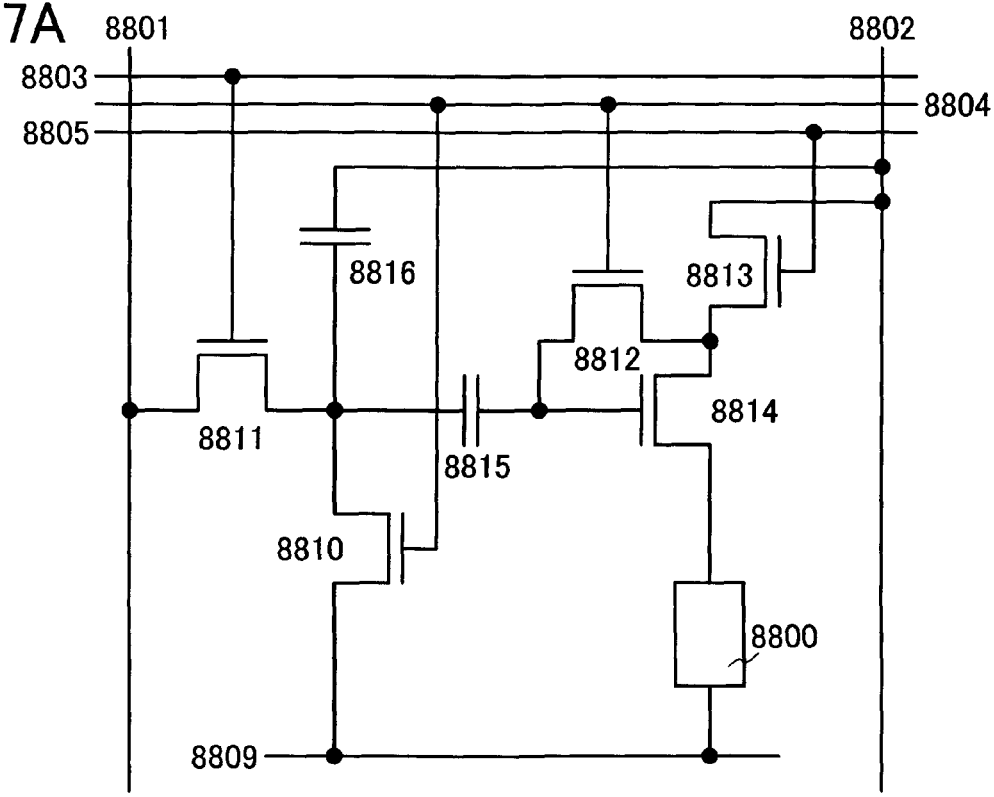
FIGS. 7A and 7B are circuit diagrams for showing a pixel configuration applicable to a display device of the present invention.

In the pixel shown in FIG. 7A, the transistor 8812 and the capacitors 8815 and 8816 correspond to the compensating circuit 106 in FIG. 1B, and the transistor 8813 corresponds to the controlling circuit 105*a* in FIG. 1B.

ON/OFF of the transistors 8810 to 8813 are controlled by signals inputted though wires 8803 to 8805. Light emission/non-light emission of the light-emitting element 8800 is controlled by a video signal inputted though a wire 8801. Further, a power source is supplied from a wire 8802 maintained at a certain potential to the above pixel. Note that the transistors included in the above pixel may be either n-channel transistors or p-channel transistors.

Embodiment Mode 9

A pixel configuration which is different from the above embodiment mode will be described using FIG. 7B.

A pixel includes transistors 8360 to 8362, a capacitor 8363, and a light-emitting element 8350. According to this pixel, one of a source and a drain of the transistor 8360 and one of a first electrode and a second electrode of the light-emitting element 8350 are connected to the same wire 8359.

Figure 7B:
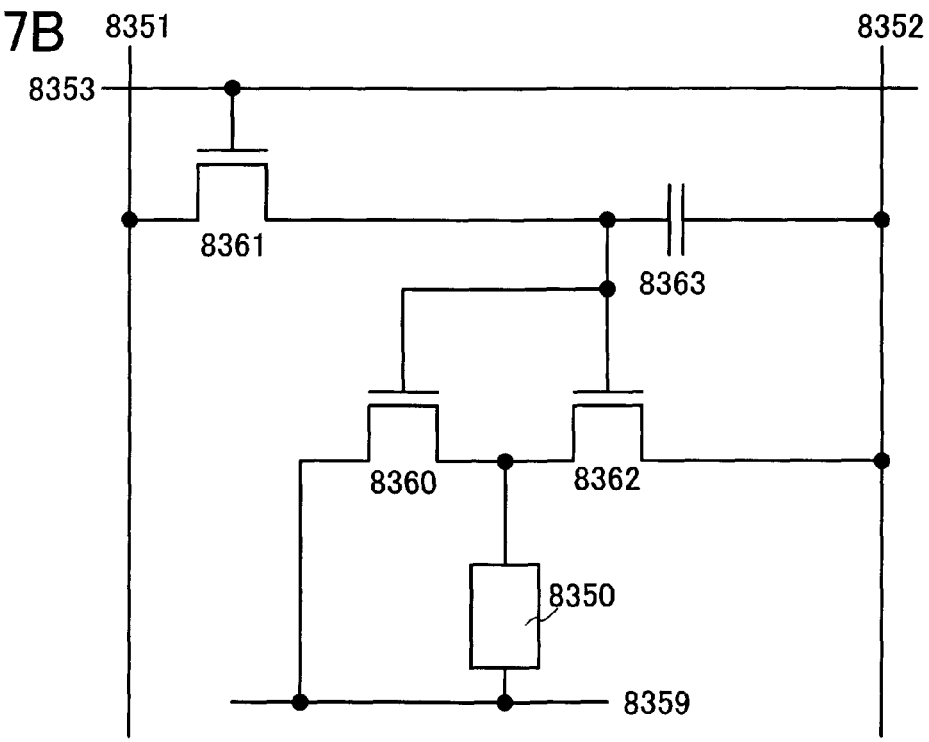

In the pixel shown in FIG. 7B, the capacitor 8363 corresponds to the compensating circuit 106 in FIG. 1B.

ON/OFF of the transistor 8361 is controlled by a signal inputted though a wire 8353. Light emission/non-light emission of the light-emitting element 8350 is controlled by a video signal inputted though a wire 8351. Further, a power source is supplied from a wire 8352 maintained at a certain potential to the above pixel. Note that the transistors included in the above pixel may be either n-channel transistors or p-channel transistors.

Embodiment Mode 10

A pixel configuration which is different from the above embodiment mode will be described using FIG. 8A.

A pixel includes transistors 8410, 8411, 8413, and 8414, a capacitor 8416, and a light-emitting element 8400. According to this pixel, one of a source and a drain of the transistor 8410 and one of a first electrode and a second electrode of the light-emitting element 8400 are connected to the same wire 8409.

Figure 8A:
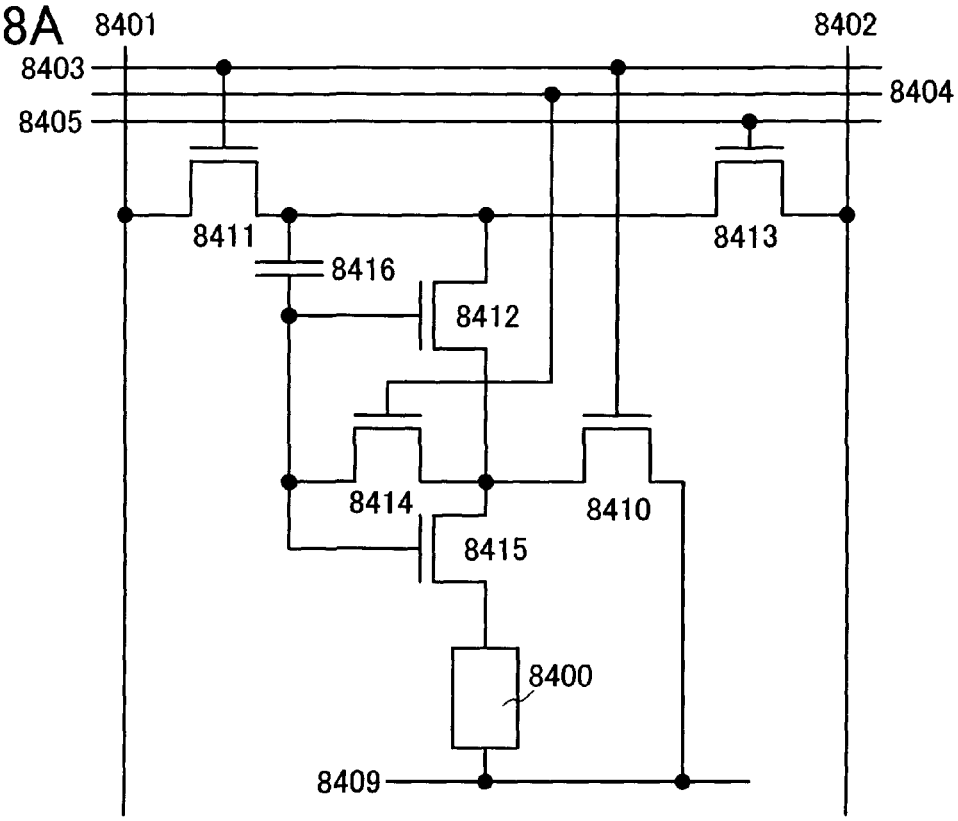
FIGS. 8A and 8B are circuit diagrams for showing a pixel configuration applicable to a display device of the present invention.

In the pixel shown in FIG. 8A, the transistor 8414 and the capacitor 8416 correspond to the compensating circuit 106 in FIG. 1B, the transistor 8413 corresponds to the controlling circuit 105*a* in FIG. 1B, and the transistor 8415 corresponds to the controlling circuit 105*b* in FIG. 1B.

ON/OFF of the transistors 8410 to 8415 are controlled by signals inputted though wires 8403 to 8405. Light emission/non-light emission of the light-emitting element 8400 is controlled by a video signal inputted though a wire 8401. Further, a power source is supplied from a wire 8402 maintained at a certain potential to the above pixel. Note that the transistors included in the above pixel may be either n-channel transistors or p-channel transistors.

Embodiment Mode 11

A pixel configuration which is different from the above embodiment mode will be described using FIG. 8B.

A pixel includes transistors 8460 to 8464, a capacitor 8465, and a light-emitting element 8450. According to this pixel, one of a source and a drain of the transistor 8460 and one of a first electrode and a second electrode of the light-emitting element 8450 are connected to the same wire 8459.

Figure 8B:
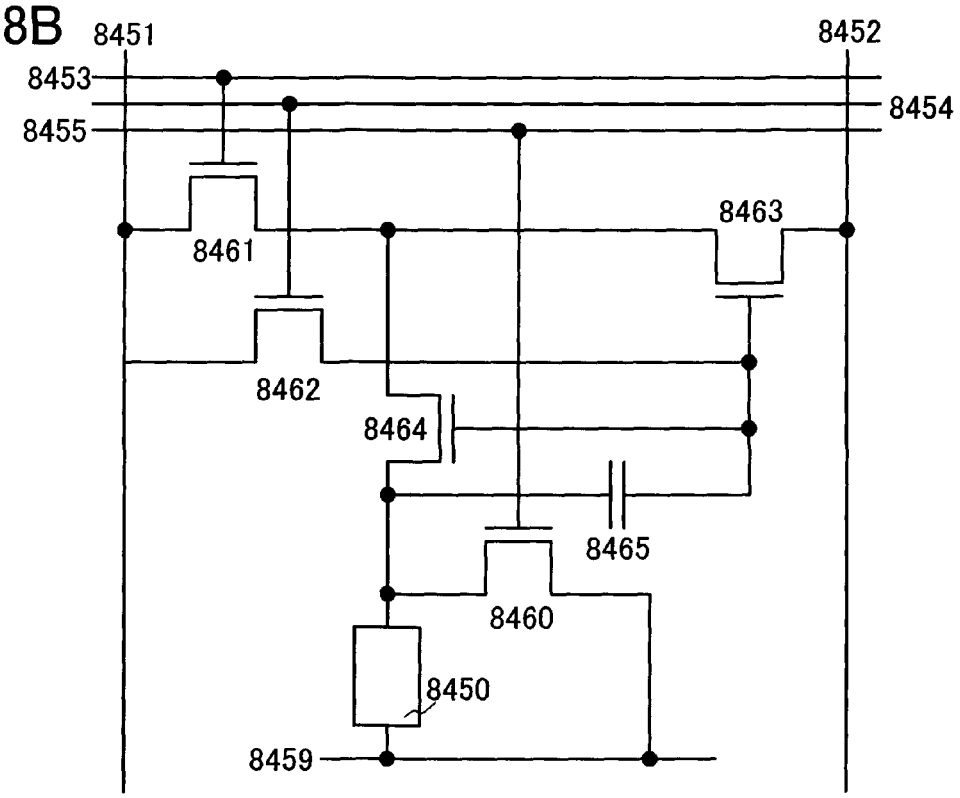

In the pixel shown in FIG. 8B, the transistor 8462 and the capacitor 8465 correspond to the compensating circuit 106 in FIG. 1B, the transistor 8463 corresponds to the controlling circuit 105*a* in FIG. 1B.

ON/OFF of the transistors 8460 to 8462 are controlled by signals inputted though wires 8453 to 8455. Light emission/non-light emission of the light-emitting element 8450 is controlled by a video signal inputted though a wire 8451. Further, a power source is supplied from a wire 8452 maintained at a certain potential to the above pixel. Note that the transistors included in the above pixel may be either n-channel transistors or p-channel transistors.

Embodiment Mode 12

A pixel configuration which is different from the above embodiment mode will be described using FIG. 9A.

A pixel includes transistors 8510 to 8517, a capacitor 8518, and a light-emitting element 8500. According to this pixel, one of a source and a drain of the transistor 8510 and one of a first electrode and a second electrode of the light-emitting element 8500 are connected to the same wire 8509.

Figure 9A:
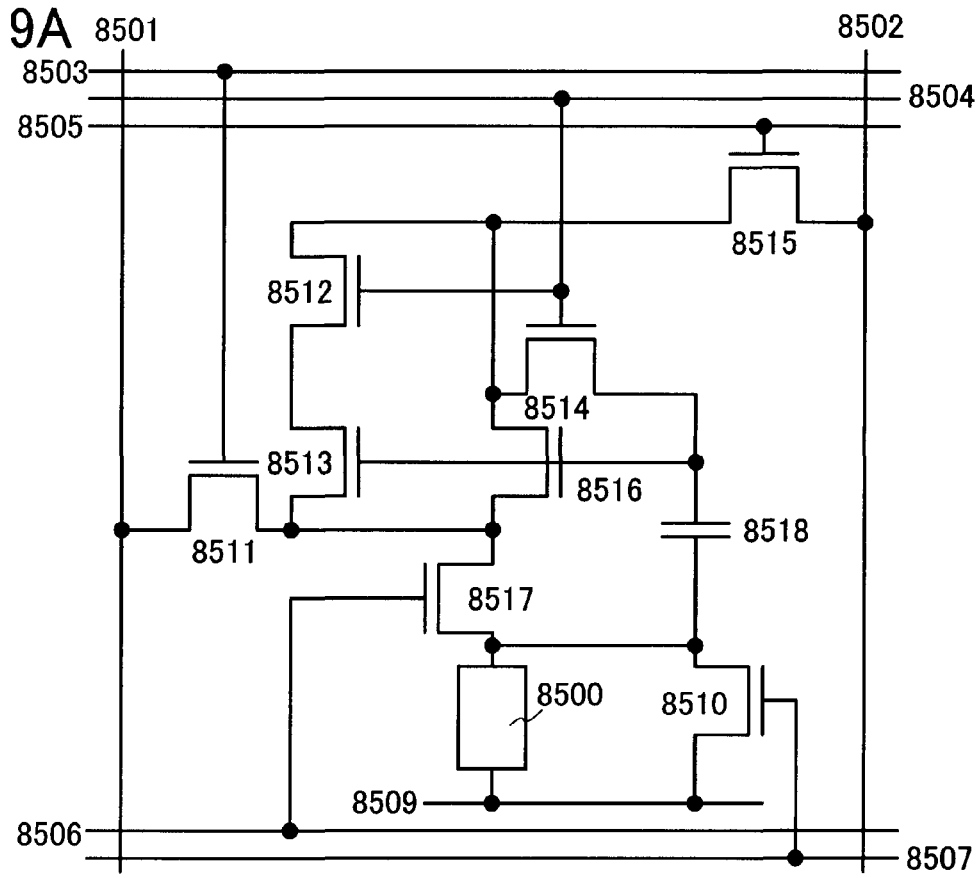
FIGS. 9A and 9B are circuit diagrams for showing a pixel configuration applicable to a display device of the present invention.

In the pixel shown in FIG. 9A, the transistors 8512 to 8514 and the capacitor 8518 correspond to the compensating circuit 106 in FIG. 1B, the transistor 8515 corresponds to the controlling circuit 105*a* in FIG. 1B, and the transistor 8517 corresponds to the controlling circuit 105*b* in FIG. 1B.

ON/OFF of the transistors 8510 to 8512, 8514, 8515, and 8517 are controlled by signals inputted though wires 8503 to 8507. Light emission/non-light emission of the light-emitting element 8500 is controlled by a video signal inputted though a wire 8501. Further, a power source is supplied from a wire 8502 maintained at a certain potential to the above pixel. Note that the transistors included in the above pixel may be either n-channel transistors or p-channel transistors.

Embodiment Mode 13

A pixel configuration which is different from the above embodiment mode will be described using FIG. 9B.

A pixel includes transistors 8560 to 8562, a capacitor 8563, and a light-emitting element 8550. According to this pixel, one of a source and a drain of the transistor 8560 and one of a first electrode and a second electrode of the light-emitting element 8550 are connected to the same wire 8559.

Figure 9B:
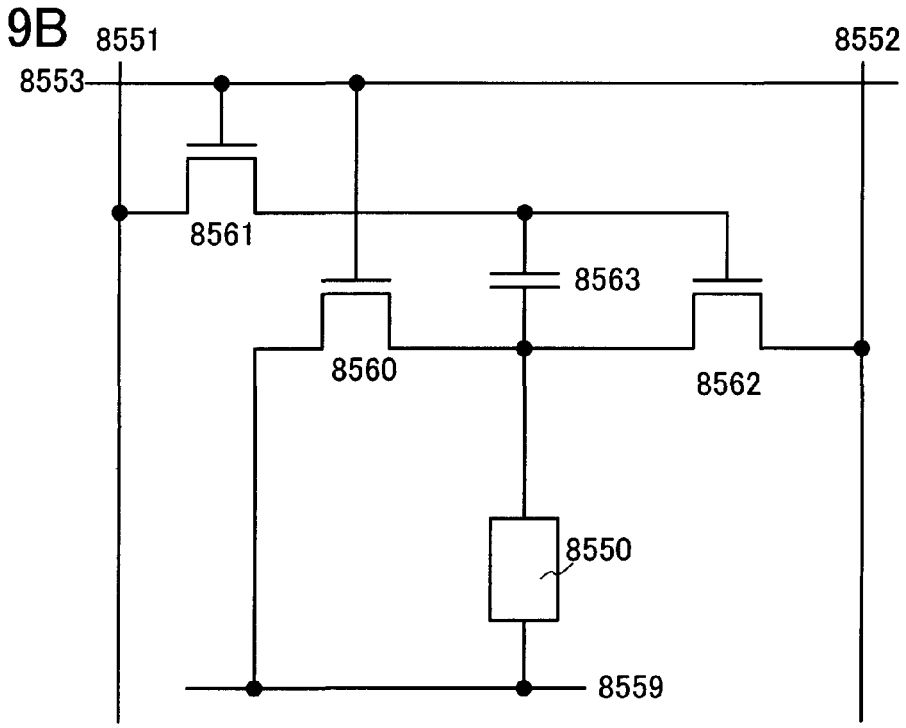

In the pixel shown in FIG. 9B, the capacitor 8563 corresponds to the compensating circuit 106 in FIG. 1B.

ON/OFF of the transistors 8560 and 8561 are controlled by a signal inputted though a wire 8553. Light emission/non-light emission of the light-emitting element 8550 is controlled by a video signal inputted though a wire 8551. Further, a power source is supplied from a wire 8552 maintained at a certain potential to the above pixel. Note that the transistors included in the above pixel may be either n-channel transistors or p-channel transistors.

Embodiment Mode 14

A pixel configuration which is different from the above embodiment mode will be described using FIG. 10A.

A pixel includes switches 8610 to 8615, transistors 8617 and 8618, a capacitor 8619, and a light-emitting element 8600. According to this pixel, one of a source and a drain of the switch 8610 and one of a first electrode and a second electrode of the light-emitting element 8600 are connected to the same wire 8609.

Figure 10A:
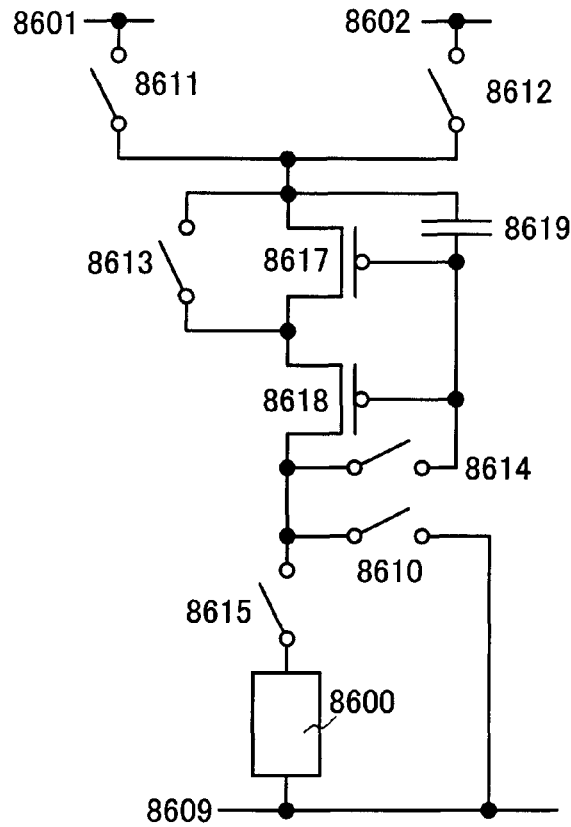
FIGS. 10A and 10B are circuit diagrams for showing a pixel configuration applicable to a display device of the present invention.

In the pixel shown in FIG. 10A, the transistor 8617, the switches 8613 and 8614, and the capacitor 8619 correspond to the compensating circuit 106 in FIG. 1A, the switch 8612 corresponds to the controlling circuit 105*a* in FIG. 1A, and the switch 8615 corresponds to the controlling circuit 105*b* in FIG. 1A.

One terminal of the switch 8611 is connected to a wire 8601, and one terminal of the switch 8612 is connected to a wire 8602. Note that the transistors included in the above pixel may be either n-channel transistors or p-channel transistors.

Embodiment Mode 15

A pixel configuration which is different from the above embodiment mode will be described using FIG. 10B.

A pixel includes transistors 8660 to 8664, capacitors 8665 and 8666, and a light-emitting element 8650. The pixel may further include a capacitor 8667. According to this pixel, one of a source and a drain of the transistor 8660 and one of a first electrode and a second electrode of the light-emitting element 8650 are connected to the same wire 8659.

Figure 10B:
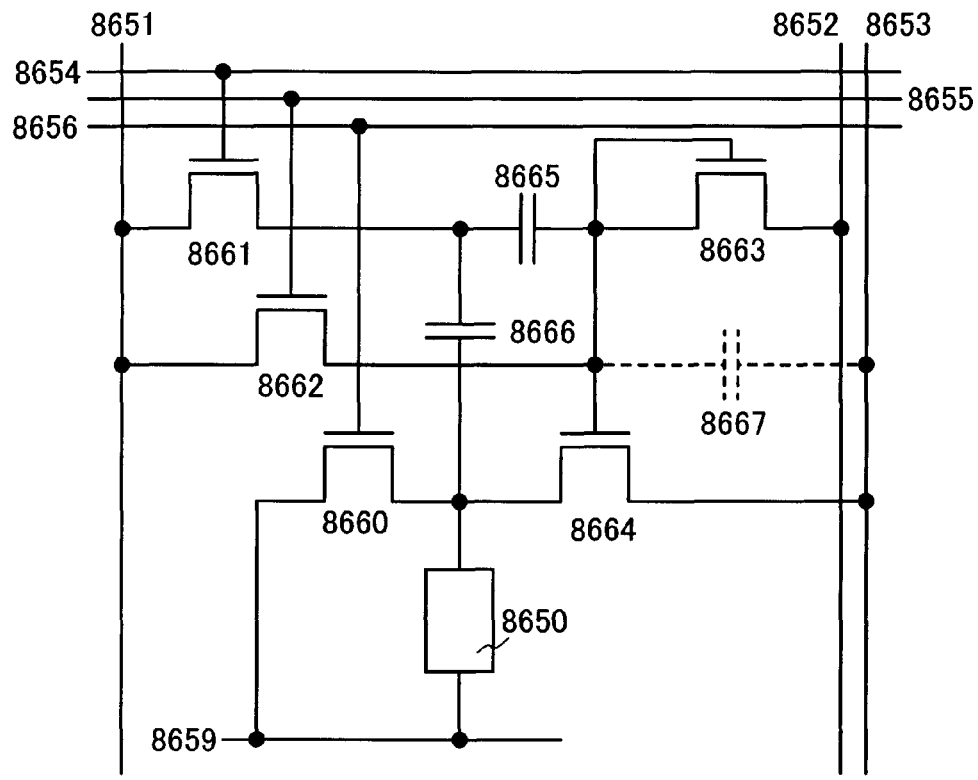

In the pixel shown in FIG. 10B, the transistors 8662 and 8663 and the capacitors 8665 to 8667 correspond to the compensating circuit 106 in FIG. 1B.

ON/OFF of the transistors 8660 to 8662 are controlled by signals inputted though wires 8654 to 8656. Light emission/non-light emission of the light-emitting element 8650 is controlled by a video signal inputted though a wire 8651. Further, a power source is supplied from wires 8652 and 8653 each maintained at a certain potential to the above pixel. Note that the transistors included in the above pixel may be either n-channel transistors or p-channel transistors.

Embodiment Mode 16

A pixel configuration which is different from the above embodiment mode will be described using FIG. 11A.

A pixel includes transistors 8710 to 8715, a capacitor 8716, and a light-emitting element 8700. According to this pixel, one of a source and a drain of the transistor 8710 and one of a first electrode and a second electrode of the light-emitting element 8700 are connected to the same wire 8709.

Figure 11A:
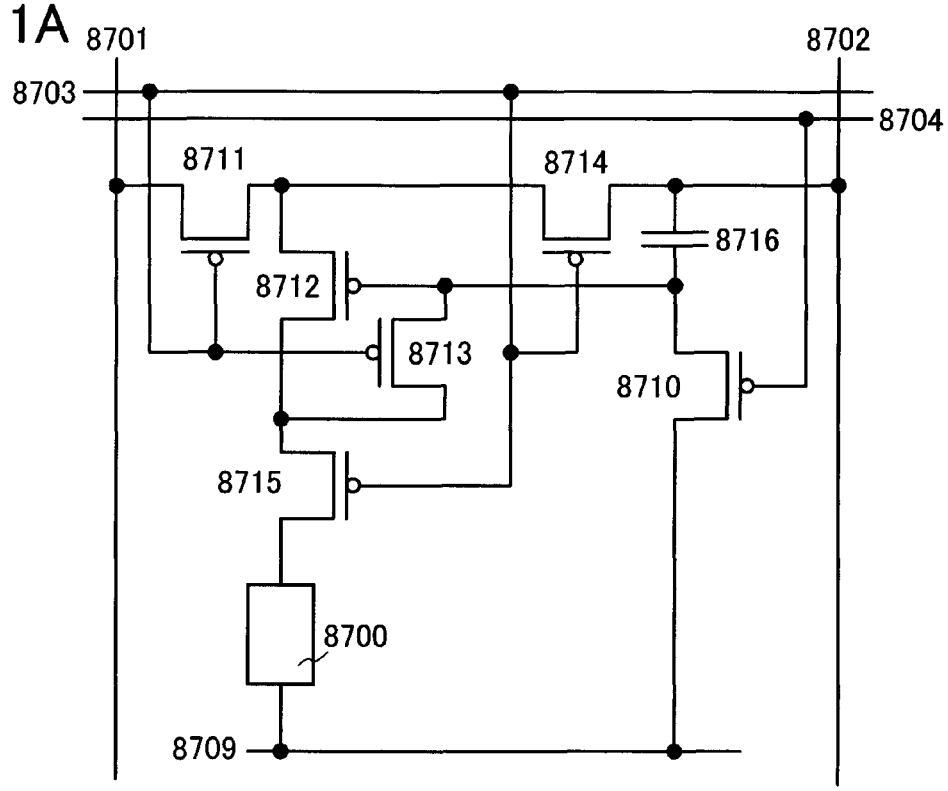
FIGS. 11A and 11B are circuit diagrams for showing a pixel configuration applicable to a display device of the present invention.

In the pixel shown in FIG. 11A, the transistor 8713 and the capacitor 8716 correspond to the compensating circuit 106 in FIG. 1B, the transistor 8714 corresponds to the controlling circuit 105a in FIG. 1B, and the transistor 8715 corresponds to the controlling circuit 105b in FIG. 1B.

ON/OFF of the transistors 8710 and 8711, and 8713 to 8715 are controlled by signals inputted though wires 8703 and 8704. Light emission/non-light emission of the light-emitting element 8700 is controlled by a video signal inputted though a wire 8701. Further, a power source is supplied from a wire 8702 maintained at a certain potential to the above pixel. Note that the transistors included in the above pixel may be either n-channel transistors or p-channel transistors.

Embodiment Mode 17

A pixel configuration which is different from the above embodiment mode will be described using FIG. 11B.

A pixel includes transistors 8760 to 8764, a capacitor 8765, and a light-emitting element 8750. According to this pixel, one of a source and a drain of the transistor 8760 and one of a first electrode and a second electrode of the light-emitting element 8750 are connected to the same wire 8759.

Figure 11B:
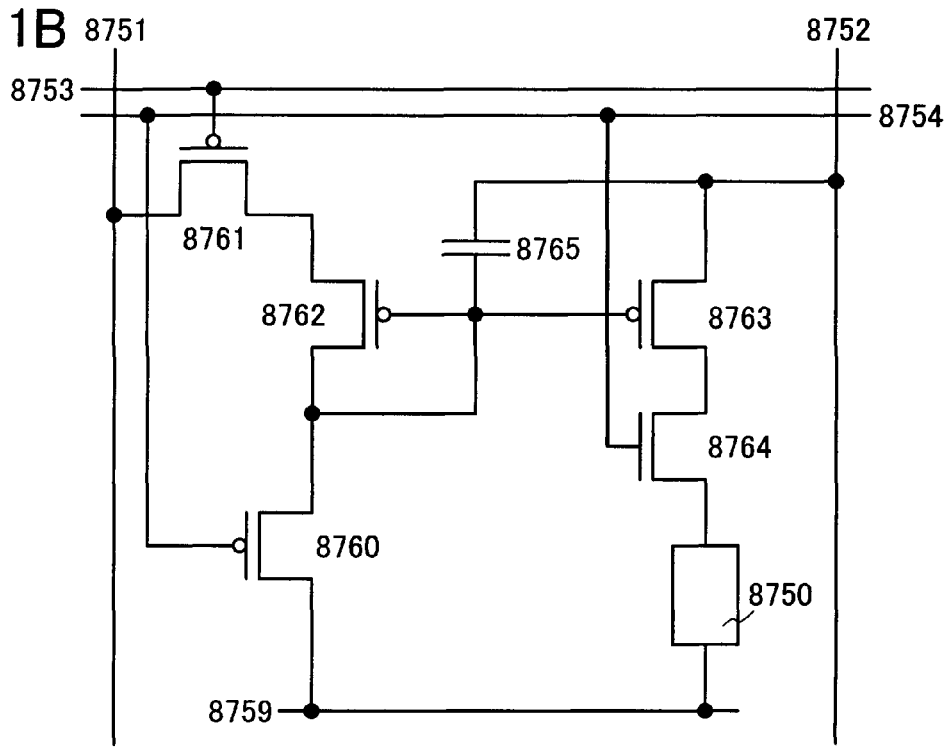

In the pixel shown in FIG. 11B, the transistor 8762 and the capacitor 8765 correspond to the compensating circuit 106 in FIG. 1B, and the transistor 8764 corresponds to the controlling circuit 105b in FIG. 1B.

ON/OFF of the transistors 8760, 8761, and 8764 are controlled by signals inputted though wires 8753 and 8754. Light emission/non-light emission of the light-emitting element 8750 is controlled by a video signal inputted though a wire 8751. Further, a power source is supplied from a wire 8752 maintained at a certain potential to the above pixel. Note that the transistors included in the above pixel may be either n-channel transistors or p-channel transistors.

Embodiment Mode 18

In this embodiment mode, a display device to which the present invention is applied will be described using FIGS. 13A and 13B.

FIG. 17A is a top view showing a structure of a display panel in accordance with the present invention, where a pixel portion 2701 in which pixels 2702 are arranged in matrix, a scanning line side input terminal 2703, and a signal line side input terminal 2704 are formed over a substrate 2700 having an insulating surface. The number of pixels may be provided according to various standards: the number of pixels of XGA for RGB full-color display may be 1024×768×3 (RGB), that of UXGA for RGB full-color display may be 1600×1200×3 (RGB), and that corresponding to a full-speck high vision for RGB full-color display may be 1920×1080×3 (RGB).

The pixels 2702 are arranged in matrix by intersecting scanning lines extended from the scanning line side input terminal 2703 with signal lines extended from the signal line side input terminal 2704. Each pixel 2702 is provided with a switching element and a pixel electrode connected to the switching element. A typical example of the switching element is a TFT. A gate electrode side of the TFT is connected to the scanning line, and a source or drain side thereof is connected to the signal line; thereby each pixel can be controlled independently by a signal inputted from outside.

FIG. 17A shows a structure of the display panel in which signals inputted to a scanning line and a signal line are controlled by an external driver circuit. Alternatively, driver ICs 2751 may be mounted on the substrate 2700 by COG (Chip on Glass) as shown in FIG. 18A. Further, the driver ICs may also be mounted by TAB (Tape Automated Bonding) as shown in FIG. 18B. The driver ICs may be that formed over a single crystal semiconductor substrate or may be a circuit which is formed using a TFT over a glass substrate. In FIGS. 18A and 18B, the driver IC 2751 is connected to an FPC 2750.

Further, in the case where a TFT provided in a pixel is formed using a polycrystalline (microcrystalline) semiconductor having high crystallinity, a scanning line side driver circuit 3702 can also be formed over a substrate 3700 as shown in FIG. 17B. In FIG. 18B, reference numeral 3701 denotes a pixel portion, and a signal line side driver circuit is controlled by an external driver circuit similarly to that in FIG. 17A. In the case where a TFT provided in a pixel is formed using a polycrystalline (microcrystalline) semiconductor, a single crystalline semiconductor, or the like with high mobility, a scanning line side driver circuit 4702 and a signal line side driver circuit 4704 can be formed over the same substrate 4700 in FIG. 17C.

Figure 13A:
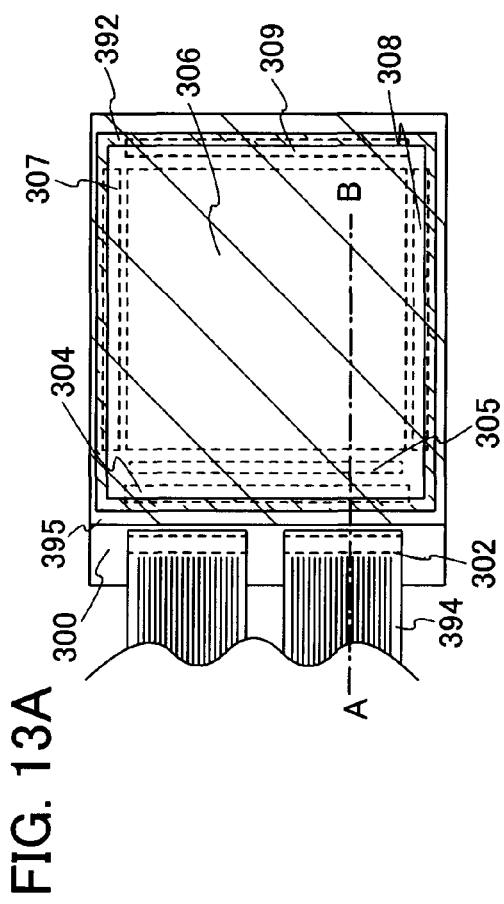
FIGS. 13A and 13B are views for showing a display device of the present invention.
Figure 13B:
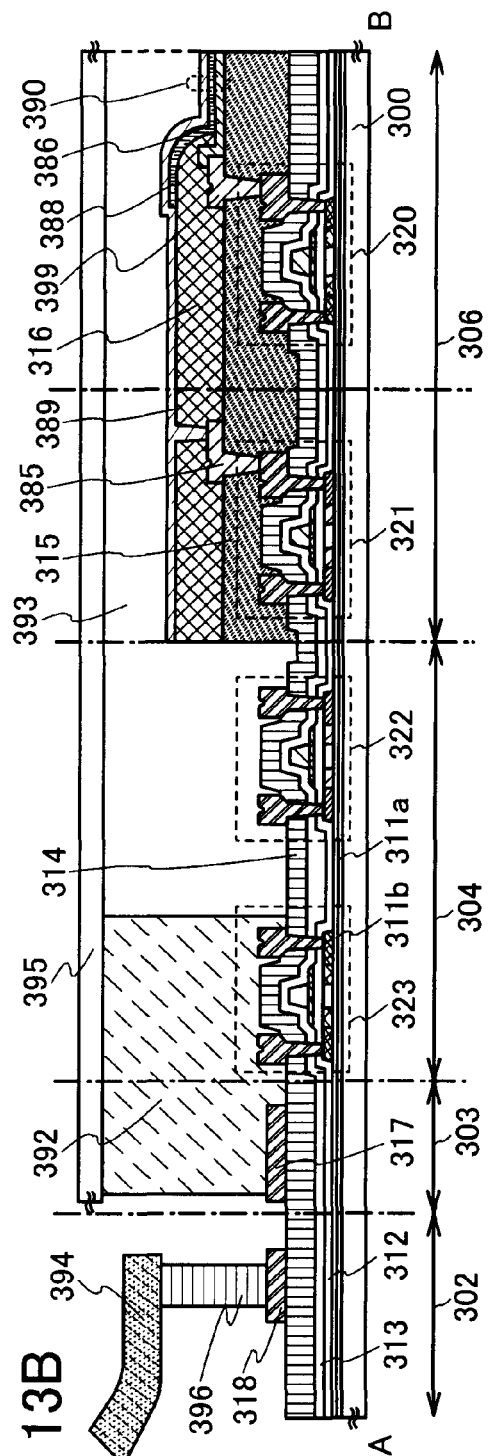

FIG. 13A is a top view of the display device described in this embodiment mode, and a cross-sectional view taken along a line A-B in FIG. 13A is FIG. 13B. The display device in FIGS. 13A and 13B includes an external terminal connection region 302, a seal region 303, a peripheral driver circuit region 304 including a signal line driver circuit, a peripheral driver circuit region 309, a peripheral driver circuit region 307 including a scanning line driver circuit, a peripheral driver circuit region 308, and a connection region 305.

In this embodiment mode, the aforementioned circuits are provided; however, the present invention is not limited to this and an IC chip may be mounted as a peripheral driver circuit by the aforementioned COG or TAB. Moreover, each of a scanning line driver circuit and a signal line driver circuit may be provided in any number.

The display device shown in FIGS. 13A and 13B includes a substrate 300, thin film transistors 320 to 323, a first electrode 386, an electroluminescent layer 388, a second electrode 389, a filling material 393, a sealing material 392, insulating films 1311a and 1311b, a gate insulating layer 312, insulating films 313 and 314, insulating layers 315 and 316, a sealing substrate 395, wiring 385, 399, and 317, a terminal electrode layer 318, an anisotropic conductive layer 396, and an FPC 394. The display device includes the external terminal connection region 302, the seal region 303, the peripheral driver circuit region 304, and a pixel region 306.

Each of the thin film transistors 320 to 323 has: a semiconductor layer including an impurity region functioning as either a source or a drain; the gate insulating layer 312; a gate electrode layer which has a two-layer structure; and a wire which is in contact with the impurity region which is either the source or the drain of the semiconductor layer, to be electrically connected to each other.

The thin film transistor 320 is electrically connected to the first electrode 386 of a light-emitting element 390 via the wire 399 in the pixel region. The second electrode 389 of the light-emitting element 390 is electrically connected to the wire 385 at an opening formed in the insulating layer 316, and a wire connected to a source or a drain of the thin film transistor 321, which is formed in the insulating film 314, and the wire 385 are electrically connected to each other. The wire 385 corresponds to the wire 109 in FIGS. 1A and 1B, and the second electrode 389 of the light-emitting element 390 and the thin film transistor 321 are electrically connected to each other via the wire 385.

If the number of wires which shut out light emitted from the light-emitting element within the pixel is large, aperture ratio of the pixel is reduced in a bottom emission or dual emission display device. In the present invention, since the light-emitting element 390 and the thin film transistor 321 are connected in common to the same wire instead of being connected to different wires each maintaining at a certain potential, a wire is not necessarily provided in plural number within a pixel. Therefore, the number of wires within the pixel is reduced and the aperture ratio of the pixel can be improved.

Further, since dense disposition of wires can be prevented and the wire structure does not become complex and dense in this structure, the process does not become complex. Therefore, shape defects by a complex process, pattern shape, or the like can be prevented, and a yield is improved. Accordingly, a highly reliable display device can be manufactured at a low cost with high productivity.

The substrate 300 may be a glass substrate, a quartz substrate, a silicon substrate, a metal substrate, or a stainless steel substrate having a surface covered with an insulating film. Further, a plastic substrate which can resist a processing temperature of this embodiment mode or a flexible substrate such as a film may be used as well. As the plastic substrate, a substrate formed of PET (polyethylene terephthalate), PEN (polyethylene naphthalate), or PES (polyether sulfonate) can be used, and a synthetic resin such as acrylic can be used as the flexible substrate.

Each of the insulating film 311a which functions as a base film, the insulating film 311b, the gate insulating layer 312, the insulating film 313, the insulating film 314, the insulating layer 315, and the insulating layer 316 can be formed of either an inorganic insulating material or an organic insulating material. For example, an inorganic insulating material such as silicon oxide, silicon nitride, silicon oxynitride, silicon nitride oxide, aluminum oxide, aluminum nitride, or aluminum oxynitride, or the like can be used. Alternatively, acrylic acid or methacrylic acid, a derivative thereof, a heat-resistant polymer such as polyimide, aromatic polyamide, or polybenzimidazole, or siloxane resin can be used. Note that a siloxane resin corresponds to a resin including a Si—O—Si bond. Siloxane has a skeletal structure with a bond of silicon (Si) and oxygen (O). As a substituent, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituents. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin may be used. Further, an organic material such as benzocyclobutene, parylene, flare, or polyimide; a composition material containing a water-soluble homopolymer and a water-soluble copolymer; or the like may be used. Moreover, oxazole resin can also be used, which is, for example, photosensitive polybenzoxazole. Photosensitive polybenzoxazole has a low dielectric constant (a dielectric constant of 2.9 at normal temperature at 1 MHz), high heat resistance (TGA: Thermal Gravity Analysis) thermal decomposition temperature of 550° C. with the rise in temperature at 5° C./min), and a low moisture absorbing rate (0.3% in 24 hours at normal temperature).

Each insulating film (insulating layer) may be either a single-layer or a multi-layer such as two layers or three layers. Preferably, the insulating layer 316, in particular, which functions as a partition wall has a shape in which the radius of curvature is continuously varied, so that coverage of the electroluminescent layer 388 and the second electrode 389 formed over the insulating layer 316 is improved.

Each of the insulating films (insulating layers) and the semiconductor layer included in the thin film transistors 320 to 323 can be formed by sputtering, PVD (Physical Vapor Deposition), CVD (Chemical Vapor Deposition) such as Low-pressure CVD (LPCVD) or plasma CVD, or the like. Further, a method using a liquid material such as a droplet discharge method, a printing method (a method for forming a pattern, such as screen printing or offset printing), or a spin-coating method, a dipping method, a dispenser method, or the like can also be employed.

The semiconductor film (semiconductor layer) included in the thin film transistors 320 to 323 can be formed of the following material: an amorphous semiconductor (hereinafter also referred to as "AS") manufactured by using a semiconductor material gas typified by silane or germane by a vapor phase growth method or sputtering; a polycrystalline semiconductor that is formed by crystallizing the amorphous semiconductor by utilizing light energy or thermal energy; a semiamorphous (also referred to as microcrystal, and hereinafter referred to as "SAS") semiconductor; or the like. The semiconductor layer can be formed by a known method (e.g., sputtering, LPCVD, or plasma CVD).

The SAS has an intermediate structure between an amorphous structure and a crystal structure (including a single crystalline structure and a polycrystalline structure), and a third condition that is stable in free energy, and further includes a crystalline region having a short range order and lattice distortion. The SAS is formed by glow discharge decomposition (plasma CVD) of silicide gas. As for the silicide gas, $Si_2H_6$, $SiH_2Cl_2$, $SiHCl_3$, $SiCl_4$, $SiF_4$, or the like can be used as well as $SiH_4$. Further, $F_2$ or $GeF_4$ may also be mixed. The silicide gas may also be diluted with $H_2$, or a mixture of $H_2$ and one or more of rare gas elements selected from He, Ar, Kr, and Ne. Further alternatively, as the semiconductor layer, a multi-layer of a SAS layer formed from a fluorine-based gas and a SAS layer formed from a hydrogen-based gas may be used.

The amorphous semiconductor is typified by hydrogenated amorphous silicon, and the crystalline semiconductor is typified by polysilicon. Polysilicon includes a so-called high-temperature polysilicon which uses, as a main material, polycrystalline silicon formed at a process temperature of 800° C. or more, a so-called low-temperature polysilicon which uses, as a main material, polycrystalline silicon formed at a process temperature of 600° C. or less, polysilicon which is crystallized by adding an element for promoting crystallization or the like, and the like. Of course, as described above, a semiamorphous semiconductor or a semiconductor which contains a crystalline phase in a part of the semiconductor layer can also be used.

As a material of the semiconductor, as well as a single substance such as silicon (Si) or germanium (Ge), a compound semiconductor such as GaAs, InP, SiC, ZnSe, GaN, or SiGe can be used. In addition, zinc oxide (ZnO) or tin oxide ($SnO_2$) which is an oxide semiconductor can also be used. In the case of using ZnO for the semiconductor layer, a single layer or a multi-layer of $Y_2O_3$, $Al_2O_3$, or $TiO_2$ is preferably used as the gate insulating layer, and ITO, Au, Ti, or the like is preferably used for the gate electrode layer, a source electrode layer, or a drain electrode layer. In addition, In, Ga, or the like can be added into ZnO.

In the case where a crystalline semiconductor layer is used as the semiconductor layer, a known method (e.g., a laser crystallization method, a thermal crystallization method, or a thermal crystallization method using an element for promoting crystallization such as nickel) may be employed as a method of manufacturing the crystalline semiconductor layer. Further, a microcrystalline semiconductor, which is a SAS, may be crystallized by being irradiated with laser light to improve the crystallinity. In the case where an element for promoting crystallization is not introduced, hydrogen is released until the hydrogen concentration in an amorphous semiconductor film becomes $1 \times 10^{20}$ atoms/$cm_3$ or less by heating the amorphous semiconductor film at a temperature of 500° C. for one hour in a nitrogen atmosphere before irradiating the amorphous semiconductor film with laser light. This is because the amorphous semiconductor film containing much hydrogen is damaged when the film is irradiated with laser light.

Any method can be used for introducing a metal element into the amorphous semiconductor layer as long as the metal element can exist on the surface of or inside the amorphous semiconductor layer; for example, sputtering, CVD, a plasma treatment method (including plasma CVD), an adsorption method, or a method of applying a metal salt solution can be employed. Among them, the method using a solution is advantageous in simplicity and easy concentration control of the metal element. At this time, it is preferable to form an oxide film by UV light irradiation in an oxygen atmosphere, a thermal oxidation method, a treatment with ozone water including hydroxyl radicals or hydrogen peroxide, or the like in order to improve wettability of the surface of the amorphous semiconductor layer and to spread the aqueous solution over the entire surface of the amorphous semiconductor layer.

Further, in the crystallization step of crystallizing an amorphous semiconductor layer to form a crystalline semiconductor layer, the amorphous semiconductor layer may be added an element for promoting crystallization (also referred to as a catalytic element or a metal element), and a thermal treatment (at 550° C. to 750° C. for 3 minutes to 24 hours) may be performed to crystallize the amorphous semiconductor layer. As the element for promoting the crystallization, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element for promoting crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, a semiconductor layer containing a rare gas element is formed on the crystalline semiconductor layer containing the element for promoting crystallization, and a thermal treatment (at 550° C. to 750° C. for 3 minutes to 24 hours) is performed. The element for promoting crystallization in the crystalline semiconductor layer moves into the semiconductor layer containing the rare gas element, thereby the element for promoting crystallization in the crystalline semiconductor layer is removed or reduced. After that, the semiconductor layer containing the rare gas element, which functions as a gettering sink, is removed.

Thermal treatment and laser light irradiation may be combined to crystallize the amorphous semiconductor layer; or only one of the thermal treatment or the laser light irradiation may be performed plural times.

Alternatively, a crystalline semiconductor layer may be formed directly on the substrate by a plasma method. Further, a crystalline semiconductor layer may be selectively formed over the substrate by a plasma method.

An organic semiconductor material can be used as a semiconductor thereof by a printing method, a spray method, spin coating, a droplet discharge method, or the like. In this case, since the above etching step is not required, the number of steps can be reduced. A low molecular weight material, a high molecular weight material, or the like is used for the organic semiconductor, and a material such as an organic pigment or a conductive high molecular weight material can also be used. A π-electron conjugated high molecular weight material having a skeleton constituted by a conjugated double bond is preferably used as the organic semiconductor material. Typically, a soluble high molecular weight material such as polythiophene, polyfluoren, poly(3-alkylthiophene), a polythiophene derivative or pentacene can be used.

Other than the above, a material with which a semiconductor layer can be formed by performing treatment after depositing a soluble precursor can be used as the organic semiconductor material capable of being used in the present invention. As such an organic semiconductor material, there is polythienylenevinylene, poly(2,5-thienylenevinylene), polyacetyrene, a polyacetyrene derivative, polyallylenevinylene, or the like.

In converting the precursor to an organic semiconductor, a reaction catalyst such as a hydrogen chloride gas is added in addition to a heat treatment. The following can be applied as a typical solvent for dissolving the soluble organic semiconductor material: toluene, xylene, chlorobenzene, dichlorobenzene, anisole, chloroform, dichloromethane, gamma butyl lactone, butyl cellosolve, cyclohexane, NMP (N-methyl-2-pyrrolidone), cyclohexanone, 2-butanone, dioxane, dimethylformamide (DMF), THF (tetrahydrofuran) or the like.

A gate electrode can be formed using CVD, sputtering, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba, or an alloy material or a compound material containing the above element as its main component. Further, a semiconductor layer typified by a polycrystalline silicon film doped with an impurity element such as phosphorus, or an Ag—Pd—Cu alloy may also be used. Either a single-layer structure or a multi-layer structure may be employed. For example, a two-layer structure of a tungsten nitride film and a molybdenum film or a three-layer structure in which a tungsten film with a thickness of 50 nm, an alloy (Al—Si) film of aluminum and silicon with a thickness of 500 nm, and a titanium nitride film with a thickness of 30 nm are sequentially stacked may be used. Further, in the case of the three-layer structure, tungsten nitride may be used instead of the tungsten of the first conductive film, an alloy (Al—Ti) film of aluminum and titanium may be used instead of the alloy (Al—Si) film of aluminum and silicon of the second conductive film, and a titanium film may be used instead of the titanium nitride film of the third conductive film.

A light-transmitting material having light-transmitting property to visible light can also be used for the gate electrode. As the light-transmitting conductive material, indium tin oxide (ITO), indium tin oxide containing silicon oxide (ITSO), organic indium, organic tin, zinc oxide, or the like can be used. Further, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanic oxide, or the like may be used as well.

If etching processing is required to form the gate electrode, a mask may be formed and dry etching or wet etching may be performed. The electrode layer can be etched into a tapered shape by using an ICP (Inductively Coupled Plasma) etching method and appropriately adjusting the etching condition (e.g., the amount of electric power applied to a coiled electrode, the amount of electric power applied to an electrode on a substrate side, or the temperature of the electrode on the substrate side). As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be arbitrarily used.

In addition, even after the substrate, the insulating layer, the semiconductor layer, the gate insulating layer, the interlayer insulating layer, another insulating layer or conductive layer or the like for structuring a display device is formed, a surface of the substrate, the insulating layer, the semiconductor layer, the gate insulating layer, or the interlayer insulating layer may be oxidized or nitrided by performing oxidizing or nitriding with plasma treatment. If a semiconductor layer or an insulating layer is oxidized or nitrided with plasma treatment, a surface of the semiconductor layer or the insulating layer is modified, and a semiconductor layer or an insulating layer which is much denser can be obtained, compared with that formed by CVD or sputtering. Thus, a defect such as a pinhole can be suppressed so that characteristics or the like of the display device can be improved. In addition, the conductive layer such as the gate electrode or the wire can also be subjected to the above-described plasma treatment, and a surface thereof can be nitrided or oxidized by the nitriding or oxidizing (or both of them).

The plasma treatment is performed in the above gas atmosphere with an electron density of $1 \times 10^{11}$ cm$^{-3}$ or more and a plasma electron temperature of 1.5 eV or less. More specifically, the plasma treatment is performed with an electron density of $1 \times 10^{11}$ cm$^{-3}$ or more and $1 \times 10^{13}$ cm$^{-3}$ or less, and a plasma electron temperature of 0.5 eV or more and 1.5 eV or less. Since the plasma electron density is high and the electron temperature around an object to be processed formed over the substrate is low, damage by plasma to the object to be processed can be prevented. In addition, since the plasma electron density is as high as $1 \times 10^{11}$ cm$^{-3}$ or more, an oxide film or a nitride film formed by oxidizing or nitriding the object with the plasma treatment has better uniformity in thickness and the like and is denser, compared with a film formed by CVD, sputtering, or the like. In addition, since the plasma electron temperature is as low as 1.5 eV or less, oxidizing or nitriding treatment can be performed at a lower temperature than a conventional plasma treatment or a thermal oxidation method. For example, even when plasma treatment is performed at a temperature lower than a distortion point of a glass substrate by 100° C. or more, the oxidizing treatment or the nitriding treatment can be performed sufficiently. As for frequency for generating plasma, a high frequency wave such as a microwave (2.45 GHz) can be used. Note that the above conditions are used for plasma treatment, if not otherwise specified hereinafter.

Although a single gate structure is described in this embodiment mode, a multi-gate structure such as a double-gate structure may also be employed. In this case, gate electrode layers may be provided above and below the semiconductor layer or a plurality of gate electrode layers may be provided only on one side (above or below) of the semiconductor layer. The semiconductor layer may have impurity regions having different concentrations. For example, the vicinity of a channel region of the semiconductor layer, where the gate electrode layer is stacked, may be a low-concentration impurity region, and the region outside the low-concentration impurity region may be a high-concentration impurity region.

Each of the wires connected to the thin film transistors 320 to 323, the wire 385, the wire 399, the wire 317, and the terminal electrode layer 318 can be formed as follows: a conductive film is formed by PVD, CVD, vapor deposition, or the like, and then is etched to be a desired shape. Further, the source electrode layer or the drain electrode layer can be selectively formed at a predetermined position by a printing method, an electric plating method, or the like. Alternatively, a reflow method or a damascene method may be used. As a material of the source electrode layer or the drain electrode layer, an metal such as Ag, Au, Cu, Ni, Pt, Pd, Ir, Rh, W, Al, Ta, Mo, Cd, Zn, Fe, Ti, Zr, or Ba; or a semiconductor such as Si or Ge or an alloy thereof, or nitride thereof may be used. In addition, a light-transmitting material can also be used.

Further, as the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanic oxide, or the like can be used as well.

The first electrode 386 (also called a pixel electrode) functions as an anode or a cathode. As the first electrode layer 386, a film containing as its main component an element selected from Ti, Ni, W, Cr, Pt, Zn, Sn, In, and Mo, or an alloy material or a compound material containing the aforementioned element as a main component, such as TiN, $TiSi_xN_y$, $WSi_x$, $WN_x$, $WSi_xN_y$, or NbN, or a multi-layer thereof with a total thickness of 100 to 800 nm may be used.

Further, a transparent conductive film formed of a light-transmitting conductive material can also be used as the first electrode layer 386; indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide doped with silicon oxide (ITSO), or the like can also be used.

An example of a composition ratio in each light-transmitting conductive material will be described. In the composition ratio of indium oxide containing tungsten oxide, tungsten oxide may be 1.0 wt % and indium oxide may be 99.0 wt %. In the composition ratio of indium zinc oxide containing tungsten oxide, tungsten oxide may be 1.0 wt %, zinc oxide may be 0.5 wt %, and indium oxide may be 98.5 wt %. In the composition ratio of indium oxide containing titanium oxide, titanium oxide may be 1.0 to 5.0 wt % and indium oxide may be 99.0 to 95.0 wt %. In the composition ratio of indium tin oxide (ITO), tin oxide may be 10.0 wt % and indium oxide may be 90.0 wt %. In the composition ratio of indium zinc oxide (IZO), zinc oxide may be 10.7 wt % and indium oxide may be 89.3 wt %. Further, in the composition ratio of indium tin oxide containing titanium oxide, titanium oxide may be 5.0 wt %, tin oxide may be 10.0 wt %, and indium oxide may be 85.0 wt %. The composition ratios as described above are just examples, and the composition ratio may be set as appropriate.

Further, even in the case where a non-light-transmitting material such as a metal film is used for the first electrode 386, when the thickness is made thin (preferably, about 5 to 30 nm) so as to be able to transmit light, light can be emitted through the first electrode layer 386. As the metal thin film capable of being used for the first electrode 386, a conductive film formed of titanium, tungsten, nickel, gold, platinum, silver, aluminum, magnesium, calcium, lithium, or an alloy thereof can be used.

The first electrode 386 can be formed using a evaporation method, sputtering, CVD, printing, a dispenser method, a droplet discharge method, or the like.

The first electrode 386 may be cleaned and polished with CMP and a polyvinyl alcohol porous body in order to flat its surface. Further, after polishing by CMP, UV ray irradiation, oxygen plasma treatment or the like may be performed to the surface of the first electrode 386.

A heat treatment may be performed after forming the first electrode layer 386. With this heat treatment, moisture contained in the first electrode 386 is released. Accordingly, since degasification or the like does not occur from the first electrode 386, even when a light-emitting material which is easily deteriorated by moisture is formed over the first electrode, the light-emitting material is not deteriorated; therefore, a high reliable display device can be manufactured.

The electroluminescent layer 388 can be selectively formed using a material which shows luminescence of color red (R), green (G) or blue (B), by an evaporation method using a deposition mask, or the like. Alternatively, the electroluminescent layer may be formed using a material which shows luminescence of color white (W). The materials which show luminescence of color red (R), green (G) and blue (B) (e.g., a low molecular or high molecular weight material) can also be formed by a droplet discharge method; this case is preferable in that separate coating of RGB can be carried out without using a mask.

The second electrode 389 can be formed of: Al, Ag, Li, Ca; an alloy or a compound thereof such as MgAg, MgIn, AlLi, $CaF_2$; calcium nitride; or the like.

An insulating layer may be provided over the second electrode 389, as a passivation film (protective film). To thus provide the passivation film so as to cover the second electrode 389 is effective. The passivation film is structured by an insulating film containing silicon nitride, silicon oxide, silicon oxynitride, silicon nitride oxide, aluminum nitride, aluminum oxynitride, aluminum nitride oxide of which nitrogen content is larger than oxygen content, aluminum oxide, diamond like carbon (DLC), or a carbon film containing nitrogen, with a single-layer structure or a multi-layer structure thereof. Further, a siloxane resin may also be used.

In this case, it is preferable to use a film with good coverage as the passivation film, and a carbon film, particularly a DLC film, is effective. Since a DLC film can be formed at temperatures ranging from room temperature to 100° C. or less, it can be easily formed even over the electroluminescent layer 388 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reaction gas for deposition, a hydrogen gas and a hydrocarbon-based gas (e.g., $CH_4$, $C_2H_2$, or $C_6H_6$) are used and ionized by glow discharge, and then deposition is carried out with accelerative collision of ions with a cathode to which a negative self-bias is applied. In addition, the CN film may be formed by using $C_2H_4$ gas and $N_2$ gas as reaction gases. A DLC film has high blocking effect to oxygen and thus can suppress oxidation of the electroluminescent layer 388. Therefore, a problem of oxidation of the electroluminescent layer 388 during a subsequent sealing step can be prevented.

The light-emitting element is sealed by bonding the substrate 300 where the light-emitting element 390 is formed to the sealing substrate 395 with the sealing material 392. As the sealing material 392, a visible light curing, ultraviolet curing or thermosetting resin is preferably used. For example, an epoxy resin such as a bisphenol A liquid resin, a bisphenol A solid resin, a resin containing bromo-epoxy, a bisphenol F resin, a bisphenol AD resin, a phenol resin, a cresol resin, a novolac resin, a cyclic aliphatic epoxy resin, an epibis epoxy resin, a glycidyl ester resin, a glycidyl amine resin, a heterocyclic epoxy resin, or a modified epoxy resin can be used. Note that a region surrounded with the sealing material may be filled with a filler 393, and nitrogen or the like may be encapsulated therein by sealing the light-emitting element in a nitrogen atmosphere. The filler 393 does not necessarily have light-transmitting property in the case of a bottom emission type, whereas in the case of a structure in which light is extracted through the filler 393, the filler needs to have light-transmitting property. Typically, a visible light curing, ultraviolet curing, or thermosetting epoxy resin may be used. Through the above-described steps, a display device having a display function using a light-emitting element in this embodiment mode is completed. Further, the filler in a liquid state may be dropped and can fill the inside of the display device. If a hygroscopic material such as a drying agent is used as the filler, a moisture absorption effect is further obtained and deterioration of an element can be prevented.

A drying agent is provided within the display device in order to prevent deterioration of an element due to moisture. In this embodiment mode, the drying agent is provided in a concave portion formed to surround the pixel region in the sealing substrate, so as not to hinder thinning of the display device. In addition, a drying agent may also be provided in a region corresponding to a wire to increase the area of moisture absorption, which leads to high absorption efficiency. Further, since the drying agent is provided on the wire that does not emit light itself, the light-extraction efficiency is not reduced.

Note that this embodiment mode shows the case where the light-emitting element is sealed with the glass substrate. The sealing treatment is a treatment to protect the light-emitting element from moisture. Therefore, any of a method in which a light-emitting element is mechanically sealed with a cover material, a method in which a light-emitting element is sealed with a thermosetting resin or an ultraviolet curing resin, and a method in which a light-emitting element is sealed with a thin film of metal oxide, metal nitride, or the like having high barrier capability, can be used. As for the cover material, glass, ceramics, plastic, or metal can be used; however, when light is emitted to the cover material side, the cover material needs to have light-transmitting property. Enclosed space is formed by attaching the cover material to the substrate where the above-mentioned light-emitting element is formed with a sealing material such as a thermosetting resin or an ultraviolet curing resin and then by curing the resin with a thermal treatment or an ultraviolet irradiation treatment. It is also effective to provide a hydroscopic material typified by barium oxide in the enclosed space. The hydroscopic material may be provided on the sealing material or over a partition wall or in the peripheral part thereof so as not to block light emitted from the light-emitting element. Further, it is also possible to fill the space between the cover material and the substrate where the light-emitting element is formed with a thermosetting resin or an ultraviolet curing resin. In this case, it is effective to add a hydroscopic material typified by barium oxide in the thermosetting resin or the ultraviolet curing resin.

If the number of wires which shut out light emitted from the light-emitting element within the pixel is large, aperture ratio of the pixel is reduced in a bottom emission or dual emission display device. In the present invention, since the light-emitting element 390 and the thin film transistor 321 are connected in common to the same wire instead of being connected to different wires each maintaining at a certain potential, a wire is not necessarily provided in plural number within a pixel. Therefore, the number of wires within the pixel is reduced and the aperture ratio of the pixel can be improved.

Further, since dense disposition of wires can be prevented and the wire structure does not become complex and dense in this structure, the process does not become complex. Therefore, shape defects by a complex process, pattern shape, or the like can be prevented, and a yield is improved. Accordingly, a highly reliable display device can be manufactured at a low cost with high productivity.

This embodiment mode can be combined with each of Embodiment Modes 1 to 17.

Embodiment Mode 19

A display device having a light-emitting element can be formed using the present invention, and one of top emission, bottom emission, and dual emission of light from the light-emitting element is performed. As for the light emitted from the light-emitting element, the light is extracted from the substrate where the element is provided in the case of the bottom emission, the light is emitted from the sealing substrate side in the case of the top emission, and the light is emitted from both of the substrates interposing the light-emitting element therebetween in the case of the dual emission. Here, a stack structure of the light-emitting element depending on each case will be described using FIGS. 16A to 16C.

In this embodiment mode, the case where an inversely staggered thin film transistor is used as a thin film transistor in a pixel will be described. The transistor capable of being used in the present invention is not particularly limited; either a top-gate transistor or a bottom-gate transistor as described in this embodiment mode may be used. There are channel etch type and channel protection type in an inversely staggered thin film transistor; and in this embodiment mode, the case where a channel protection type, inversely staggered thin film transistor having a channel protection layer is used will be described. Further, in the case described in this embodiment mode, an insulating layer which functions as a partition wall is formed over the transistor and an interlayer insulating layer is not formed between the transistor and the partition wall.

In the present invention, a conductive layer for forming a wire layer or an electrode layer, a mask layer for forming a predetermined pattern, or the like may be formed by a method of forming a pattern selectively, such as a droplet discharge method. By the droplet discharge (jet) method (also called an inkjet method according to the system thereof), a predetermined pattern (a conductive layer, an insulating layer or the like) can be formed by selectively discharging (jetting) liquid droplets of a composition prepared for a specific purpose. In this case, a process for controlling wettability or adhesion may be performed to the formation region. Further, a method for transferring or drawing a pattern, for example, a printing method (a method of forming a pattern, e.g., screen printing or offset printing), dispenser method, or the like can also be used.

In the case of forming a film (e.g., an insulating film or a conductive film) by a droplet discharge method, the film is formed as follows: a composition containing a film material which is processed into a particle form is discharged, and the composition is fused or welded by baking to be solidified. A film formed by a sputtering method or the like tends to have a columnar structure, whereas the film thus formed by discharging and baking the composition containing a conductive material tends to have a polycrystalline structure having a large number of grain boundaries. Further, since the film in a fluid liquid state is attached to the formation region, the film may have a smooth surface having curvature in accordance with the shape of the liquid state.

A droplet discharge means used in a droplet discharge method has a means for discharging liquid droplets, which includes a nozzle equipped with a component discharge outlet, a head having one or a plurality of nozzles, or the like. Each nozzle of the droplet discharge means is set that the diameter is 0.02 to 100 μm (preferably 30 μm or less) and the quantity of component discharge is 0.001 to 100 pl (preferably 0.1 pl or more and 40 pl or less, and more preferably 10 pl or less). The discharge quantity is increased proportionately to the diameter of the nozzle. It is preferable that a distance between an object to be processed and the discharge outlet of the nozzle be as short as possible in order to drop on a desired position; the distance is preferably set to be 0.1 to 3 mm (more preferably 1 mm or less).

As the composition to be discharged from the discharge outlet, a conductive material dissolved or dispersed in a solvent is used. The conductive material corresponds to a fine particle or a dispersed nanoparticle of metal such as Ag, Au, Cu, Ni, Pt, Pd, Ir, Rh, W, or Al, and sulfide of metal such as Cd or Zn, oxide of Fe, Ti, Si, Ge, Zr, Ba, or the like, a fine particle or a dispersed nanoparticle of silver halide, or the like may be mixed. In addition, the above-described conductive materials may also be used in combination. For a transparent conductive film, indium tin oxide (ITO), indium tin oxide containing silicon oxide (ITSO), organic indium, organic tin, zinc oxide (ZnO), titanium nitride, or the like can be used. Further, indium zinc oxide (IZO) containing zinc oxide, ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used. However, as for the composition to be discharged from the discharge outlet, it is preferable to use one of the materials of gold, silver, and copper dissolved or dispersed in a solvent, considering a specific resistance value; it is more preferable to use silver or copper having a low resistance value. When silver or copper is used, however, a barrier film may be preferably provided in addition as a countermeasure against impurities. A silicon nitride film or a nickel boron (NiB) film can be used as the barrier film.

The composition to be discharged is a conductive material dissolved or dispersed in a solvent, which further contains a dispersant, or a thermosetting resin called a binder. In particular, the binder has a function to prevent generation of cracks or uneven shape change during baking. Thus, a formed conductive layer may contain an organic material. The organic material to be contained depends on heating temperature, atmosphere, and time. This organic material is an organic resin which functions as a binder, a solvent, a dispersant, and a coating of a metal particle, or the like; polyimide, acrylic, a novolac resin, a melamine resin, a phenol resin, an epoxy resin, a silicon resin, a furan resin, a diallyl phthalate resin, and the like can be give as examples of the organic material.

In addition, a particle with a plurality of layers, in which a conductive material is coated with another conductive material, may also be used. For example, a particle with a three-layer structure in which copper is coated with nickel boron (NiB) and the nickel boron is further coated with silver, may be used. As for the solvent, esters such as butyl acetate or ethyl acetate, alcohols such as isopropyl alcohol or ethyl alcohol, an organic solvent such as methyl ethyl ketone or acetone, water, or the like is used. The viscosity of the composition is preferably 20 mPa·s (cp) or less; this prevents the composition from drying, and enables the composition to be discharged smoothly from the discharge outlet. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organic tin is dissolved or dispersed in a solvent may be set to be 5 mPa·s to 20 mPa·s, the viscosity of a composition in which silver is dissolved or dispersed in a solvent may be set to be 5 mPa·s to 20 mPa·s, and the viscosity of a composition in which gold is dissolved or dispersed in a solvent may be set to be 5 mPa·s to 20 mPa·s.

Further, the conductive layer may also be formed by stacking a plurality of conductive materials. In addition, the conductive layer may be formed first by a droplet discharge method using silver as a conductive material, and may then be plated with copper or the like. The plating may be performed by an electroplating or chemical (electroless) plating method. The plating may be performed by immersing a substrate surface in a container filled with a solution containing a plating material; alternatively, the solution containing a plating material may be applied to the substrate placed obliquely (or vertically) so as to flow the solution containing a plating material on the substrate surface. When the plating is performed by applying a solution to the substrate placed obliquely (or vertically), there is the advantage of miniaturizing a process apparatus.

The diameter of a particle of the conductive material is preferably as small as possible, for the purpose of preventing nozzles from being clogged and for manufacturing a minute pattern, although it depends on the diameter of each nozzle, a desired shape of a pattern, and the like. Preferably, the diameter of the particle of the conductive material is 0.1 μm or less. The composition is formed by a method such as an electrolyzing method, an atomizing method, or a wet reduction method, and the particle size is generally about 0.01 μm to 10 μm. However, when a gas evaporation method is employed, nanoparticles protected by a dispersant are as minute as about 7 nm, and when the surface of each particle is covered with a coating, the nanoparticles do not aggregate in the solvent and are uniformly dispersed in the solvent at room temperature, and behaves similarly to a liquid. Accordingly, it is preferable to use a coating.

In addition, the step of discharging the composition may be performed under reduced pressure. When the step is performed under reduced pressure, an oxide film or the like is not formed on the surface of the conductive layer, which is preferable. After discharging the composition, either or both steps of drying and baking are performed. Both the drying step and baking step are thermal treatment; however, drying is performed for three minutes at 100° C. and baking is performed for 15 minutes to 60 minutes at 200° C. to 350 C.° for example, and they are different in purpose, temperature, and time period. The steps of drying and baking are performed under normal pressure or under a reduced pressure, by laser light irradiation, rapid thermal annealing, heating using a heating furnace, or the like. Note that the timing of each heat treatment is not particularly limited. The substrate may be heated in advance to favorably perform the steps of drying and baking, and the temperature of the substrate at that time is, although it depends on the material of the substrate or the like, generally 100° C. to 800° C. (preferably, 200° C. to 350° C.). Through these steps, nanoparticles are made in contact with each other and fusion and welding are accelerated by hardening and shrinkage of a peripheral resin while volatilizing the solvent in the composition or chemically removing the dispersant.

A continuous wave or pulsed gas laser or solid-state laser may be used for laser light irradiation. An excimer laser, a YAG laser, or the like can be used as the former gas laser. A laser using a crystal of YAG, $YVO_4$, $GdVO_4$, or the like which is doped with Cr, Nd, or the like can be used as the latter solid-state laser, for example. Note that it is preferable to use a continuous wave laser in consideration of the absorptance of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes with the use of an infrared lamp or a halogen lamp which emits ultraviolet to infrared light in an inert gas atmosphere. Since this treatment is performed instantaneously, only an outermost thin film can be substantially heated and the lower layer of the film is not affected. In other words, even a substrate having a low heat resistance such as a plastic substrate is not affected.

After forming the object by discharging a liquid composition by a droplet discharge method, the surface thereof may be planarized by pressing with pressure to improve planarity. As a pressing method, concavity and convexity may be reduced by moving a roller-shaped object on the surface, or the surface may be perpendicularly pressed with a flat plate-shaped object. A heating step may be performed at the time of pressing. Alternatively, the concavity and convexity of the surface may be eliminated with an air knife after softening or melting the surface with a solvent or the like. A CMP method may also be used for polishing the surface. This step can be employed in planarizing a surface when concavity and convexity are generated by the droplet discharge method.

Although the film formation method by the above-described droplet discharge method is described using the case of a conductive layer as an example, the conditions for discharge, drying, baking, a solvent, or the like and the detailed explanation can also be applied to the insulating layer formed in this embodiment mode. By combining a droplet discharge method, cost can be reduced as compared to the case of entire surface coating by a spin coating method or the like.

Figure 16A:
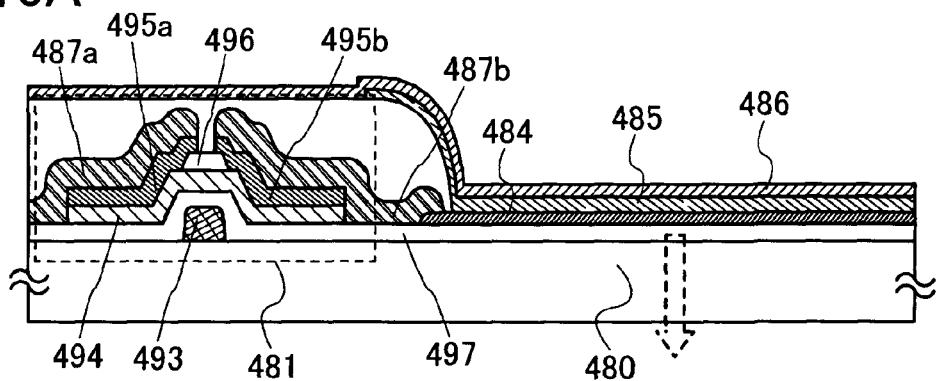
FIGS. 16A to 16C are cross-sectional views for showing a display device of the present invention.
Figure 16B:
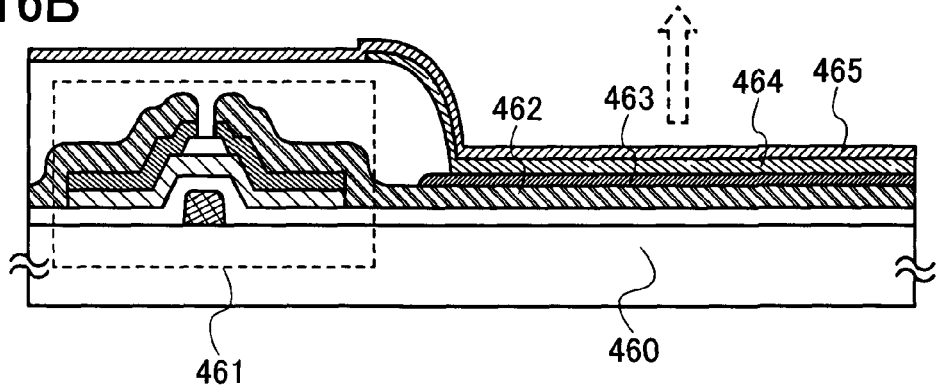
Figure 16C:
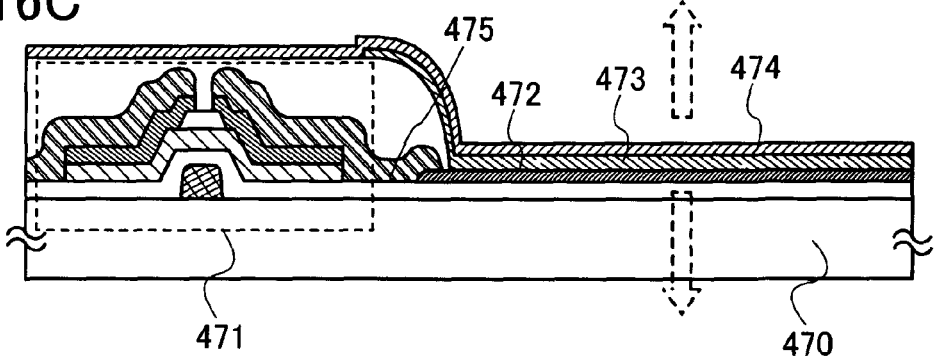

FIGS. 16A to 16C are cross-sectional views for showing a light-emitting element and a transistor which functions as a driving transistor connected to the light-emitting element; light from the light-emitting element is emitted in a direction denoted by an arrow. The substrate used for sealing is omitted in FIGS. 16A to 16C.

In pixels of FIGS. 16A to 16C, transistors 481, 461, and 471 are inversely staggered thin film transistors which are similarly manufactured. Therefore, although the transistor 481 will be described as an example, the transistors 461 and 471 each have the same structure.

The transistor 481 is provided over a substrate 480 having light-transmitting property, and is structured by a gate electrode layer 493, a gate insulating film 497, a semiconductor layer 494, a semiconductor layer 495a having n-type conductivity, a semiconductor layer 495b having n-type conductivity, a source electrode layer or a drain electrode layer 487a, the source electrode layer or the drain electrode layer 487b, and a channel protection layer 496.

In this embodiment mode, a crystalline semiconductor layer is used as the semiconductor layer, and a semiconductor layer having n-type conductivity is used as the semiconductor layer having one conductivity type. Instead of forming a semiconductor layer having n-type conductivity, plasma treatment using a $PH_3$ gas may be performed to provide conductivity for the semiconductor layer. The semiconductor layer is not limited to that described in this embodiment mode; an amorphous semiconductor layer may be used. In the case of using a crystalline semiconductor layer of polysilicon or the like as is in this embodiment mode, an impurity region having one conductivity type may be formed by introducing (adding) impurities into the crystalline semiconductor layer without forming the semiconductor layer having one conductivity type. Further, an organic semiconductor such as pentacene can be used; if an organic semiconductor is selectively formed by a droplet discharge method or the like, the etching process to form a desired shape can be simplified.

In this embodiment mode, an amorphous semiconductor layer is crystallized to form a crystalline semiconductor layer as the semiconductor layer 494. In the crystallization process, the amorphous semiconductor layer is crystallized by being added with an element for promoting crystallization (also referred to as a catalytic element or a metal element), and performing a heat treatment (at 550° C. to 750° C. for 3 minutes to 24 hours). As the element for promoting crystallization, metal elements for promoting crystallization of silicon can be used, such as one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au), and nickel is used in this embodiment mode.

In order to remove or reduce the element for promoting crystallization from the crystalline semiconductor layer, a semiconductor layer containing an impurity element is formed in contact with the crystalline semiconductor layer and functioned as a gettering sink. The impurity element may be an n-type impurity element, a p-type impurity element, or a rare gas element; for example, one or more of phosphorus (P), nitrogen (N), arsenic (As), antimony (Sb), bismuth (Bi), boron (B), helium (He), neon (Ne), argon (Ar), Kr (Krypton), and Xe (Xenon) can be used. In this embodiment mode, as the semiconductor layer containing the impurity element that functions as the gettering sink, a semiconductor layer having n-type conductivity, which contains phosphorus (P) that is an n-type impurity element, is formed. The semiconductor layer having n-type conductivity is formed on the crystalline semiconductor layer containing the element for promoting crystallization, and a thermal treatment is performed (at 550° C. to 750° C. for 3 minutes to 24 hours). The element for promoting crystallization contained in the crystalline semiconductor layer moves into the semiconductor layer having n-type conductivity. Accordingly, the element for promoting crystallization in the crystalline semiconductor layer is removed or reduced, thereby the semiconductor layer 494 is formed. Meanwhile, the semiconductor layer having n-type conductivity becomes a semiconductor layer having n-type conductivity which contains the metal element for promoting crystallization, and then the shape is processed to be the semiconductor layers 495a and 495b having n-type conductivity. As described above, the semiconductor layer having n-type conductivity functions both as the gettering sink of the semiconductor layer 494 and as the source or drain region.

In this embodiment mode, the crystallization process and the gettering process of the semiconductor layer are performed by a plurality of heat treatments. However, the crystallization process and the gettering process can also be performed by one heat treatment. In this case, a heat treatment may be performed after forming an amorphous semiconductor layer, adding an element for promoting crystallization, and forming a semiconductor layer which functions as a gettering sink.

In this embodiment mode, after the gate insulating layer is formed by stacking a plurality of layers, a silicon nitride oxide film and a silicon oxynitride film are stacked on the gate electrode layer 493 side, as the gate insulating film 497 having a two-layer structure. The insulating layer is preferably formed by successively forming the layers at the same temperature in the same chamber while changing reaction gases with a vacuum state maintained. When the films are successively formed while maintaining the vacuum state, interfaces between the stacked films can be prevented from being contaminated.

The channel protection layer 496 may be formed by a droplet discharge method using polyimide, polyvinyl alcohol or the like. As a result, a light exposure process can be omitted. The channel protection layer may be formed of one or more of an inorganic material (e.g., silicon oxide, silicon nitride, silicon oxynitride, or silicon nitride oxide), a photosensitive or non-photosensitive organic material (e.g., an organic resin material) (e.g., polyimide, acrylic, polyamide, polyimide amide, or benzocyclobutene), a resist, a low dielectric constant material and the like, or a multi-layer thereof or the like. In addition, a siloxane resin material may also be used. As a manufacturing method, a vapor phase growth method such as a plasma CVD method or a thermal CVD method, or a sputtering method can be used. A droplet discharge method or a printing method (a method for forming a pattern, such as screen printing or offset printing) can also be used. A thin film obtained by a spin-coating method can also be used.

First, the case where light is emitted to the substrate 480 side, that is the case of bottom emission will be described using FIG. 16A. In this case, a first electrode layer 484, an electroluminescent layer 485, and a second electrode layer 486 are stacked sequentially in contact with the source electrode layer or the drain electrode layer 487b so as to be electrically connected to the transistor 481. The substrate 480 through which light is transmitted is required at least to have light-transmitting property to visible light. Next, the case where light is emitted to the opposite side to a substrate 460, that is the case of top emission will be described using FIG. 16B. The transistor 461 can be formed similarly to the above-described thin film transistor.

A source electrode layer or drain electrode layer 462 that is electrically connected to the transistor 461 is in contact with a first electrode layer 463 to be electrically connected to each other. The first electrode layer 463, an electroluminescent layer 464 and a second electrode layer 465 are sequentially stacked. The source electrode layer or drain electrode layer 462 is a metal layer having reflexivity, and reflects light which is emitted from the light-emitting element, upward as denoted by an arrow. The source electrode layer or drain electrode layer 462 has a structure stacked on the first electrode layer 463, and therefore, even when the first electrode layer 463 is formed of a material having light-transmitting property and transmits light, the light is reflected on the source electrode layer or drain electrode layer 462 and then is emitted in the direction opposite to the substrate 460 side. Needless to say, the first electrode layer 463 may also be formed using a metal film having reflexivity. Since light from the light-emitting element is emitted through the second electrode layer 465, the second electrode layer 465 is formed using a material having light-transmitting property at least in a visible region.

The case where light is emitted to the substrate 470 side and to the side opposite to the substrate 470 side, that is the case of dual emission will be described using FIG. 16C. The thin film transistor 471 is also a channel protection type thin film transistor. A source electrode layer or a drain electrode layer 477 that is electrically connected to a semiconductor layer of the thin film transistor 471 is electrically connected to a first electrode layer 472. The first electrode layer 472, an electroluminescent layer 473, and a second electrode layer 474 are sequentially stacked. At this time, if the first electrode layer 472 and the second electrode layer 474 are both formed using a material having light-transmitting property at least in a visible region or are both formed to have thicknesses that can transmit light, dual emission is realized. In this case, an insulating layer and the substrate 470 through which light is transmitted are also required to have light-transmitting property to light in a visible region.

Modes of a light-emitting element which is applicable in this embodiment mode are shown in FIGS. 15A to 15D. FIGS. 15A to 15D show element structures of the light-emitting element, and the light-emitting element has a structure in which an electroluminescent layer 860 formed of an organic compound and an inorganic compound is interposed between a first electrode layer 870 and a second electrode layer 850. The electroluminescent layer 860 is, as shown in the figure, structured by a first layer 804, a second layer 803, and a third layer 803.

First, the first layer 804 is a layer which has a function of transporting holes to the second layer 803, and includes at least a first organic compound and a first inorganic compound having electron-accepting property with respect to the first organic compound. What is important is that the first organic compound and the first inorganic compound are not simply mixed but the first inorganic compound has the electron-accepting property with respect to the first organic compound. This structure generates many hole-carriers in the first organic compound which has originally almost no inherent carriers, and hole-injecting and hole-transporting property which are highly excellent can be exhibited.

Therefore, the first layer 804 can obtain not only an advantageous effect (e.g., improvement in heat resistance) that is considered to be obtained by mixing an inorganic compound but also excellent conductivity (in particular, hole-injecting property and hole-transporting property in the first layer 804). This is advantageous effect that cannot be obtained in a conventional hole-transporting layer in which an organic compound and an inorganic compound that do not electronically interact with each other are simply mixed. This advantageous effect can make a driving voltage lower than conventional one. In addition, since the first layer 804 can be made thick without causing increase in driving voltage, short circuit of the element due to dust or the like can be suppressed.

Since hole-carriers are generated in the first organic compound as described above, it is preferable to use a hole-transporting organic compound as the first organic compound. Examples of the hole-transporting organic compound include, but are not limited to, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. Among the compounds described above, an aromatic amine compound typified by TDATA, MTDATA, m-MTDAB, TPD, NPB, DNTPD, and TCTA can easily generate hole-carriers, and a suitable compound group for the first organic compound.

On the other hand, the first inorganic compound may be any material as long as the material can easily accept electrons from the first organic compound, and various kinds of metal oxides and metal nitrides can be used. Any of transition metal oxides that belong to Groups 4 to 12 of the periodic table is preferable because electron-accepting property is easily exhibited. Specifically, for example, titanium oxide, zirconium oxide, vanadium oxide, molybdenum oxide, tungsten oxide, rhenium oxide, ruthenium oxide, zinc oxide, and the like can be given. In addition, among the metal oxides described above, any of transition metal oxides that belong to Groups 4 to 8 of the periodic table mostly has a high electron-accepting property, which is a preferable group. In particular, vanadium oxide, molybdenum oxide, tungsten oxide, and rhenium oxide are preferable because they can be formed by vacuum evaporation and can be easily used.

Note that the first layer 804 may be formed by stacking a plurality of layers each including a combination of the organic compound and the inorganic compound described above, and may further include another organic compound or inorganic compound.

Next, the third layer 802 will be described. The third layer 802 is a layer which has a function of transporting electrons to the second layer 803, and includes at least a third organic compound and a third inorganic compound having electron-donating property with respect to the third organic compound. What is important is that the third organic compound and the third inorganic compound are not simply mixed but the third inorganic compound has the electron-denoting property with respect to the third organic compound. This structure generates many electron-carriers in the third organic compound which has originally almost no inherent carriers, and electron-injecting and electron-transporting property which are highly excellent can be exhibited.

Therefore, the third layer 802 can obtain not only an advantageous effect (e.g., improvement in heat resistance) that is considered to be obtained by mixing an inorganic compound but also excellent conductivity (in particular, electron-injecting property and electron-transporting property in the third layer 802). This is advantageous effect that cannot be obtained in a conventional electron-transporting layer in which an organic compound and an inorganic compound that do not electronically interact with each other are simply mixed. This advantageous effect can make a driving voltage lower than conventional one. In addition, since the third layer 802 can be made thick without causing increase in driving voltage, short circuit of the element due to dust or the like can be suppressed.

As the third organic compound in which electron-carriers are generated as described above, it is preferable to use an electron-transporting organic compound. Examples of the electron-transporting organic compound include, but are not limited to, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. In addition, among the compounds described above, chelatemetal complexes having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron-carriers, and are suitable compound groups for the third organic compound.

On the other hand, the third inorganic compound may be any material as long as the material can easily donate electrons to the third organic compound, and various kinds of a metal oxide or a metal nitride can be used. An alkali metal oxide, an alkaline-earth metal oxide, a rare-earth metal oxide, an alkali metal nitride, an alkaline-earth metal nitride, and a rare-earth metal nitride are preferable because electron-donating property is easily exhibited. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be formed by vacuum evaporation and can be easily used.

Note that the third layer 802 may be formed by stacking a plurality of layers each including a combination of the organic compound and the inorganic compound described above, and may further include another organic compound or inorganic compound.

Then, the second layer 803 will be described. The second layer 803 is a layer which has a function of emitting light, and includes a second organic compound that has light-emitting property. The second layer 803 may also include a second inorganic compound. The second layer 803 can be formed by using various light-emitting organic compounds or inorganic compounds. However, since it is considered to be hard to flow a current through the second layer 803 as compared with the first layer 804 or the third layer 802, the thickness of the second layer 803 is preferably approximately 10 to 100 nm.

The second organic compound is not particularly limited as long as it is a light-emitting organic compound, and examples of the second organic compound include 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, a compound capable of emitting phosphorescence can also be used, such as bis[2-(4',6'-difluorophenyl)pyridinato-N,$C^{2'}$]iridium(picolinate) (abbreviation: FIrpic), bis{2-[3',5'-bis(trifluoromethyl)phenyl]pyridinato-N,$C^{2'}$}iridium(picolinate) (abbreviation: $Ir(CF_3\ ppy)_2(pic)$), tris(2-phenylpyridinato-N,$C^{2'}$) iridium (abbreviation: $Ir(Ppy)_3$), bis(2-phenylpyridinato-N, $C^{2'}$)iridium(acetylacetonate) (abbreviation: $Ir(ppy)_2(acac)$), bis[2-(2'-thienyl)pyridinato-N,$C^{3'}$]iridium(acetylacetonate) (abbreviation: $Ir(thp)_2(acac)$), bis(2-phenylquinolinato-N, $C^{2'}$)iridium(acetylacetonate) (abbreviation: $Ir(pq)_2(acac)$), or bis[2-(2'-benzothienyl)pyridinato-N,$C^{3'}$]iridium(acetylacetonate) (abbreviation: $Ir(btp)_2(acac)$).

Further, a triplet excitation light-emitting material containing a metal complex or the like may be used for the second layer 803, as well as a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of high light-emitting efficiency and less power consumption to obtain the same luminance. That is, when a triplet excitation light-emitting material is used for a red pixel, the amount of current needs to be supplied to a light-emitting element is small; thus, reliability can be improved. A pixel emitting red light and a pixel emitting green light may be formed by using a triplet excitation light-emitting material and a pixel emitting blue light may be formed by using a singlet excitation light-emitting material to achieve low power consumption as well. Low power consumption can be further achieved by forming a light-emitting element emitting green light that has high visibility for human eyes, by using a triplet excitation light-emitting material.

The second layer 803 may include not only the second organic compound described above, which exhibits light emission, but also another organic compound. Examples of organic compounds that can be added include, but are not limited to, TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbreviation: CBP), 1,3,5-tris[4-(N-carbazolyl)phenyl]benzene (abbreviation: TCPB), and the like. It is preferable that the organic compound, which is added in addition to the second organic compound, has larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing a light-emitting layer having a different emission wavelength range for each pixel. Typically, light-emitting layers corresponding to respective colors of R (red), G (green), and B (blue) are formed. Also in this case, color purity can be improved and a pixel portion can be prevented from having a mirror surface (reflection) by providing a filter which transmits light of an emission wavelength range of the light on the light-emission side of the pixel. By providing the filter, a circularly polarizing plate or the like that has been conventionally required can be omitted, and further, loss of light emitted from the light-emitting layer can be eliminated. Further, change in color tone, which occurs when the pixel portion (display screen) is obliquely seen, can be reduced.

Either a low molecular weight organic light-emitting material or a high molecular weight organic light-emitting material may be used as a material of the second layer 803. A high molecular weight organic light-emitting material is physically stronger as compared with a low molecular weight material and is superior in durability of the element. In addition, a high molecular weight organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high molecular weight electroluminescent material which can be used for forming a light-emitting layer, a polyparaphenylene-vinylene-based material, a polyparaphenylene-based material, a polythiophene-based material, or a polyfluorene-based material can be used.

As the polyparaphenylene-vinylene-based material, a derivative of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be used. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be used. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be used. As the polyfluorene-based material, a derivative of polyfluorene [PF] such as poly(9,9-dialkylfluorene) [PDAF] or poly(9,9-dioctylfluorene) [PDOF] can be used.

The second inorganic compound may be any inorganic compound as long as light-emission of the second organic compound is not easily quenched by the inorganic compound, and various kinds of metal oxides and metal nitrides can be used. In particular, a metal oxide that belongs to Group 13 or 14 of the periodic table is preferable because light-emission of the second organic compound is not easily quenched, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound described above, and may further include another organic compound or inorganic compound. A layer structure of the light-emitting layer can be changed, and modification as follows can be permitted unless it departs from the scope and spirit of the present invention; an electrode layer dedicated for injecting electrons may be provided or a light-emitting material may be dispersed, instead of providing a specific electron-injecting region or light-emitting region.

A light-emitting element formed by using the above materials emits light by being forwardly biased. Pixels of a display device which is formed using a light-emitting element can be driven by a simple matrix method or an active matrix method. In any case, each pixel is emitted light by applying a forward bias thereto at a specific timing; however, the pixel is in a non-light emitting state for a certain period. Reliability of the light-emitting element can be improved by applying a reverse bias during the non-light emitting period. In a light-emitting element, there is a deterioration mode in which emission intensity is decreased under a constant driving condition or a deterioration mode in which a non-light emitting region is enlarged in the pixel and luminance is apparently decreased. However, progression of deterioration can be slowed down by alternating current driving where bias is applied forwardly and reversely; thus, reliability of a light-emitting display device can be improved. Additionally, either digital driving or analog driving can be applied.

A color filter (colored layer) may be formed over the sealing substrate. The color filter (colored layer) can be formed by a evaporation method or a droplet discharge method. High-definition display can be performed by the color filter (colored layer). This is because a broad peak can be compensated to be sharp in an emission spectrum each of R, G and B by the color filter (colored layer). Further, the present invention is not limited to full-color display using three kinds of pixels which are R, G, and B, full-color display using four kinds of pixels which are R, G, B, and W (white) may also be performed by converting the three-color video data into four-color video data. By using four kinds of pixels, luminance is increased and dynamic image display can be performed.

Full-color display can be performed by forming a material emitting light of a single color and combining with a color filter or a color conversion layer. Preferably, the color filter (colored layer) or the color conversion layer is formed over, for example, a second substrate (sealing substrate) and attached to a substrate.

Needless to say, display of single-color emission may also be performed. For example, an area color type display device may be formed using single-color emission. The area color type is suitable for a passive matrix display portion, and can mainly display letters and symbols.

Figure 15A:
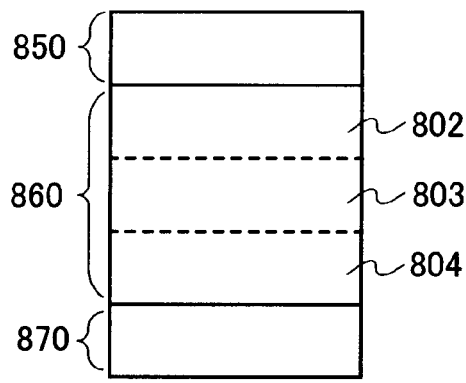
FIGS. 15A to 15D are diagrams for showing a structure of a light-emitting element applicable to the present invention.
Figure 15B:
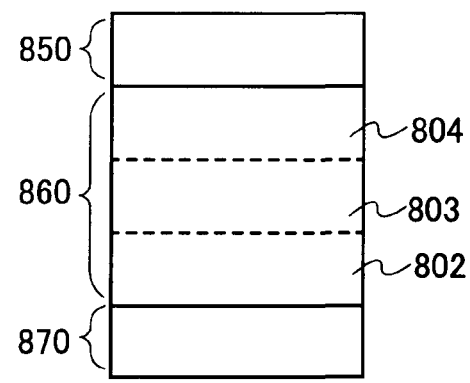

Materials of the first electrode layer 870 and the second electrode layer 850 are required to be selected considering the work function. The first electrode layer 870 and the second electrode layer 850 can be either an anode or a cathode depending on the pixel structure. In the case where polarity of a driving thin film transistor is a p-channel type, the first electrode layer 870 preferably serves as an anode and the second electrode layer 850 preferably serves as a cathode as shown in FIG. 15A. In the case where polarity of the driving thin film transistor is an n-channel type, the first electrode layer 870 preferably serves as a cathode and the second electrode layer 850 preferably serves as an anode as shown in FIG. 15B. Materials that can be used for the first electrode layer 870 and the second electrode layer 850 will be described. It is preferable to use a material having a high work function (specifically, a material having a work function of 4.5 eV or more) for each of the first electrode layer 870 and the second electrode layer 850, which serves as an anode, and a material having a low work function (specifically, a material having a work function of 3.5 eV or less) for each of the first electrode layer 870 and the second electrode layer 850, which serves as a cathode. However, since the first layer 804 is superior in hole-injecting property and hole-transporting property and the third layer 802 is superior in electron-injecting property and electron-transporting property, both of the first electrode layer 870 and the second electrode layer 850 are scarcely restricted by a work function, and various materials can be used for them.

Each light-emitting element shown in FIGS. 15A and 15B has a structure where light is extracted from the first electrode layer 870; thus, the second electrode layer 850 is not necessarily required to have light-transmitting property. The second electrode layer 850 may be preferably a film mainly containing an element of Ti, TiN, $TiSi_xN_y$, Ni, W, $WASi_x$, $WN_x$, $WASi_xN_y$, NbN, Cr, Pt, Zn, Sn, In, Ta, Al, Cu, Au, Ag, Mg, Ca, Li and Mo, or an alloy material or a compound material containing the element as its main component; or a multi-layer film thereof in a total thickness of 100 to 800 nm.

The second electrode layer 850 can be formed by a evaporation method, a sputtering method, a CVD method, a printing method, a droplet discharge method, or the like.

Further, when the second electrode layer 850 is formed of a light-transmitting conductive material similarly to the material used for the first electrode layer 870, light is also extracted from the second electrode layer 850, thereby a dual emission structure can be obtained in which light emitted from the light-emitting element is emitted from both the first electrode layer 870 and the second electrode layer 850.

Note that the light-emitting element of the present invention has variations by changing the kind of each of the first electrode layer 870 or the second electrode layer 850.

FIG. 15B shows the case where the third layer 802, the second layer 803, and the first layer 804 are stacked in this order on the first electrode layer 870 side, in the electroluminescent layer 860.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions of high carrier-injecting property and high carrier-transporting property by mixing an organic compound and an inorganic compound, where the functions are not obtainable from only either one of the organic compound or the inorganic compound. In addition, although it is effective that each of the first layer 804 and the third layer 802 is a layer in which an organic compound and an inorganic compound are combined, each layer may contain only one of an organic compound and an inorganic compound as well.

Further, various methods can be used as a method for forming the electroluminescent layer 860 which is a layer in which an organic compound and an inorganic compound are mixed. A co-evaporation method by which both an organic compound and an inorganic compound are evaporated at the same time can be employed. For example, there is a co-evaporation method of evaporating both an organic compound and an inorganic compound by resistance heating. Besides, for co-evaporation, an inorganic compound may be evaporated by an electron beam (EB) while evaporating an organic compound by resistance heating. Moreover, there is a method of sputtering an inorganic compound while evaporating an organic compound by resistance heating to deposit the both at the same time. In addition, the electroluminescent layer may also be formed by a wet process.

Similarly, for forming the first electrode layer 870 and the second electrode layer 850, a evaporation method by resistance heating, an EB evaporation method, a sputtering method, a wet process, or the like can be employed.

Figure 15C:
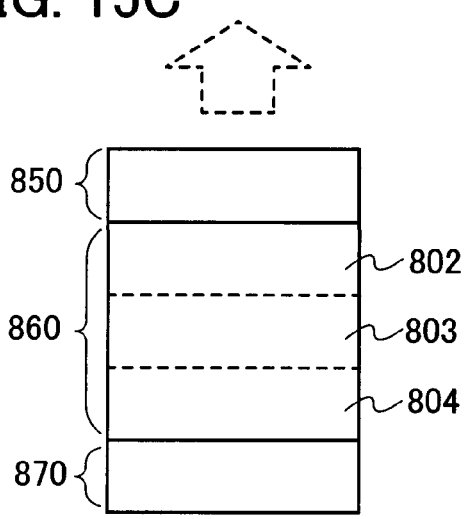
Figure 15D:
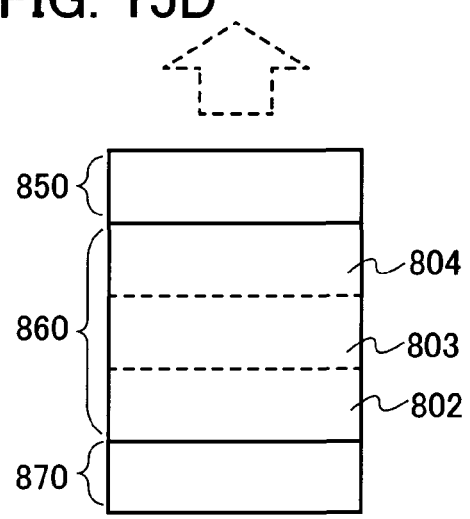

In FIG. 15C, an electrode layer having reflectivity is used as the first electrode layer 870 and an electrode layer having light-transmitting property is used as the second electrode layer 850 in FIG. 15A, so that light emitted from the light-emitting element is reflected on the first electrode layer 870, and transmitted and emitted through the second electrode layer 850. Similarly, in FIG. 15D, an electrode layer having reflectivity is used as the first electrode layer 870 and an electrode layer having light-transmitting property is used as the second electrode layer 850 in FIG. 15B, so that light emitted from the light-emitting element is reflected on the first electrode layer 870, and transmitted and emitted through the second electrode layer 850. This embodiment mode can be combined freely with each of Embodiment Modes 1 to 18.

Embodiment Mode 20

Next, a mode in which a driver circuit is mounted on a display device of the present invention will be described.

First, a display device using COG will be described using FIG. 18A. The pixel portion 2701 which displays information such as letters and images is provided over the substrate 2700. A substrate provided with a plurality of driver circuits is cut into rectangular shape, and the cut driver circuits (also referred to as driver ICs) 2751 are mounted on the substrate 2700. FIG. 18A shows a mode in which a plurality of the driver ICs 2751, and the FPC 2750 which is attached to the end of each driver IC 2751 are mounted. Alternatively, the cut may be performed to have a size approximately equal to the side length on the signal line side of the pixel portion, and a single driver IC and a tape which is attached to the end thereof may be mounted.

Further, TAB may also be adopted, and in this case, a plurality of tapes is pasted as shown in FIG. 18B, and each driver IC may be attached to the tape. Similarly to the case of COG, a single driver IC may be mounted on a single tape; in this case, a metal piece or the like for fixing the driver IC may be attached together for intensity.

Such a driver IC to be mounted on the display panel is preferably formed over a rectangular substrate having a side of 300 mm to 1000 mm or more, in plural number in order to improve productivity.

That is, a plurality of circuit patterns each including a driver circuit portion and an input/output terminal as one unit may be formed over a substrate, and be divided and taken out finally. As for the length of a long side of the driver IC, a rectangle with a long side of 15 to 80 mm and a short side of 1 to 6 mm may be formed in consideration of a length of one side of a pixel portion or a pixel pitch, or one side of the pixel portion, or a length of one side of the pixel portion plus one side of each driver circuit may be employed.

The advantage in outside dimension of the driver IC over an IC chip is the length of the longer side. When a driver IC having a longer side of 15 to 80 mm is used, the number of driver ICs necessary for mounting corresponding to the pixel portion is smaller than that of IC chips; therefore, manufacturing yield can be enhanced. Further, when the driver IC is formed over a glass substrate, productivity is not detracted since the driver IC is not limited to a shape of a substrate used as a mother body. This is a great advantage, as compared with the case of taking out IC chips from a circular silicon wafer.

In the case where the scanning line side driver circuit 3702 is formed over the same substrate as shown in FIG. 17B, a driver IC provided with a signal line side driver circuit is mounted in a region outside the pixel portion 3701. Such a driver IC is a signal line side driver circuit. In order to form a pixel region corresponding to RGB full-color, 3072 signal lines in a XGA class and 4800 signal lines in a UXGA class are necessary. The signal lines provided in the above-described number form a leading out line by being divided into several blocks at an edge of the pixel portion 3701 and are gathered in accordance with a pitch of an output terminal of the driver IC. The driver IC can be formed of a crystalline semiconductor which is formed over a substrate.

Further, the driver IC may also be mounted as both a scanning line driver circuit and a signal line driver circuit, as shown in FIGS. 18A and 18B. In this case, it is preferable to make specifications of respective driver ICs used on the scanning line side and the signal line side different. For example, as for the transistor for forming the scanning line side driver IC, although the withstand voltage required is approximately 30 V, the drive frequency is 100 kHz or less and a high speed operation is comparatively not required. Therefore, it is preferable to set a sufficiently long channel-length (L) of the transistor for forming the scanning line side driver. On the other hand, as for the transistor for forming the signal line side driver IC, although a withstand voltage of approximately 12 V is enough, the drive frequency is approximately 65 MHz at 3 V and a high speed operation is required. Therefore, it is preferable to set the channel-length or the like of the transistor for forming a driver with a micron rule.

The driver IC is formed to have the same thickness as that of a counter substrate. Accordingly, they can have almost the same height, which contributes to reduce the thickness of a display device as a whole. In addition, the substrates are formed of the same material; thereby thermal stress is not generated even when the temperature in the display device is changed, and thus properties of the circuit comprising TFTs are not damaged. Moreover, as described in this embodiment, a driver circuit is mounted with a driver IC that is longer than an IC chip so that the number of driver ICs to be mounted per pixel region can be reduced.

As described above, a driver circuit can be incorporated in a display panel.

Embodiment Mode 12

An example of a protection circuit provided for a display device of the present invention will be described.

Figure 19A:
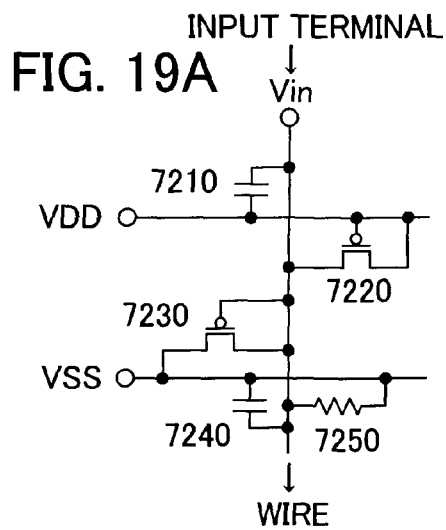
FIGS. 19A to 19E are diagrams for showing a protection circuit to which the present invention is applied.

As shown in FIGS. 18A and 18B, a protection circuit 2713 can be formed between an external circuit and an internal circuit. The protection circuit includes one or more elements selected from a TFT, a diode, a resistor, a capacitor, and the like. Several structures of the protection circuit and operation thereof will be described below. First, configurations of an equivalent circuit diagram of a protection circuit corresponding to one input terminal and is disposed between the external circuit and the internal circuit will be described using FIGS. 19A to 19E. The protection circuit shown in FIG. 19A includes p-channel thin film transistors 7220 and 7230, capacitors 7210 and 7240, and a resistor 7250. The resistor 7250 has two terminals; one of which is supplied with an input voltage Vin (hereinafter referred to as Vin), and the other of which is supplied with a low-potential voltage VSS (hereinafter referred to as VSS).

Figure 19D:
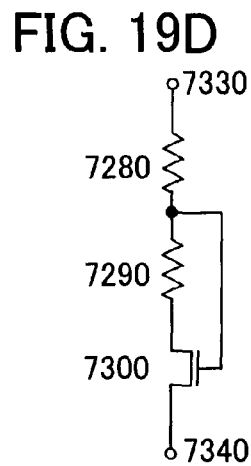
Figure 19B:
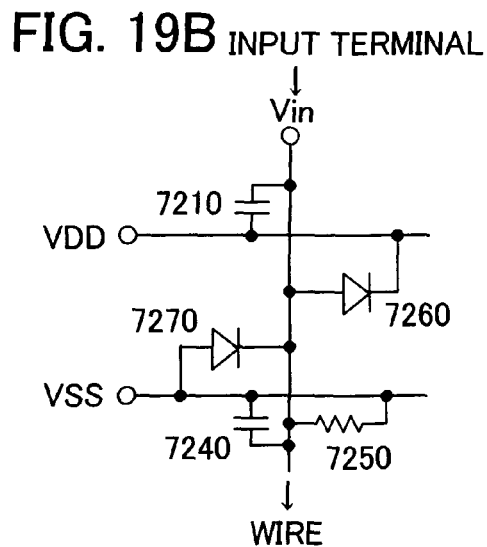
Figure 19E:
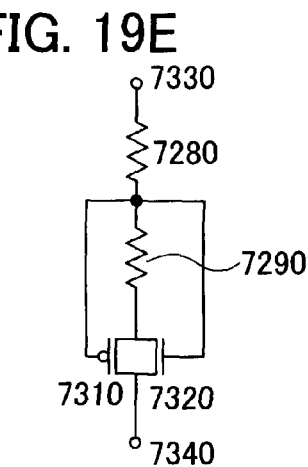
Figure 19C:
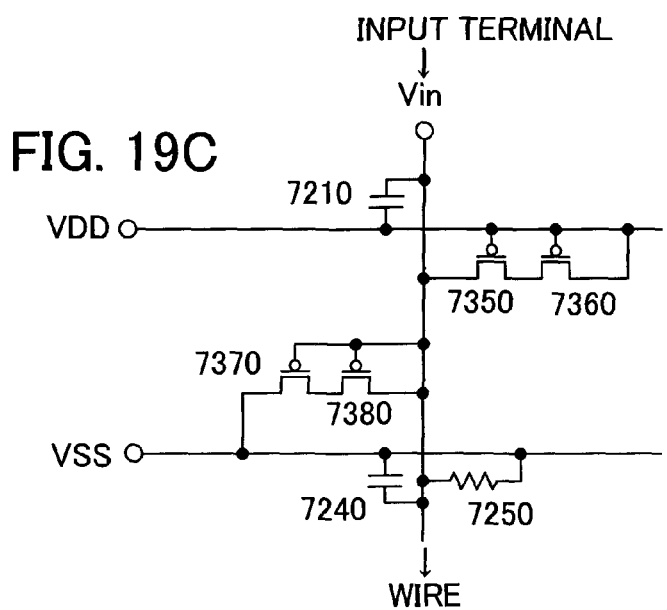

FIG. 19B is an equivalent circuit diagram of a protection circuit in which the p-channel thin film transistors 7220 and 7230 are substituted by rectifying diodes 7260 and 7270. FIG. 19C is an equivalent circuit diagram of a protection circuit in which the p-channel thin film transistors 7220 and 7230 are substituted by TFTs 7350, 7360, 7370, and 7380. In addition, as a protection circuit having a different configuration from the above configurations, FIG. 19D shows a protection circuit which includes resistors 7280 and 7290 and an n-channel thin film transistor 7300. A protection circuit shown in FIG. 19E includes resistors 7280 and 7290, a p-channel thin film transistor 7310, and an n-channel thin film transistor 7320. By providing the protection circuit, sudden change in electric potential can be prevented, and element breakdown or damage can be prevented, which improves reliability. Note that each element for forming the above-described protection circuit is preferably formed of an amorphous semiconductor that can withstand high voltage. This embodiment mode can be freely combined with the aforementioned embodiment modes.

Embodiment Mode 13

A television device can be completed by using a display device formed in accordance with the present invention. FIG. 20 is a block diagram showing a main structure of the television device. As for a display panel, any mode of the following may be employed: in the structure shown in FIG. 17A, a case where only a pixel portion 601 is formed and a scanning line side driver circuit 603 and a signal line side driver circuit 602 are mounted by TAB as shown in FIG. 18B; in the structure shown in FIG. 17A, a case where only the pixel portion 601 is formed and the scanning line side driver circuit 603 and the signal line side driver circuit 602 are mounted by COG as shown in FIG. 18A; a case where a TFT is formed as shown in FIG. 17B, the pixel portion 601 and the scanning line side driver circuit 603 are formed over the same substrate, and the signal line side driver circuit 602 is independently mounted as a driver IC; and a case where the pixel portion 601, the signal line side driver circuit 602, and the scanning line side driver circuit 603 are formed over the same substrate as shown in FIG. 17C; and the like.

In addition, as another structure of an external circuit, a video signal amplifier circuit 605 which amplifies a video signal among signals received by a tuner 604, a video signal processing circuit 606 which converts the signals output from the video signal amplifier circuit 605 into chrominance signals corresponding to respective colors of red, green, and blue, a control circuit 607 which converts the video signal into an input specification of a driver IC, or the like are provided on an input side of the video signal. The control circuit 607 outputs signals to both a scanning line side and a signal line side. In the case of digital driving, a signal dividing circuit 608 may be provided on the signal line side and an input digital signal may be divided into m pieces to be supplied.

An audio signal among signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 or the audio signal processing circuit 610.

Figure 21A:
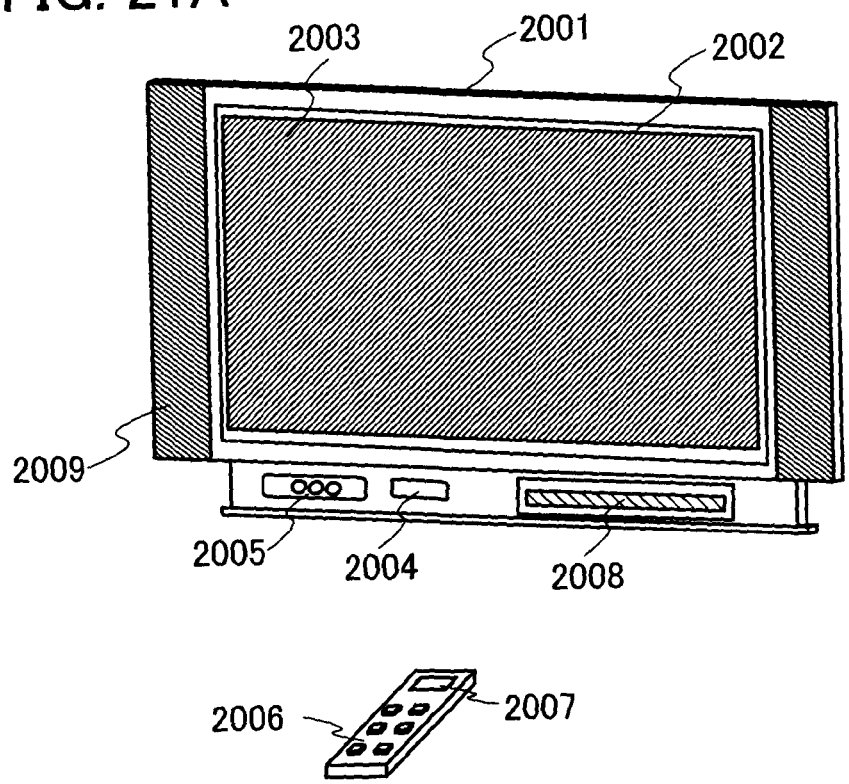
FIGS. 21A and 21B are diagrams for showing an electronic device to which the present invention is applied.
Figure 21B:
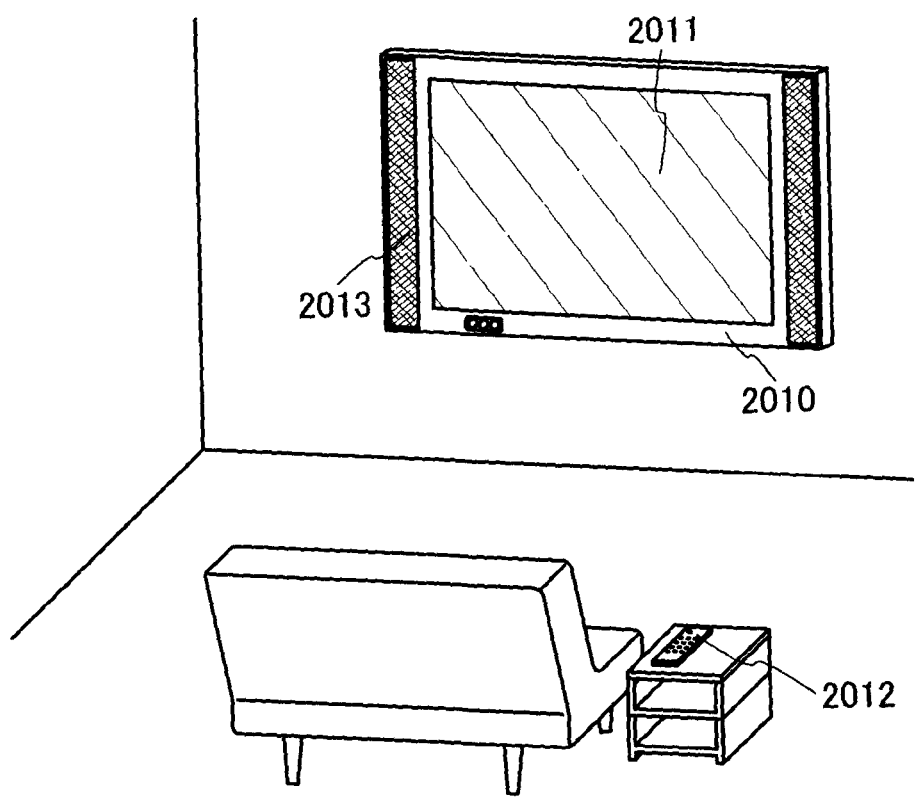

A television device can be completed by incorporating such a display module into a chassis as shown in FIG. 21A or 21B. A display panel as shown in FIGS. 1A and 1B also provided with an FPC is generally also called an EL display module. Therefore, when the EL display module as shown in FIGS. 1A and 1B is used, an EL television device can be completed. A main screen 2003 is formed using the display module, and a speaker portion 2009, an operation switch, and the like are provided as its accessory equipment. Thus, a television device can be completed in accordance with the present invention.

Further, reflected light of light entering from outside may be shielded using a phase difference plate or a polarizing plate. In the case of a top emission display device, an insulating layer to be a partition wall may be colored and used as a black matrix. The partition wall can also be formed by a droplet discharge method or the like. Carbon black or the like may be mixed into a black resin of a pigment material or a resin material such as polyimide, and a stack-layer structure thereof may also be used. By a droplet discharge method, different materials may be discharged to the same region plural times to form the partition wall. A quarter wave plate and a half wave plate may be used as the phase difference plates so that design may be performed so as to control light. As the structure, the light-emitting element, the sealing substrate (sealant), the phase difference plates (a quarter wave plate and a half wave plate), and the polarizing plate are sequentially stacked over a TFT element substrate, in which light emitted from the light-emitting element is transmitted therethrough and emitted outside from a polarizing plate side. The phase difference plates and the polarizing plate may be provided on a side where light is emitted outside or may be provided on both sides in the case of a dual emission display device in which light is emitted from both the surfaces. In addition, an anti-reflective film may be provided on the outer side of the polarizing plate. Accordingly, a higher-definition and more accurate image can be displayed.

As shown in FIG. 21A, a display panel 2002 utilizing a display element is incorporated in a chassis 2001, and general TV broadcast can be received by a receiver 2005. In addition, by connecting to a communication network by wired or wireless connections via a modem 2004 with the receiver 2005, one-way (from a sender to a receiver) or two-way (between a sender and a receiver or between receivers) information communication can be carried out. The television device can be operated by using a switch built in the chassis or a remote control unit 2006. A display portion 2007 for displaying output information may also be provided in the remote control unit 2006.

Further, the television device may include a sub screen 2008 formed using a second display panel to display channels, volume, or the like, in addition to the main screen 2003. In this structure, the main screen 2003 may be formed using an EL display panel having wide viewing angle, and the sub screen 2008 may be formed using a liquid crystal display panel capable of displaying images with lower power consumption. In order to reduce the power consumption preferentially, the main screen 2003 may be formed using a liquid crystal display panel, and the sub screen 2008 may be formed using an EL display panel such that the sub screen can flash on and off. Needless to say, both of the main screen and the sub screen can be formed using an EL display panel to which the present invention is applied. By using the present invention, a highly reliable display device can be formed.

FIG. 20B shows a television device having a large display portion with a size of, for example, 20 to 80 inches. The television device includes a chassis 2010, a display portion 2011, a remote control unit 2012 that is an operation portion, a speaker portion 2013, and the like. The present invention is applied to manufacturing of the display portion 2011. The television device shown in FIG. 21B which is a wall-hanging type does not require a large installation space.

Needless to say, the present invention can be applied not only to a television device, but also to various use applications; e.g., a large-sized display medium such as an information display board at a railway station, an airport, or the like, or an advertisement display board on a street, as well as a monitor of a personal computer.

The television device to which the present invention is applied has high performance and high reliability. In addition, it can be manufactured at a low cost; therefore, since purchase at low price is possible, the television device of the present invention is suitable for the case of being used outdoors or the like where wear or deterioration proceeds fast and frequent replacement is required, such as for a information display panel at a railway station, an airport, or the like or an advertisement display panel on a street.

By using the present invention, since the number of wires can be reduced in each pixel, the aperture ratio can be improved and the manufacturing process can be simplified. Consequently, such a highly reliable display device can be manufactured with a high yield.

Embodiment Mode 23

By applying the present invention, various kinds of display devices can be manufactured. That is, the present invention can be applied to various kinds of electronic devices incorporating such a display device in the display portion.

As examples of the electronic devices, a camera such as a video camera or a digital camera; a projector; a head-mounted display (a goggle type display); a car navigation system; a car stereo; a personal computer; a game machine; a portable information terminal (e.g., a mobile computer, a cellular phone, or an electronic book); an image reproducing device provided with a recording medium (specifically, a device which can reproduce a recording medium such as a digital versatile disk (DVD) and includes a display capable of displaying images thereof); and the like can be given. Specific examples thereof are shown in FIGS. 24A to 24E.

The present invention can be used in a display portion of the electronic devices shown in FIGS. 24A to 24E. Using the display device described in Embodiment Modes 1 to 21, the display portion can be formed. As described in the aforementioned embodiment modes, the display portion can be formed at a low cost with a high yield by applying the present invention. Further, high performance and high reliability can also be provided for an electronic device manufactured.

Figure 24A:
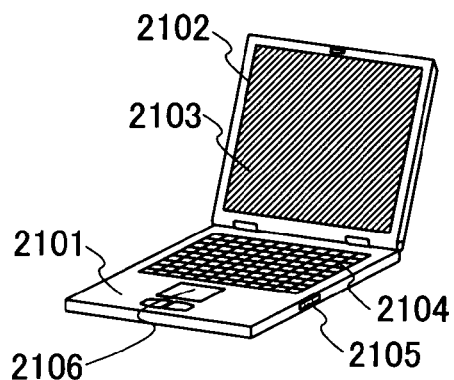
FIGS. 24A to 24E are diagrams for showing an electronic device to which the present invention is applied.

FIG. 24A shows a personal computer, which includes a main body 2101, a chassis 2102, a display portion 2103, a keyboard 2104, an external connection port 2105, a pointing mouse 2106, or the like. The display portion 2103 can be manufactured using the present invention, to provide high performance and high reliability. Further, the aperture ratio can be high in the display portion, so that clear and bright images can be displayed even in the case of a display portion of a small electronic device.

Figure 24B:
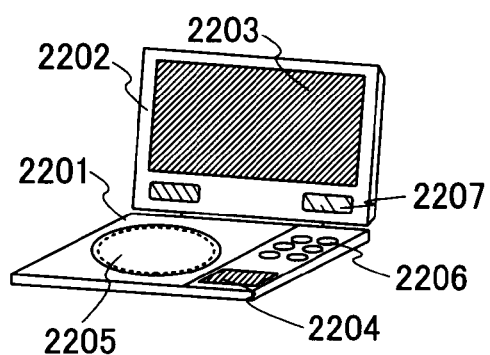

FIG. 24B shows an image reproducing device (specifically, a DVD reproducing device) including a recording medium, which includes a main body 2201, a chassis 2202, a display portion A 2203, a display portion B 2204, a recording medium (e.g., a DVD) reading portion 2205, an operation key 2206, a speaker portion 2207, or the like. The display portion A 2203 mainly displays video information, while the display portion B 2204 mainly displays character information. These display portion A 2203 and display portion B 2204 can be manufactured using the present invention, to provide high performance and high reliability. Further, the aperture ratio can be high in the display portion, so that clear and bright images can be displayed even in the case of a display portion of a small electronic device.

Figure 24C:
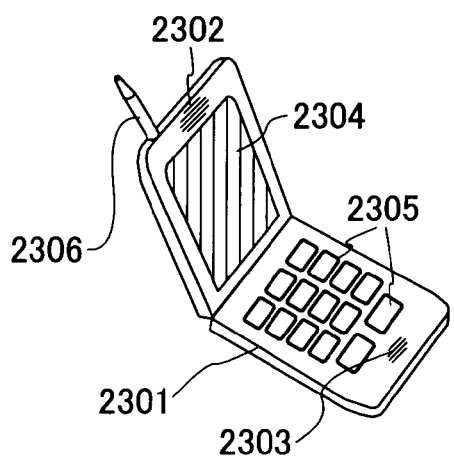

FIG. 24C shows a cellular phone, which includes a main body 2301, an audio output portion 2302, an audio input portion 2303, a display portion 2304, operation switches 2305, an antenna 2306, or the like. By applying the display device manufactured using the present invention to the display portion 2304, high performance and high reliability can be provided. Further, the aperture ratio can be high in the display portion, so that clear and bright images can be displayed even in the case of a display portion of a small electronic device.

Figure 24D:
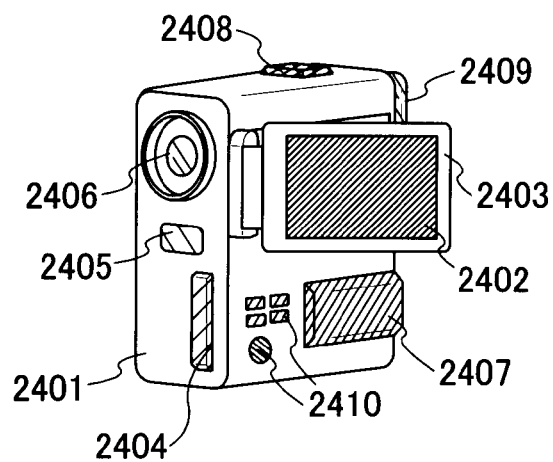

FIG. 24D shows a video camera, which includes a main body 2401, a display portion 2402, a chassis 2403, an external connection port 2404, a remote control receiver 2405, an image receiving portion 2406, a battery 2407, an audio input portion 2408, operation keys 2409, or the like. The present invention can be applied to the display portion 2402. By applying the display device manufactured using the present invention to the display portion 2402, high performance and high reliability can be provided. Further, the aperture ratio can be high in the display portion, so that clear and bright images can be displayed even in the case of a display portion of a small electronic device.

Figure 24E:
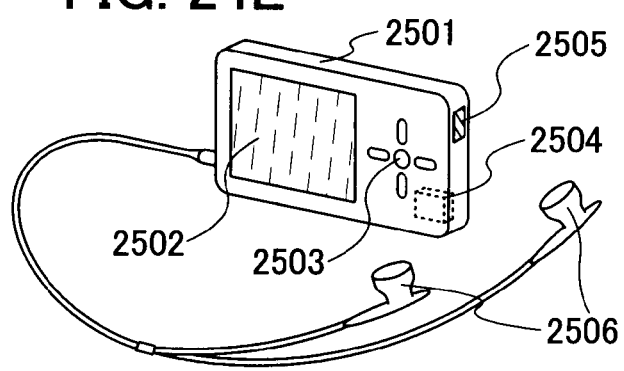

FIG. 24E shows a digital player, which includes a main body 2501, a display portion 2502, operation keys 2503, a recording medium 2504, an earphone 2506 which is a small device for converting an electrical signal into an audio signal, or the like. The digital player shown in FIG. 24E records and plays sounds (music) and images and a flash memory is used for the recording medium 2504 which has capacitance of 20 to 200 GB. The present invention can be applied to the display portion 2502. By applying the display device manufactured using the present invention to the display portion 2502, high performance and high reliability can be provided. Further, the aperture ratio can be high in the display portion, so that clear and bright images can be displayed even in the case of a display portion of a small electronic device.

Embodiment Mode 24

An example in which the display device described in the aforementioned embodiment modes is applied to a display device having flexibility will be described with reference to FIG. 22, as this embodiment mode.

Figure 22:
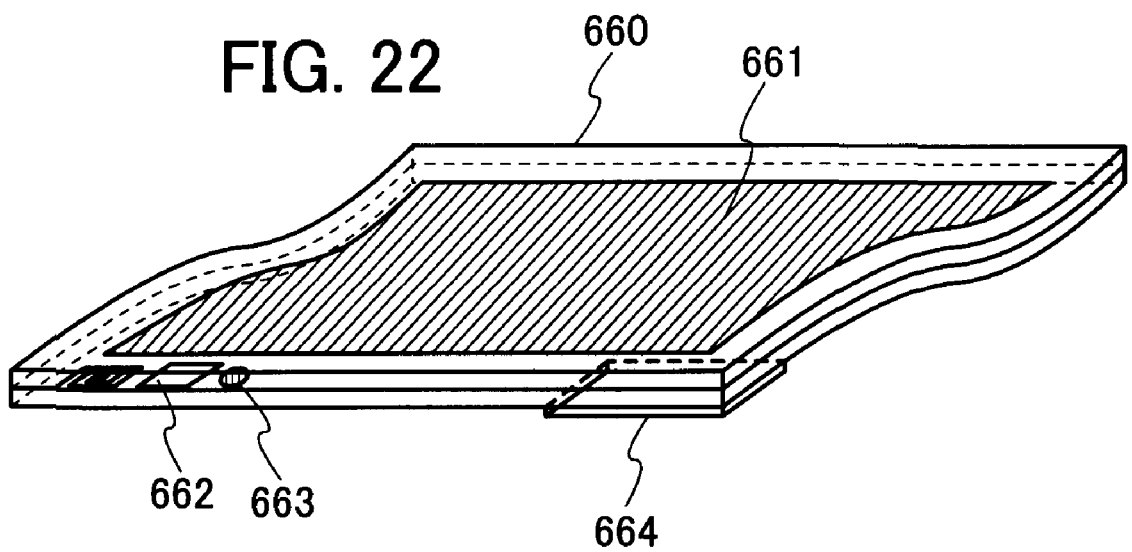
FIG. 22 is a diagram showing an electronic device to which the present invention is applied.

A display device of the present invention shown in FIG. 22 may be included in a housing, and includes a main body 660, a pixel portion 661 which displays an image, a driver IC 662, a receiver device 663, a film battery 664, or the like. The driver IC, the receiver device, and the like may be mounted using a semiconductor component. The main body 660 of the display device of the present invention is formed using a material having flexibility such as plastic or a film.

The display device of the present invention can manufacture a display device having a high aperture ratio and high reliability with a high yield.

Further, such a display device is extremely light and flexible; therefore, the display device which can be rolled into a cylinder shape is extremely advantageous to carry around. By the display device of the present invention, a display medium with a large screen can be freely carried around.

Moreover, the display device as shown in FIG. 22 can be used as a means for mainly displaying a still image for electrical home appliances such as a refrigerator, a washing machine, a rice cooker, a fixed telephone, a vacuum cleaner, or a clinical thermometer, and a large-sized information display such as strap advertisement in a train or an arrival and departure guide plate at a railway station or an airport, as well as a navigation system, an audio reproducing device (e.g., a car audio or an audio component), a personal computer, a game machine, or a portable information terminal (e.g., a mobile computer, a cellular phone, a portable game machine, or an electronic book).

Although the preferred embodiment modes of the present invention are specifically described as set forth above, it is to be understood that various changes and modifications will be apparent to those skilled in the art, unless such changes and modifications depart from the scope of the present invention.

This application is based on Japanese Patent Application serial no. 2005345341 filed in Japan Patent Office on 30th, Nov. 2005, the entire contents of which are hereby incorporated by reference.

What is claimed is:

1. A display device comprising:
   a light-emitting element;
   a first switch;
   a second switch;
   a transistor;
   a first capacitor; and
   a second capacitor,
   wherein one terminal of the first switch is electrically connected to a first electrode of the second capacitor,
   wherein a second electrode of the second capacitor is electrically connected to one terminal of the second switch and a first electrode of the first capacitor,
   wherein a second electrode of the first capacitor is electrically connected to a first wire,
   wherein a gate of the transistor is electrically connected to the first electrode of the second capacitor, one of a source and a drain of the transistor is electrically connected to a first electrode of the light-emitting element, and the other of the source and the drain of the transistor is electrically connected to the other terminal of the second switch, and
   wherein a second electrode of the light-emitting element and the other terminal of the first switch are electrically connected to a same second wire.

2. The display device according to claim 1, wherein the first switch and the second switch are transistors.

3. The display device according to claim 1, wherein the second wire is maintained at a fixed potential.

4. The display device according to claim 2, wherein the transistors are thin film transistors.

5. The display device according to claim 1, wherein the other of the source and the drain of the transistor is electrically connected to a third wire.

6. A display device comprising:
   a light-emitting element;
   a first switch;
   a second switch;
   a third switch;
   a fourth switch;
   a transistor;
   a first capacitor; and
   a second capacitor,
   wherein one terminal of the first switch is electrically connected to a first electrode of the second capacitor, and a second electrode of the second capacitor is electrically connected to one terminal of the second switch and a first electrode of the first capacitor, wherein a second electrode of the first capacitor is electrically connected to a first wire, wherein one terminal of the third switch is electrically connected to the second electrode of the second capacitor, and the other terminal of the third switch is electrically connected to a second wire, wherein a gate of the transistor is electrically connected to the first electrode of the second capacitor, one of a source and a drain of the transistor is electrically connected to a first electrode of the light-emitting element, and the other of the source and the drain of the transistor is electrically connected to the other terminal of the second switch and one terminal of the fourth switch, and wherein a second electrode of the light-emitting element and the other terminal of the first switch are electrically connected to a same third wire.

7. The display device according to claim 6, wherein the first switch, the second switch, the third switch, and the fourth switch are transistors.

8. The display device according to claim 6, wherein the third wire is maintained at a fixed potential.

9. The display device according to claim 7, wherein the transistors are thin film transistors.

10. The display device according to claim 6, wherein the other terminal of the fourth switch is electrically connected to a fourth wire.

11. A display device comprising:
a light-emitting element;
a first switch;
a second switch;
a third switch;
a fourth switch;
a fifth switch;
a transistor;
a first capacitor; and
a second capacitor, wherein one terminal of the first switch is electrically connected to a first electrode of the second capacitor, and a second electrode of the second capacitor is electrically connected to one terminal of the second switch and a first electrode of the first capacitor, wherein a second electrode of the first capacitor is electrically connected to a first wire, wherein one terminal of the third switch is electrically connected to the second electrode of the second capacitor, and the other terminal of the third switch is electrically connected to a second wire, wherein a gate of the transistor is electrically connected to the first electrode of the second capacitor, one of a source and a drain of the transistor is electrically connected to a first electrode of the light-emitting element, and the other of the source and the drain of the transistor is electrically connected to the other terminal of the second switch and one terminal of the fourth switch, wherein one terminal of the fifth switch is electrically connected to the first electrode of the light-emitting element, and wherein a second electrode of the light-emitting element, the other terminal of the first switch and the other terminal of the fifth switch are electrically connected to a same third wire.

12. The display device according to claim 11, wherein the first switch, the second switch, the third switch, the fourth switch and the fifth switch are transistors.

13. The display device according to claim 11, wherein the third wire is maintained at a fixed potential.

14. The display device according to claim 12, wherein the transistors are thin film transistors.

15. The display device according to claim 11, wherein the other terminal of the fourth switch is electrically connected to a fourth wire.

* * * * *